(12) United States Patent
Hirose

(10) Patent No.: US 9,041,112 B2
(45) Date of Patent: May 26, 2015

(54) SEMICONDUCTOR DEVICE INCLUDING A CURRENT MIRROR CIRCUIT

(75) Inventor: Atsushi Hirose, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1470 days.

(21) Appl. No.: 12/707,772

(22) Filed: Feb. 18, 2010

(65) Prior Publication Data

US 2010/0140456 A1 Jun. 10, 2010

Related U.S. Application Data

(63) Continuation of application No. 11/783,622, filed on Apr. 11, 2007, now Pat. No. 7,667,272.

(30) Foreign Application Priority Data

Apr. 28, 2006 (JP) ................................ 2006-126017

(51) Int. Cl.
*H01L 21/84* (2006.01)
*H03F 1/08* (2006.01)
(Continued)

(52) U.S. Cl.
CPC ................ *H03F 1/086* (2013.01); *G05F 3/262* (2013.01); *H01L 21/84* (2013.01); *H01L 27/12* (2013.01); *H03F 2200/513* (2013.01)

(58) Field of Classification Search
CPC .................. H01L 2924/0002; H01L 2924/00; H01L 27/0266
USPC ........ 257/360, E31.052; 438/238; 349/42, 43
See application file for complete search history.

(56) References Cited

U.S. PATENT DOCUMENTS

| 4,334,198 A | 6/1982 | Malchow |
| 4,620,212 A | 10/1986 | Ogasawara |

(Continued)

FOREIGN PATENT DOCUMENTS

| CN | 1612351 | 5/2005 |
| JP | 03-108758 A | 5/1991 |

(Continued)

OTHER PUBLICATIONS

Chinese Office Action (Application No. 200710100953.5) Dated Aug. 30, 2010.

(Continued)

*Primary Examiner* — Matthew Gordon
(74) *Attorney, Agent, or Firm* — Eric J. Robinson; Robinson Intellectual Property Law Office, P.C.

(57) ABSTRACT

In a semiconductor device, where, with respect to a parasitic resistor in a current mirror circuit, a compensation resistor for compensating the parasitic resistor is provided in the current mirror circuit, the current mirror circuit includes at least two thin film transistors. The thin film transistors each have an island-shaped semiconductor film having a channel formation region and source or drain regions, a gate insulating film, a gate electrode, and source or drain electrodes, and the compensation resistor compensates the parasitic resistor of any one of the gate electrode, the source electrode, and the drain electrode. In addition, each compensation resistor has a conductive layer containing the same material as the gate electrode, the source or drain electrodes, or the source or drain regions.

12 Claims, 44 Drawing Sheets

(51) Int. Cl.
*G05F 3/26* (2006.01)
*H01L 27/12* (2006.01)

(56) References Cited

U.S. PATENT DOCUMENTS

| | | |
|---|---|---|
| 4,686,487 A | 8/1987 | Radovsky |
| 5,469,092 A | 11/1995 | Itakura |
| 5,936,231 A | 8/1999 | Michiyama et al. |
| 5,977,759 A | 11/1999 | Sitch |
| 6,255,897 B1 * | 7/2001 | Klemmer ............... 327/538 |
| 6,287,888 B1 | 9/2001 | Sakakura et al. |
| 6,316,971 B1 | 11/2001 | Ohashi |
| 6,531,711 B2 | 3/2003 | Sakakura et al. |
| 6,876,233 B1 | 4/2005 | Bernardson |
| 6,911,358 B2 | 6/2005 | Azami et al. |
| 6,930,326 B2 | 8/2005 | Kato et al. |
| 7,030,551 B2 | 4/2006 | Yamazaki et al. |
| 7,042,432 B2 | 5/2006 | Yamazaki et al. |
| 7,068,552 B2 | 6/2006 | Kawasumi |
| 7,193,619 B2 | 3/2007 | Kimura |
| 7,253,391 B2 | 8/2007 | Koyama et al. |
| 7,312,473 B2 | 12/2007 | Koyama et al. |
| 7,495,272 B2 | 2/2009 | Maruyama et al. |
| 7,888,714 B2 | 2/2011 | Takahashi et al. |
| 7,932,126 B2 | 4/2011 | Maruyama et al. |
| 2003/0214522 A1 * | 11/2003 | Kageyama et al. ........... 345/690 |
| 2004/0042707 A1 | 3/2004 | Imai et al. |
| 2005/0167573 A1 * | 8/2005 | Maruyama et al. ........ 250/214.1 |
| 2006/0186497 A1 | 8/2006 | Nishi et al. |
| 2009/0117681 A1 | 5/2009 | Maruyama et al. |

FOREIGN PATENT DOCUMENTS

| | | |
|---|---|---|
| JP | 06-037558 | 2/1994 |
| JP | 2003-100992 A | 4/2003 |
| JP | 2005-136392 A | 5/2005 |
| JP | 2006-108307 A | 4/2006 |
| WO | WO 2005/114749 | 12/2005 |

OTHER PUBLICATIONS

Taiwanese Office Action (Application No. 096113518) Dated Jan. 8, 2013.
Search Report (Application No. 07007102.2) dated Oct. 18, 2007.
Pascht.A et al., "Small-Signal and Temperature Noise Model for MOSFETs,", IEEE Transactions on Microwave Theory and Techniques, Aug. 1, 2002, vol. 50, No. 8, pp. 1927-1934.
Taiwanese Office Action (Application No. 96113518) Dated Aug. 30, 2013.

* cited by examiner 470  471

472

473  474

475

476  477

478

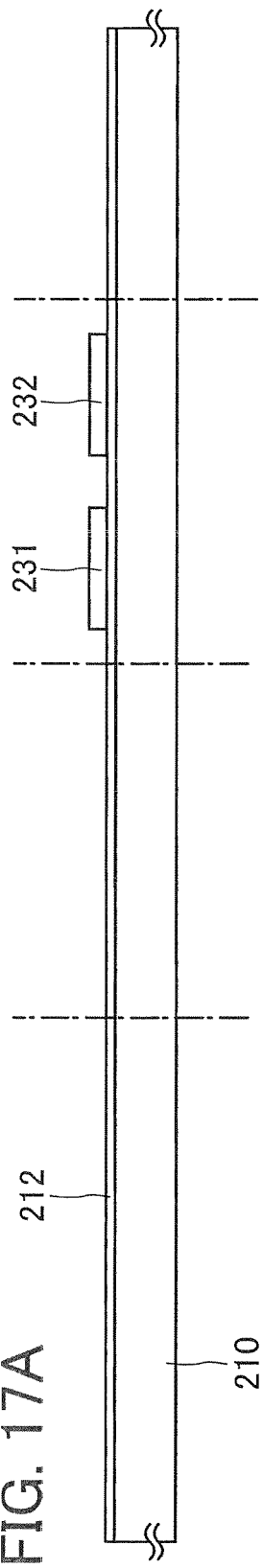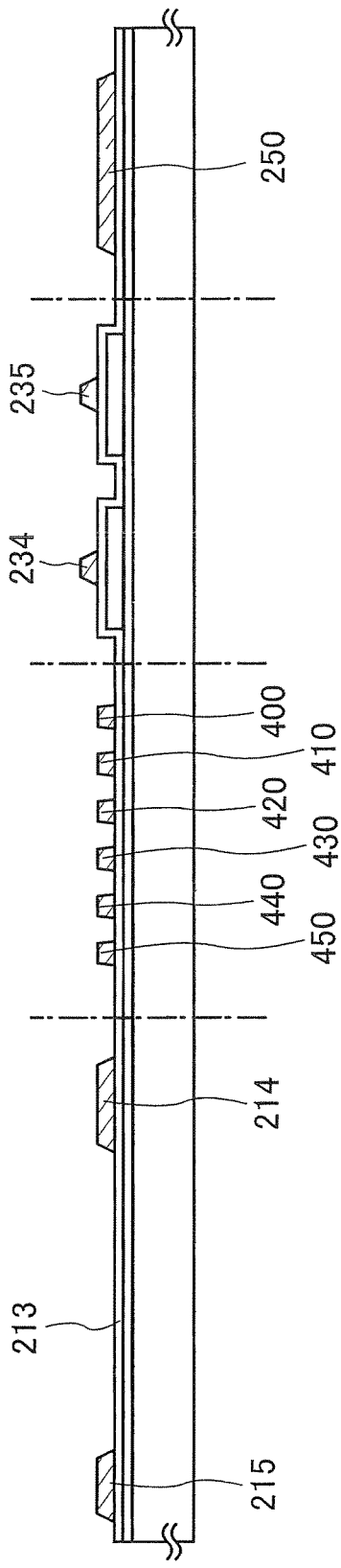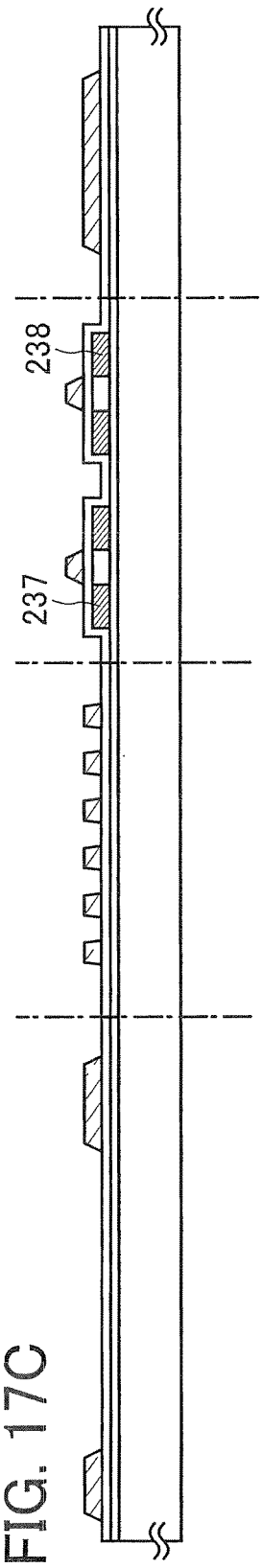

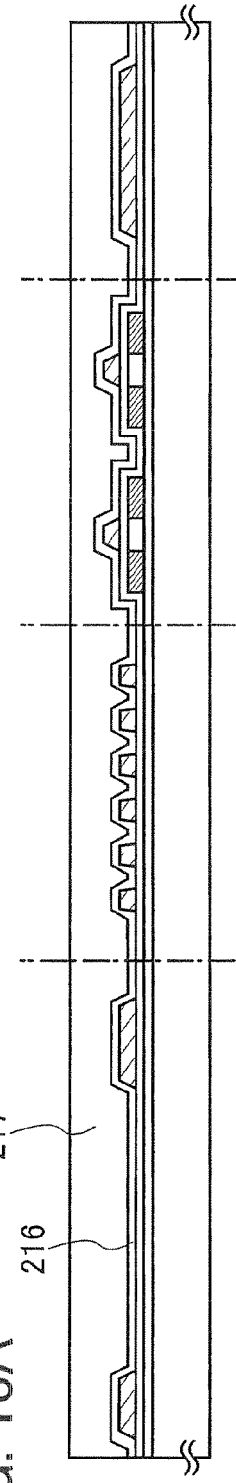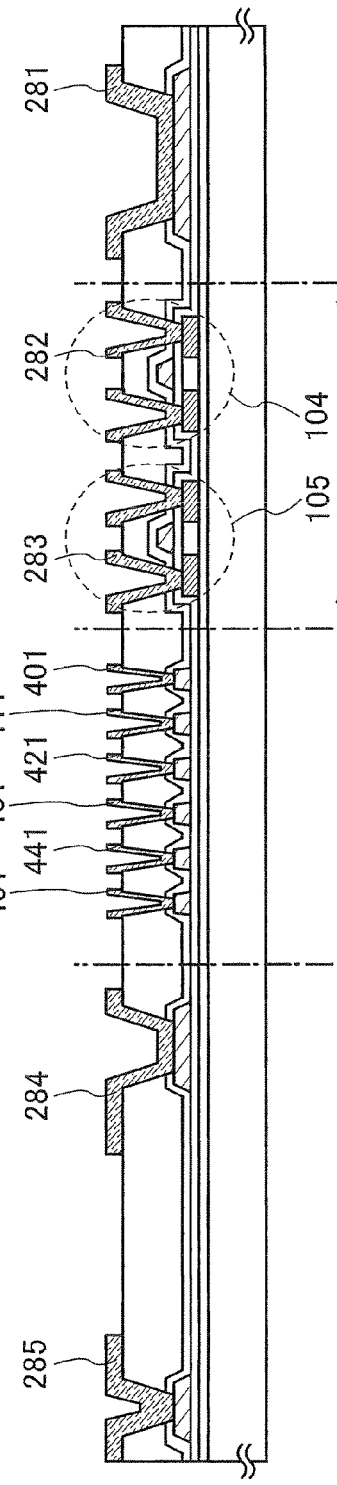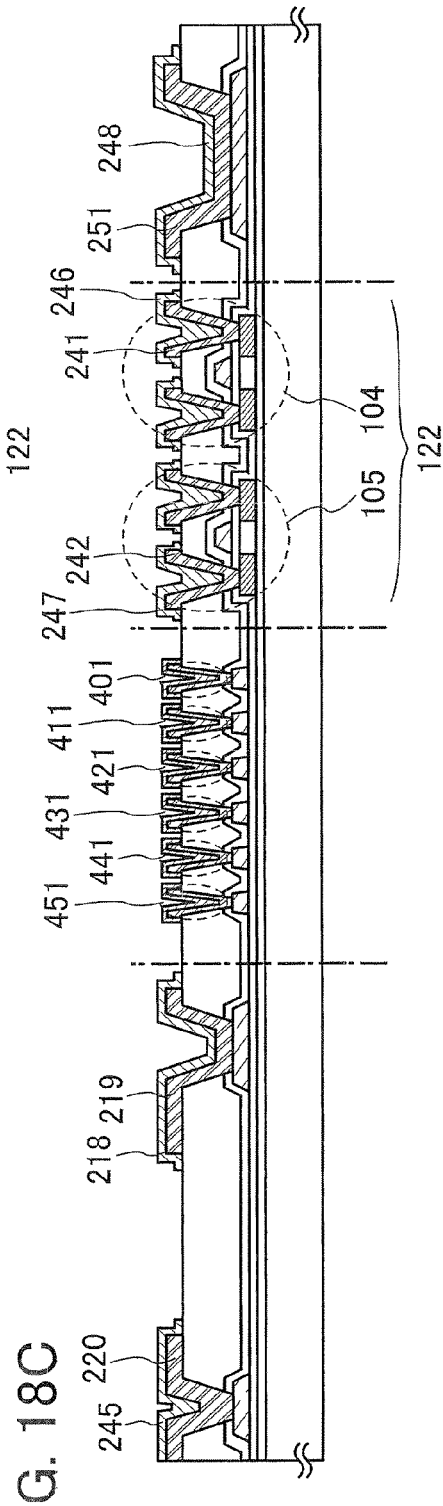

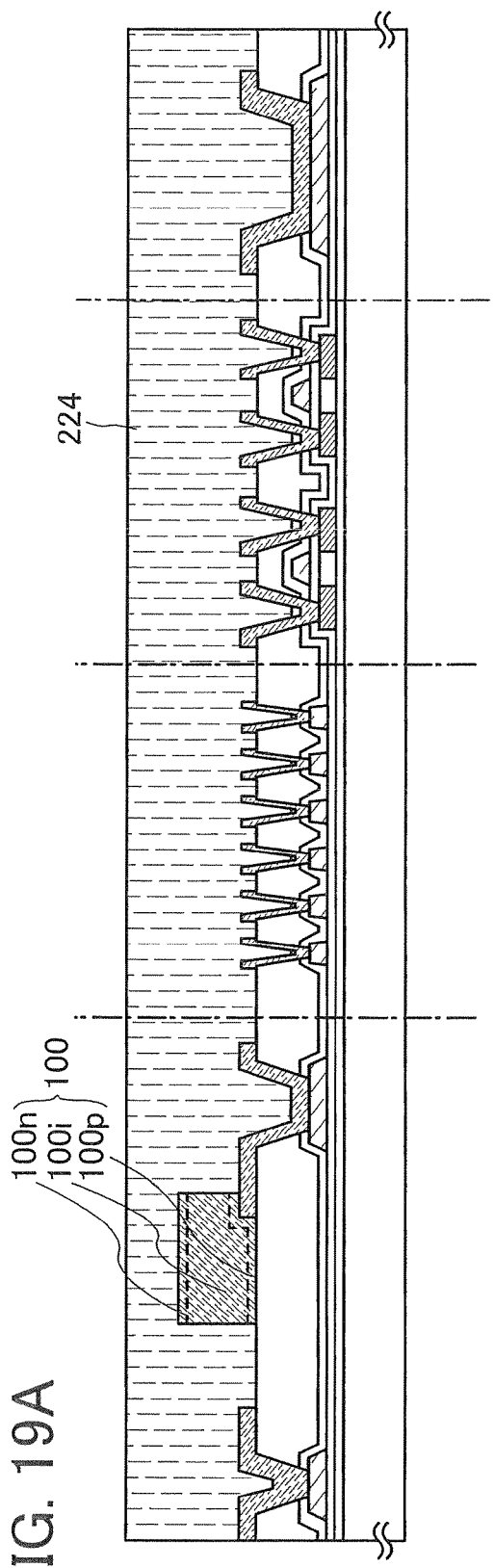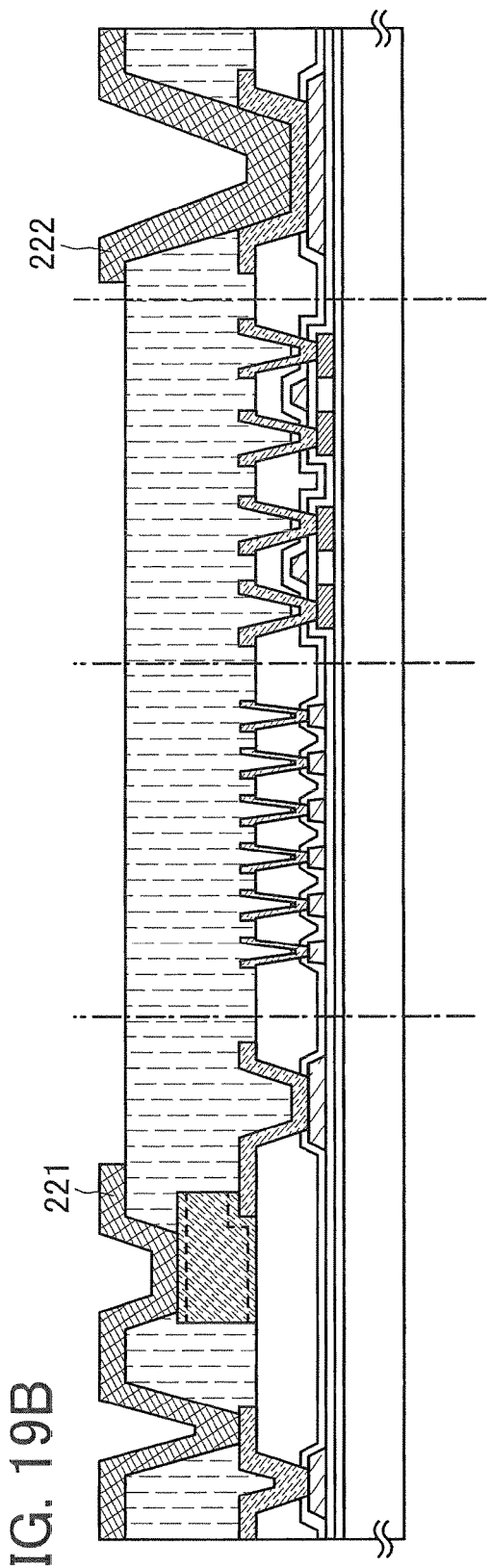

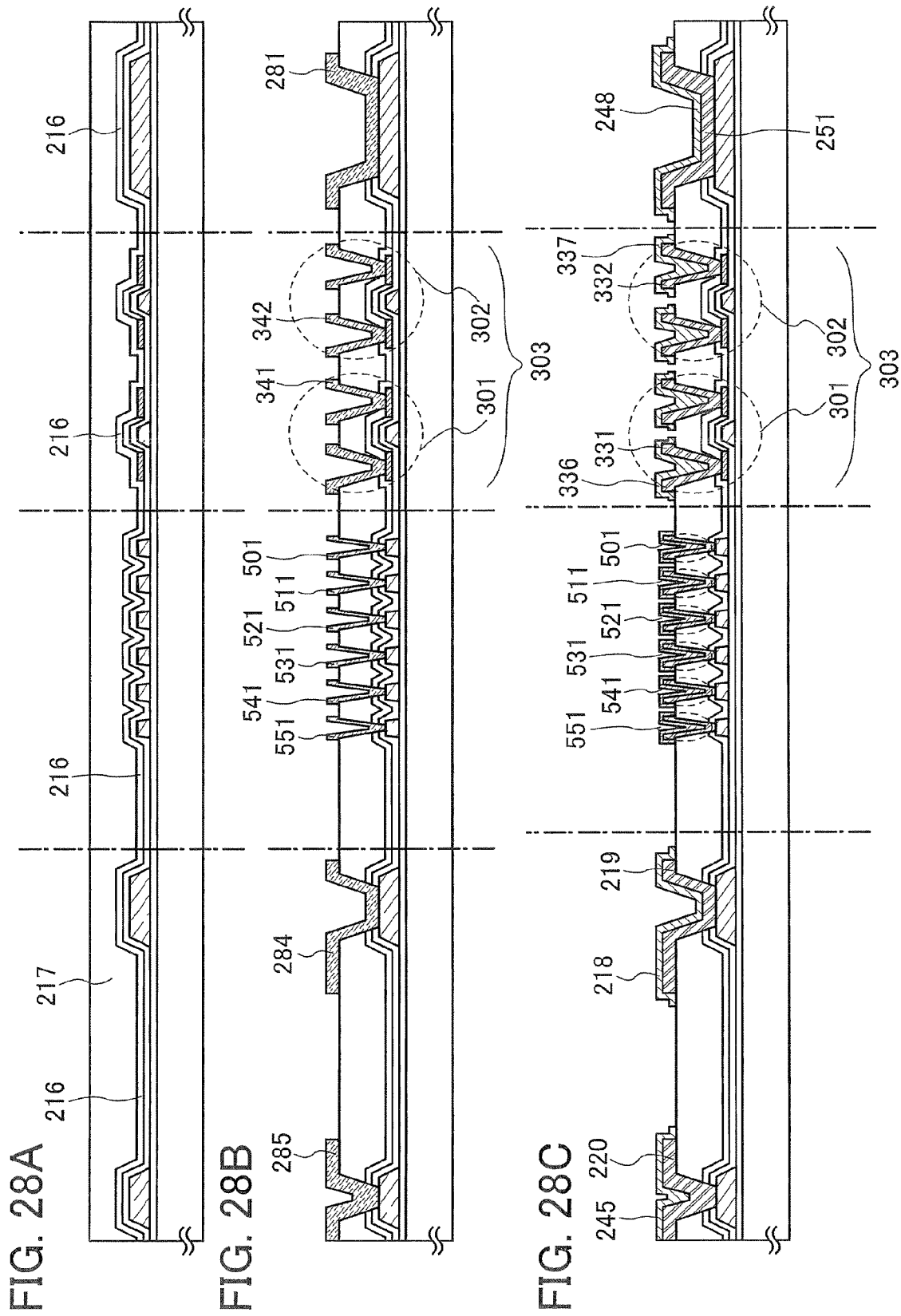

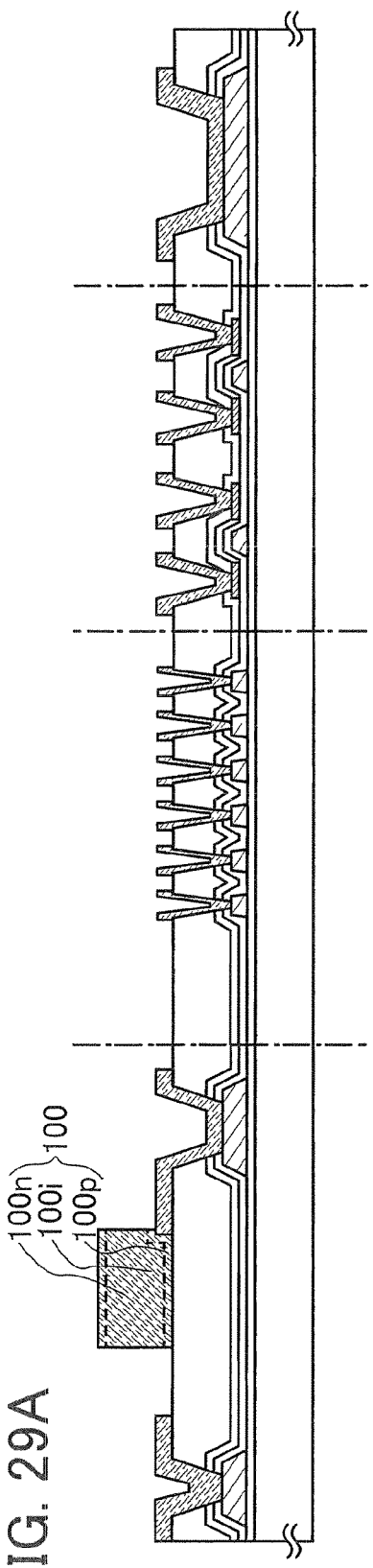
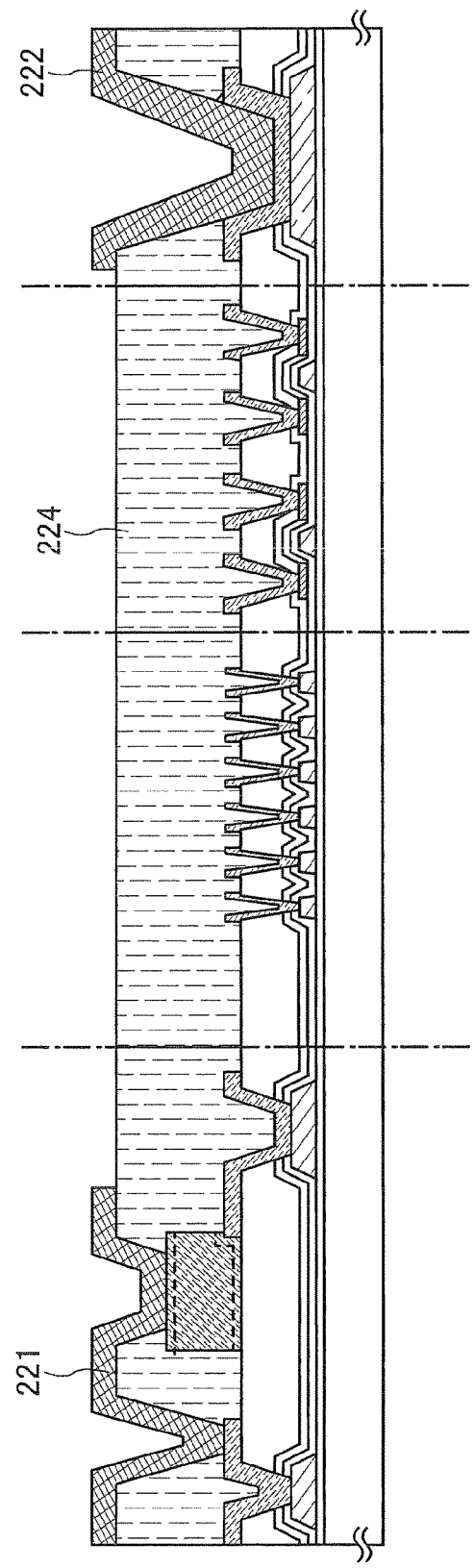
FIG. 29A
FIG. 29B

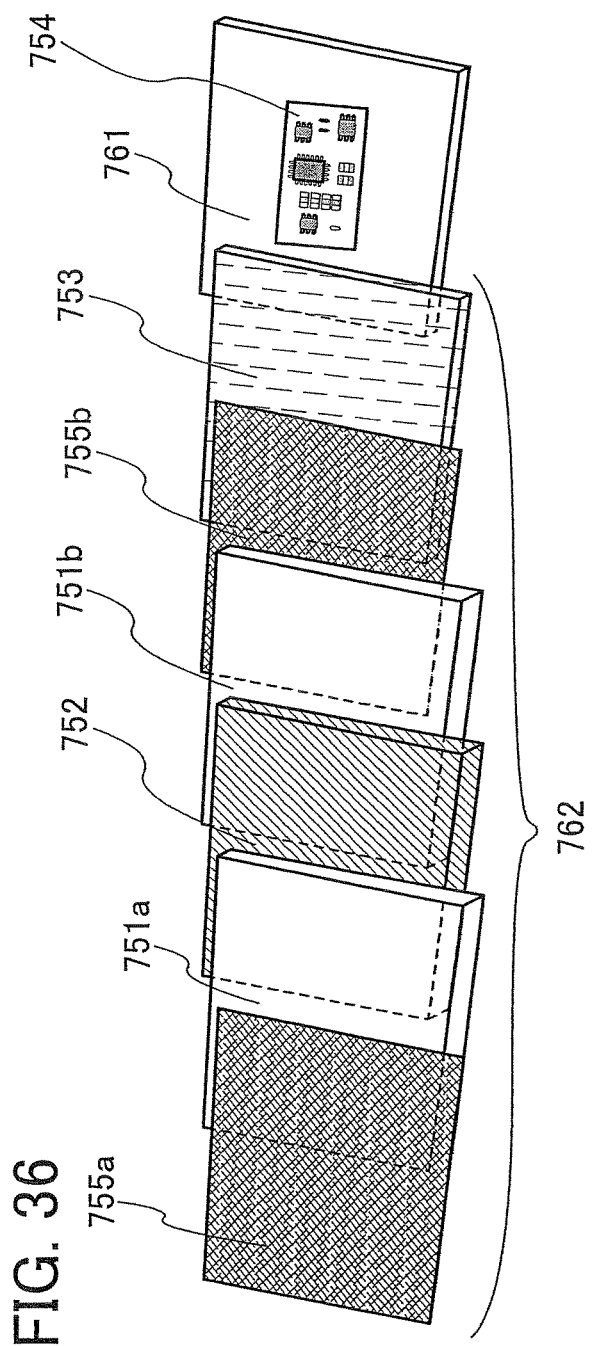

SEMICONDUCTOR DEVICE INCLUDING A CURRENT MIRROR CIRCUIT

BACKGROUND OF THE INVENTION

1. Field of the Invention

The present invention relates to a semiconductor device, particularly a semiconductor device including a thin film semiconductor element, and a manufacturing method thereof.

2. Description of the Related Art

In general, a current mirror circuit is used in many cases as part of a power supply circuit of a display or the like. The power supply circuit includes an analog circuit, and the performance of a bias circuit is important as the stable operation. It is important to design a bias circuit in a case of designing a high-performance analog circuit or a low-voltage operation circuit.

In conventional amplifier circuits, there are some of them, the performance of which is improved by multistage connection of thin film transistors (TFTs) (for example, see Patent Document 1: Japanese Published Patent Application No. H6-37558).

SUMMARY OF THE INVENTION

Most of the conventional amplifier circuits have a multistage configuration including a correction circuit, which needs high power supply voltage. At present, it has been necessary to stably supply power supply voltage in forming an electric circuit in terms of energy saving, high performance, and the like.

However, the amplifier circuit including TFTs as described above has a problem that the operation is destabilized by parasitic resistance due to wiring resistance, contact resistance, or the like of conductive layers that form the TFTs or wirings connected to the conductive layers.

It can be considered that the cause of destabilization in operation of the amplifier circuit is that conductive layers that form the TFTs or wirings connected to the conductive layers are formed of different materials, or, since the width or length thereof are different, the value of the parasitic resistance is different; thus, the balance of the parasitic resistance in each of the TFTs that form the amplifier circuit is deteriorated.

Due to the destabilization in operation of the amplifier circuit, an output current value thereof is destabilized. This is because the TFTs that form the circuit are operated in a region where the TFTs are likely to be affected by variations in characteristic thereof.

A semiconductor device of the present invention has a resistor and an amplifier circuit, and parasitic resistance in the amplifier circuit is adjusted by a resistor being added so that the amplifier circuit is operated stably. In other words, a compensation resistor, which corresponds to the parasitic resistance in the amplifier circuit, is formed to balance the resistance so that the amplifier circuit can be operated stably. Accordingly, output can be uniform in a substrate surface in the semiconductor device.

Note that, in this specification, a semiconductor device refers to a device having a semiconductor layer, and devices each including an element having a semiconductor layer are each collectively referred to as a semiconductor device, as well.

The present invention relates to a semiconductor device having a function to have low power supply voltage and to operate an amplifier circuit stably.

The present invention relates to a semiconductor device where, for a parasitic resistor in a current mirror circuit, a compensation resistor for compensating the parasitic resistor is provided in the current mirror circuit.

In the present invention, the current mirror circuit has at least two thin film transistors.

In the present invention, the thin film transistors each have an island-shaped semiconductor film having a channel formation region and source or drain regions, a gate insulating film, a gate electrode, and source or drain electrodes, and the compensation resistor compensates parasitic resistance of the gate electrode.

In the present invention, the thin film transistors each have an island-shaped semiconductor film having a channel formation region and source or drain regions, a gate insulating film, a gate electrode, and source or drain electrodes, and the compensation resistor compensates parasitic resistance of the source electrode.

In the present invention, the thin film transistors each have an island-shaped semiconductor film having a channel formation region and source or drain regions, a gate insulating film, a gate electrode, and source or drain electrodes, and the compensation resistor compensates parasitic resistance of the drain electrode.

According to one feature of the present invention, a semiconductor device includes a first transistor having a gate electrode, a source electrode, and a drain electrode; a second transistor having a gate electrode, a source electrode, and a drain electrode; a first terminal electrically connected to the drain electrode of the first transistor and the drain electrode of the second transistor; and a second terminal electrically connected to the source electrode of the first transistor and the source electrode of the second transistor, where the gate electrode of the first transistor is connected to the gate electrode of the second transistor through a contact point and is electrically connected to the drain electrode of the first transistor, a compensation resistor is formed in either a first path, which is a path from the first terminal to the second terminal through the drain electrode and the source electrode of the first transistor, or a second path, which is a path from the first terminal to the second terminal through the drain electrode and the source electrode of the second transistor, or both so that the resistance of the first path and the resistance of the second path become substantially the same, and another compensation resistor is formed in either a third path, which is a path from the gate electrode of the first transistor to the contact point, or a fourth path, which is a path from the gate electrode of the second transistor to the contact point, or both so that the resistance of the third path and the resistance of the fourth path become substantially the same.

In the present invention, the compensation resistors each have a wiring containing the same material as the gate electrode.

In the present invention, the compensation resistors each have a wiring containing the same material as the source or drain electrodes.

In the present invention, the compensation resistors each have a wiring containing the same material as the source or drain regions.

Note that, in the present invention, a parasitic resistor of an electrode includes a contact resistor of the electrode and a wiring resistor connected to the electrode.

A semiconductor device of the present invention has a function to operate an amplifier circuit stably by compensation of various parasitic resistance due to a resistor being added. Due to the stable amplifier circuit, the operating voltage of a bias circuit can be uniformed and the electric characteristics of the circuit can be uniformed; thus, a more highly precise product can be supplied.

BRIEF DESCRIPTION OF DRAWINGS

In the accompanying drawings:

FIGS. 17A to 17C are views each showing a manufacturing process of a semiconductor device of the present invention;

FIGS. 18A to 18C are views each showing a manufacturing process of a semiconductor device of the present invention;

FIGS. 19A and 19B are views each showing a manufacturing process of a semiconductor device of the present invention;

FIGS. 28A to 28C are views each showing a manufacturing process of a semiconductor device of the present invention;

FIGS. 29A and 29B are views each showing a manufacturing process of a semiconductor device of the present invention;

FIG. 36 is a view showing a device on which a semiconductor device of the present invention is mounted;

DETAILED DESCRIPTION OF THE INVENTION

Embodiment Mode

Figure 1:
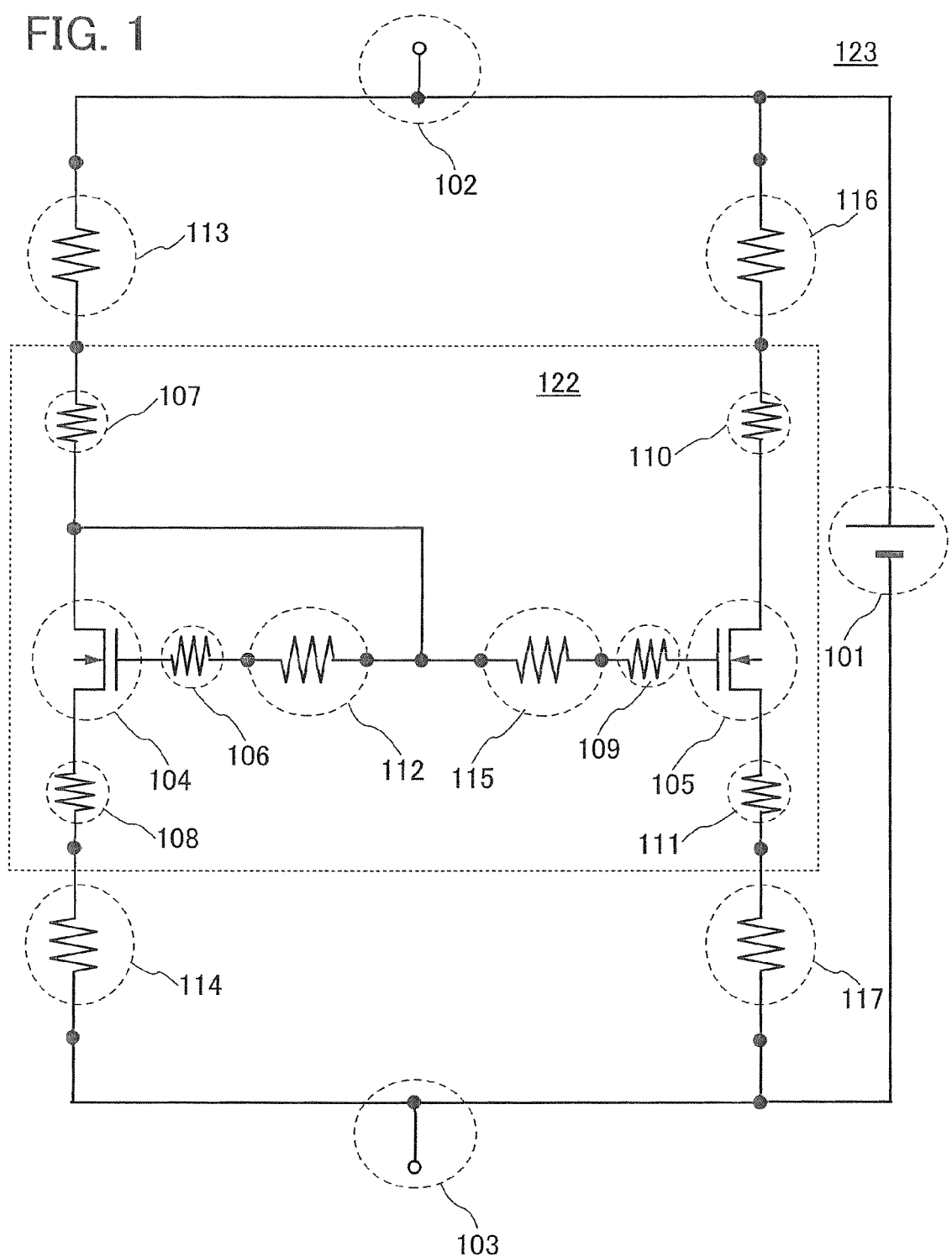
FIG. 1 is a circuit diagram of a semiconductor device of the present invention.

This embodiment mode will be explained below with reference to FIGS. 1 to 11, FIGS. 12A and 12B, FIGS. 13A and 13B, FIGS. 14A and 14B, FIG. 43, and FIG. 44.

However, it is easily understood by those skilled in the art that the present invention can be implemented in various different modes, and modes and details of the present invention can be modified in various ways without departing from the purpose and the scope of the present invention. Therefore, the present invention should be construed as being included therein.

Note that the same portions or portions having the same function in all figures for explaining Embodiment Mode are denoted by the same reference numerals and repeated explanations thereof will be omitted.

A current mirror circuit shown in FIG. 1 includes at least two TFTs of a reference-side TFT and an output-side TFT. In order to stabilize the output of the current mirror circuit, resistance corresponding to each resistor of drain portions and source portions of the reference-side TFT and the output-side TFT is appropriately controlled so that the characteristic variations of the circuit in one substrate are controlled.

The current mirror circuit formed of n-channel TFTs is formed of a reference-side TFT 104 and an output-side TFT 105 (see FIG. 1). The same voltage based on a terminal 103 is applied to gate portions of the reference-side TFT 104 and the output-side TFT 105 so that the current that flows through the output-side TFT 105 is controlled based on the current that flows through the reference-side TFT 104.

At this time, when parasitic resistors 106 and 109 corresponding to resistors of the gate portions in the reference-side TFT 104 and the output-side TFT 105, respectively, and parasitic resistors 107 and 110 and parasitic resistors 108 and 111 corresponding to a drain resistor and a source resistor in the reference-side TFT 104 and the output-side TFT 105, respectively, are not uniform due to wiring resistance, resistance of a circuit connection portion, or the like, the same amount of current as the current that flows through the reference-side TFT 104 cannot be applied to the output-side TFT 105 as the designed value, even when the same voltage is applied to the gate portions of the reference-side TFT 104 and the output-side TFT 105. This causes to show the value of current different from targeted one. This is particularly significant when there are a plurality of each of the reference-side TFTs 104 and the output-side TFTs 105.

In order to compensate this, resistance corresponding to the gate portion, the drain portion, and the source portion of the reference-side TFT 104 and the output-side TFT 105 is appropriately controlled.

Further, in order to reduce the variations of the TFT characteristics while the low voltage operation of the amplifier circuit is realized, a one-stage current mirror amplifier circuit will be used for explanation.

As shown in FIG. 1, a semiconductor device of this embodiment mode includes a circuit 123 including a current mirror circuit 122 formed of the transistors 104 and 105, a power supply (bias) 101, and a terminals 102 and 103. In addition, the transistors 104 and 105 have parasitic resistors 106 to 111 and resistors 112 to 117 for compensating the parasitic resistors. In this specification, such a resistor for compensating a parasitic resistor is referred to as a "compensation resistor". In this embodiment mode, a thin film transistor (TFT) is used as each of the transistors 104 and 105, and further, the TFTs 104 and 105 are each formed of an n-channel TFT. Each of the compensation resistors 112 to 117 compensates any one of a parasitic resistor of a gate electrode, one parasitic resistor of source or drain electrodes, and the other parasitic resistor of the source or drain electrodes in each TFT.

Note that the parasitic resistor of the gate electrode, one parasitic resistor of the source or drain electrodes, and the other parasitic resistor of the source or drain electrodes each include a contact resistor of the electrode and a wiring resistor connected to the electrode.

Figure 4:
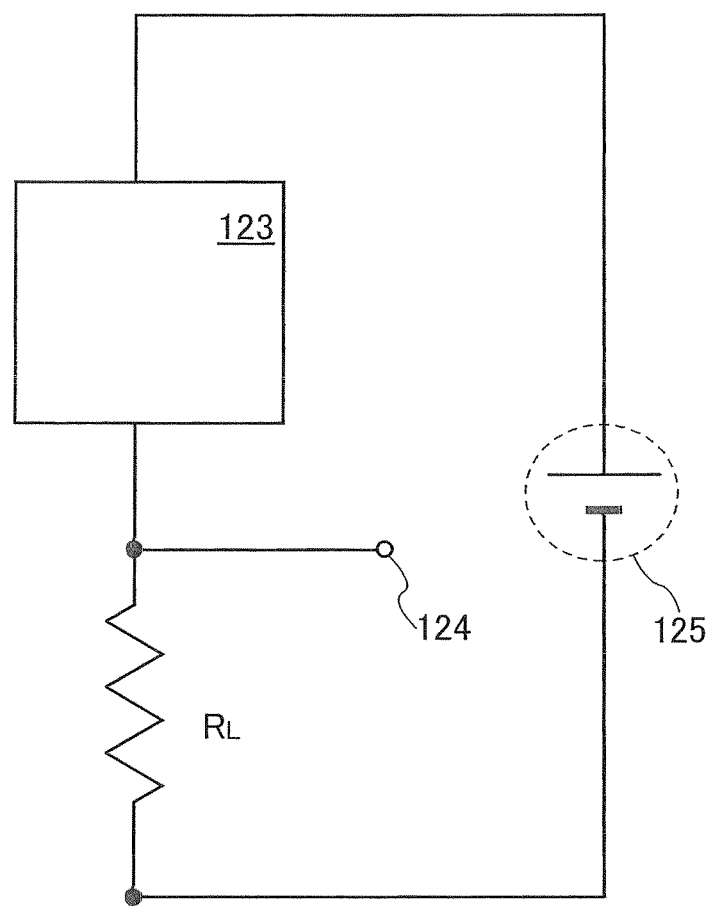
FIG. 4 is a circuit diagram of a semiconductor device of the present invention.

However, as a method for extracting an output signal format as a voltage of which signal process is said to be implemented easily in general, there is a method for converting an output signal format into a voltage by a load resistor $R_L$. Specifically, in a circuit including a circuit 123 including a current mirror circuit 122, a power supply 125, an output terminal 124, and a load resistor $R_L$ as shown in FIG. 4, the output current can be converted into a voltage, using the load resistor $R_L$; thus, the output signal can be extracted outside as the voltage at the output terminal 124. The circuit 123 including the current mirror circuit 122 in FIG. 1 is incorporated in the circuit in FIG. 4, and this circuit will be hereinafter explained.

In FIG. 1, the gate electrode of the TFT 104 that forms the current mirror circuit 122 is electrically connected to the gate electrode of the other TFT 105 that forms the current mirror circuit 122 through the parasitic resistor 106 of the TFT 104, the parasitic resistor 109 of the TFT 105, the resistor 112, and resistor 115, and further, electrically connected to the drain electrode (also referred to as a "drain terminal") which is one electrode of the source and drain electrodes of the TFT 104 through the parasitic resistor 106 of the TFT 104 and the resistor 112.

The drain terminal of the TFT 104 is electrically connected to the terminal 102 through the parasitic resistor 107 of the TFT 104 and the resistor 113, and further, electrically connected to the drain terminal of the TFT 105 through the parasitic resistor 107 of the TFT 104, the parasitic resistor 110 of the TFT 105, the resistor 113, and the resistor 116.

The source electrode (also referred to as a "source terminal") which is the other electrode of the source and drain electrodes of the TFT 104 is electrically connected to the terminal 103 through the parasitic resistor 108 of the TFT 104 and the resistor 114, and further, electrically connected to the source terminal of the TFT 105 through the parasitic resistor 108 of the TFT 104, the parasitic resistor 111 of the TFT 105, the resistor 114, and the resistor 117.

In this embodiment mode, the terminal 103 of the circuit 123 including the current mirror circuit 122 is electrically connected to the low potential side of the power supply 125 through the load resistor $R_L$. At this time, the power supply 101 in the circuit 123 including the current mirror circuit 122 can be omitted.

In FIG. 1, the gate electrode of the TFT 105 that forms the current mirror circuit 122 is electrically connected to the drain terminal of the TFT 104 through the parasitic resistor 109 of the TFT 105 and the resistor 115. The drain terminal of the TFT 105 is electrically connected to the terminal 102 through the parasitic resistance 110 of the TFT 105 and the resistor 116. The source terminal of the TFT 105 is electrically connected to the terminal 103 through the parasitic resistor 111 of the TFT 105 and the resistor 117.

In addition, since the gate electrodes of the TFTs 104 and 105 are connected to each other, the potential in common is applied thereto.

FIG. 1 shows an example of a current mirror circuit with two TFTs. At this time, when the TFTs 104 and 105 have the same characteristics, the ratio of the reference current and the output current is 1:1.

Figure 2:
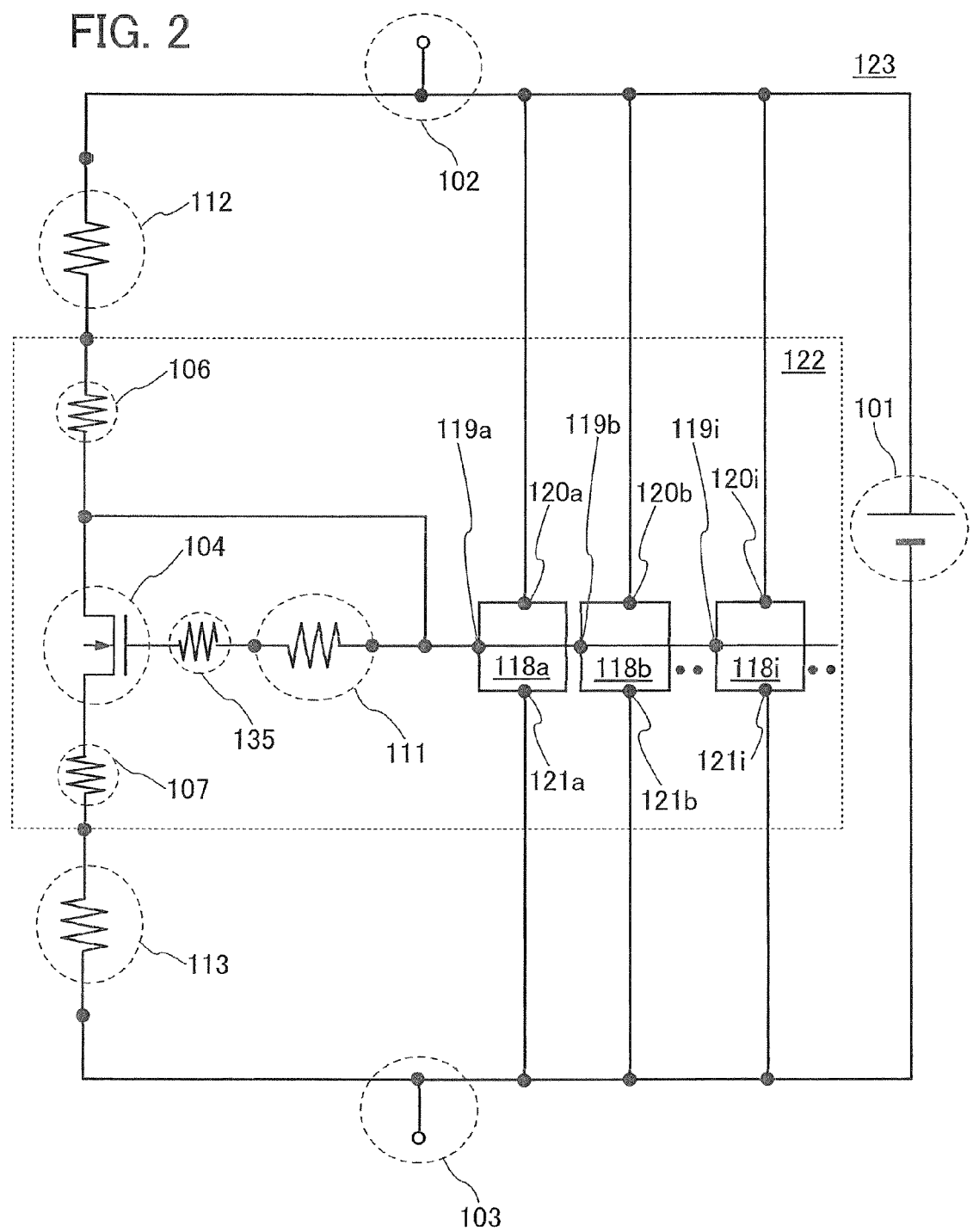
FIG. 2 is a circuit diagram of a semiconductor device of the present invention.
Figure 3:
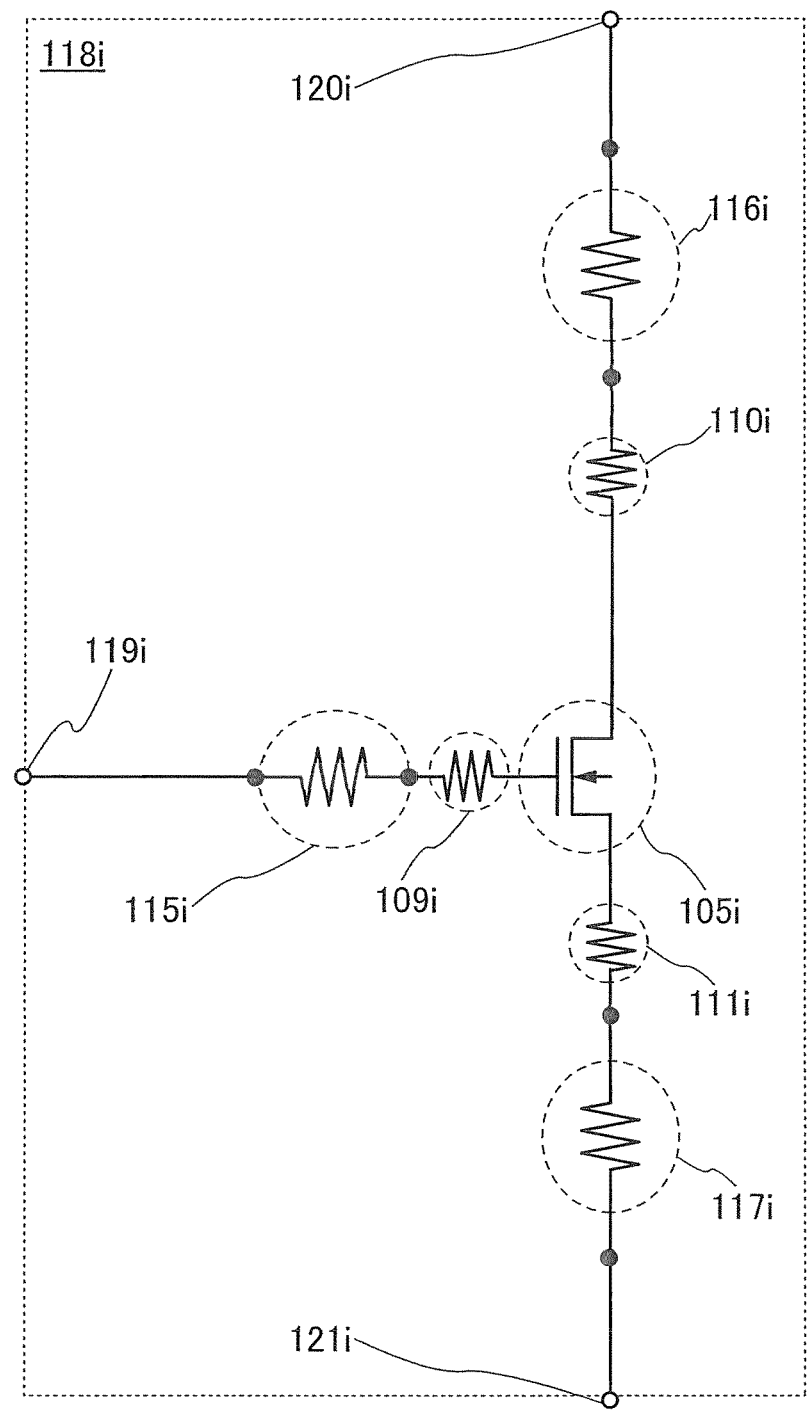
FIG. 3 is a circuit diagram of a semiconductor device of the present invention.

FIG. 2 and FIG. 3 each show a circuit configuration for obtaining the nth output value. The circuit configuration in FIG. 2 corresponds to that the number of the TFTs in FIG. 1 is n. The ratio of the n-channel TFTs 104 and 105 is made to be 1: n as shown in FIG. 2 so that the nth output value can be obtained. This makes increase in the channel width W of the TFT, which is the same principle as obtaining the nth allowable amount of the current that can flow through the TFT.

For example, when the output value is designed to be hundredfold, one n-channel TFT 104 and 100 n-channel TFTs 105 are connected in parallel so that the target current can be obtained.

FIG. 3 shows the detail of a circuit 118i (circuits 118a, 118b, and the like) in FIG. 2.

The circuit configuration in FIG. 3 is based on that in FIG. 1 and the same elements are denoted by the same reference numerals. In other words, a gate electrode of a TFT 105i is electrically connected to a terminal 119i through a parasitic resistor 109i and a resistor 115i. In addition, a drain terminal of the TFT 105i is electrically connected to a terminal 120i through a parasitic resistor 110i and a resistor 116i. Moreover, a source terminal of the TFT 105i is electrically connected to a terminal 121i through a parasitic resistor 111i and a resistor 117i.

In order to explain the circuits 118a, 118b, and the like in FIG. 2, the circuit 118i which is one of the circuits is shown in FIG. 3. Since the circuit 118i is based on the circuit configuration of FIG. 1, the reference numerals with "i" in FIG. 3 are the same as those without "i" in FIG. 1. In other words, the TFT 105 in FIG. 1 and the TFT 105i in FIG. 3 are the same, and the resistor 116 in FIG. 1 and the resistor 116i in FIG. 3 are the same, for example. Further, the reference numerals with "a" and "b" in FIG. 2 are the same as the reference numerals without "a" and "b" in FIG. 1, respectively.

Therefore, in FIG. 2, the n-channel TFT 105 is formed of n n-channel TFTs 105*a*, 105*b*, 105*i*, and the like. Accordingly, the current that flows through the TFT 104 is amplified in the nth amount and output.

When the portions in FIG. 2 and FIG. 3 denote the same portions as in FIG. 1, the portions are denoted by the same reference numerals.

In addition, FIG. 1 shows the current mirror circuit 122 as an equivalent circuit using an n-channel TFT; however, a p-channel TFT may also be used instead of the n-channel TFT.

Figure 5:
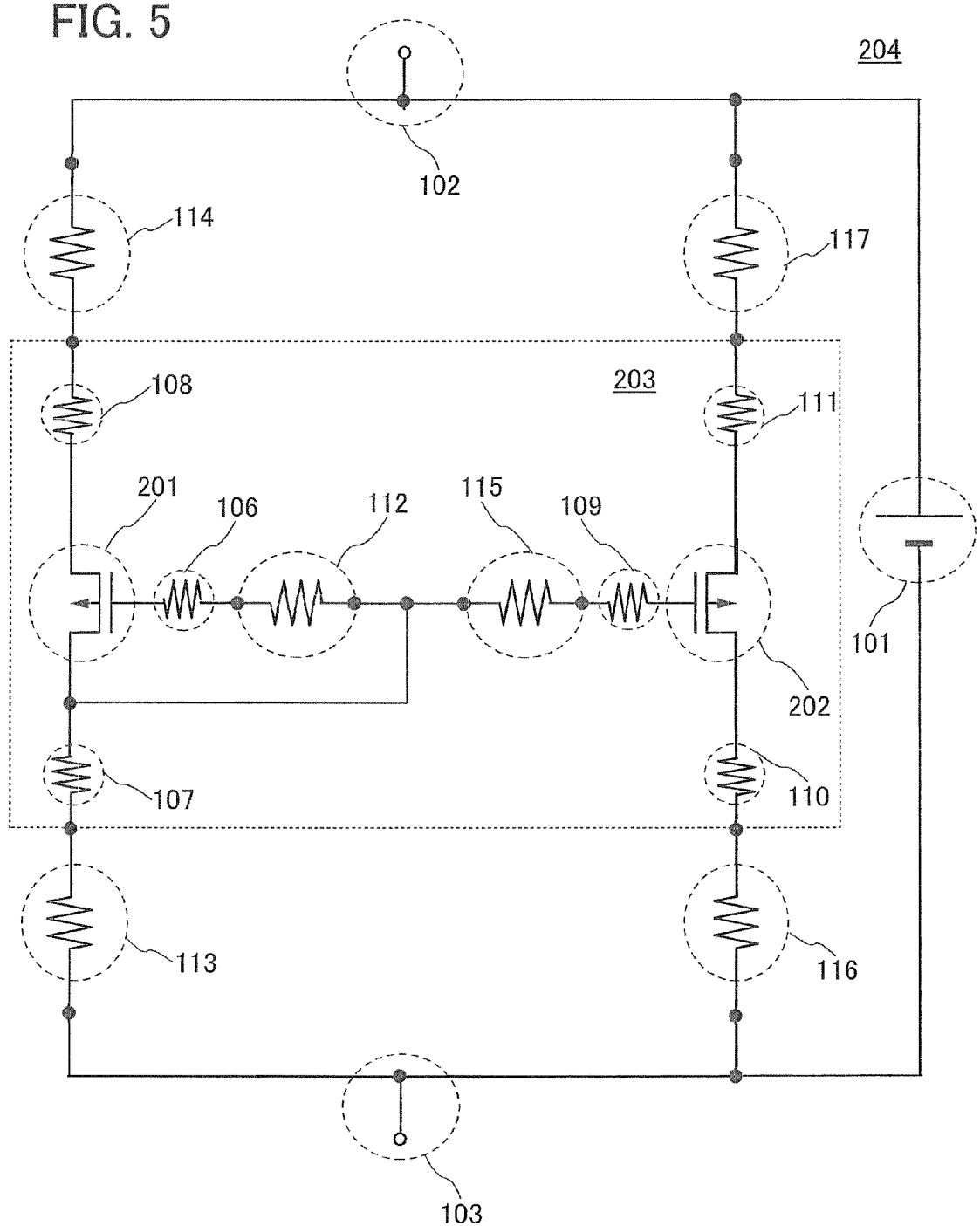
FIG. 5 is a circuit diagram of a semiconductor device of the present invention.

In a case of forming the amplifier circuit with p-channel TFTs, an equivalent circuit shown in FIG. 5 is realized. As shown in FIG. 5, a current mirror circuit 203 formed of p-channel TFTs 201 and 202 and a terminal 102 are electrically connected to the high potential side of a power supply 101, and a terminal 103 is electrically connected to the low potential side of the power supply 101 through a load resistor $R_L$. When a circuit 204 including the current mirror circuit 203 is used as the circuit 123 in FIG. 4, the power supply 101 in the circuit 204 can be substituted by the power supply 125.

FIGS. 6 to 11 each show a cross-sectional view of the circuit 123 including the compensation resistors 112 to 117 and the TFTs 104 and 105 in FIG. 1.

In FIGS. 6 to 11, reference numeral 210 denotes a substrate; 212, a base insulating film; and 213, a gate insulating film.

In addition, a connection electrode 285, a terminal electrode 281, source or drain electrodes 282 of a TFT 104, and source or drain electrodes 283 of a TFT 105 each have a stacked-layer structure of a refractory metal film and a low-resistant metal film (an aluminum alloy, pure aluminum, or the like). Here, the source or drain electrodes 282 and 283 are each formed to have a three-layer structure where a titanium film (Ti film), an aluminum film (Al film), and a Ti film are sequentially stacked.

Figure 6:
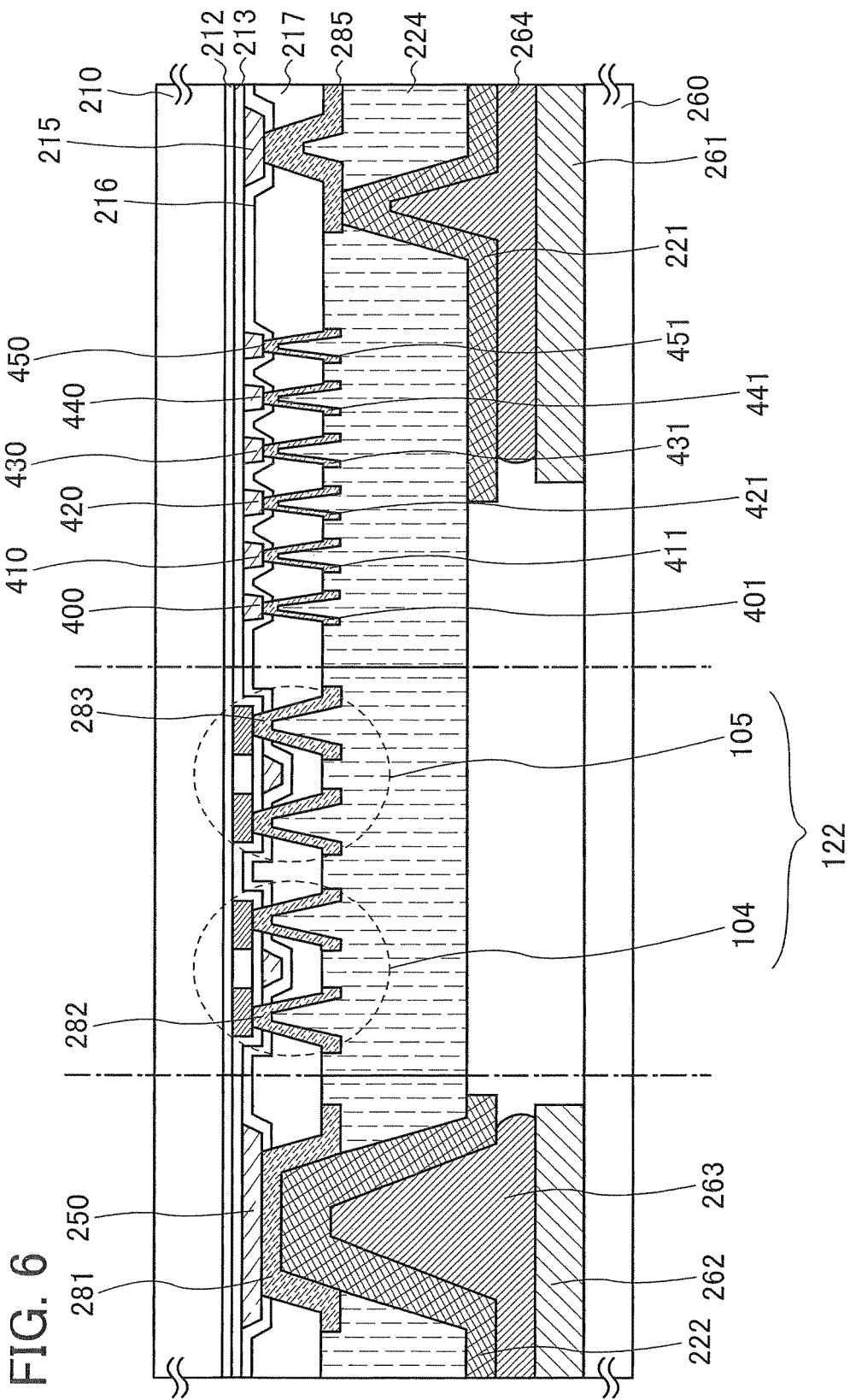
FIG. 6 is a cross-sectional view of a semiconductor device of the present invention.

In FIG. 6, each pair of wirings 400 and 401, wirings 410 and 411, wirings 420 and 421, wirings 430 and 431, wirings 440 and 441, and wirings 450 and 451 forms one resistor. This one resistor corresponds to any one of the resistors 112 to 117 in FIG. 1. In other words, any one of the combinations of the pairs of the wirings 400 and 401, the wirings 410 and 411, the wirings 420 and 421, the wirings 430 and 431, the wirings 440 and 441, and the wirings 450 and 451 corresponds to any one of the resistors 112 to 117.

The wirings 400, 410, 420, 430, 440, and 450 are each formed of the same material and in the same process as gate electrodes of the TFTs 104 and 105.

The wirings 401, 411, 421, 431, 441, and 451 are each formed of the same material and in the same process as the source or drain electrodes 282 (or 283).

Figure 7:
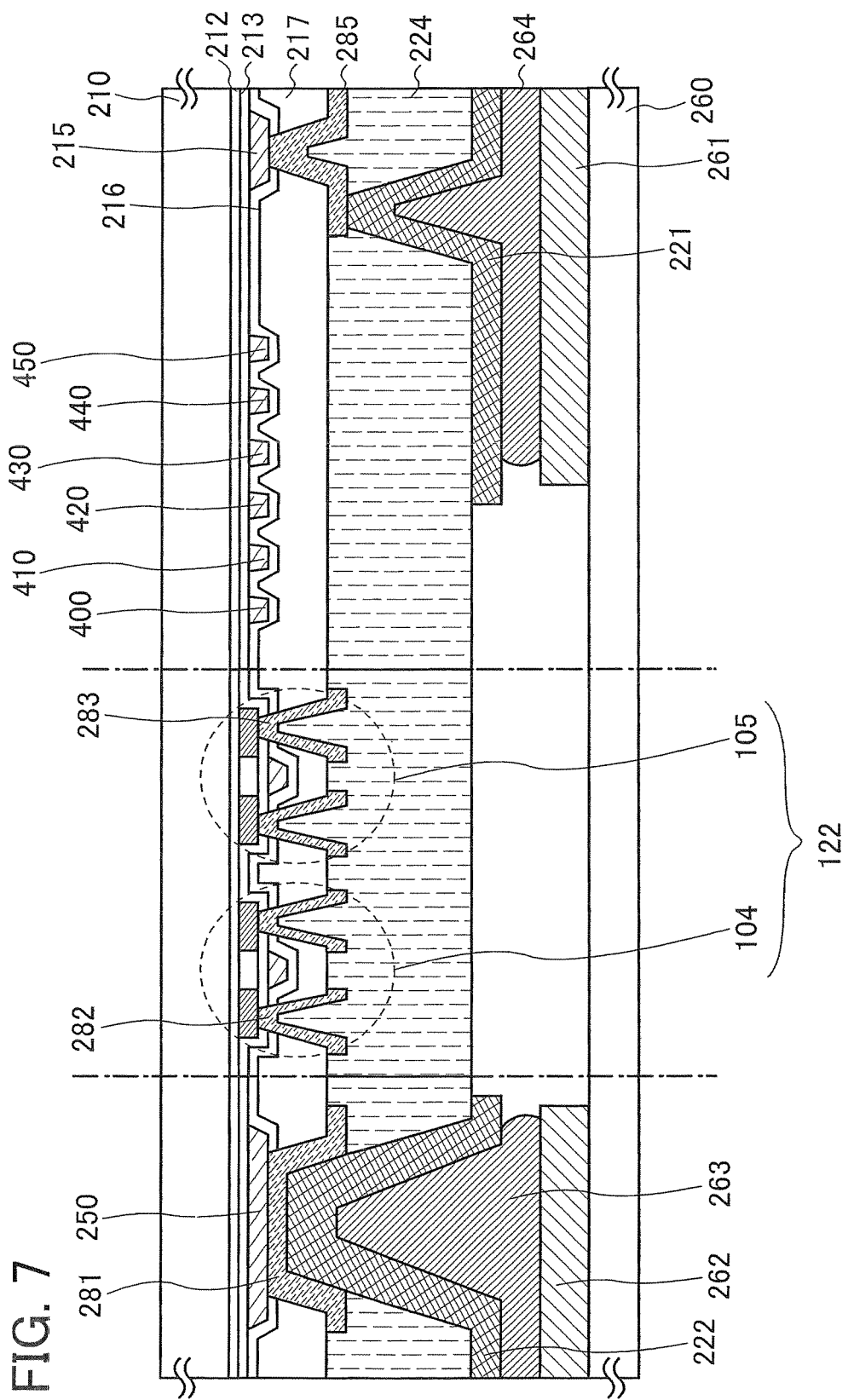
FIG. 7 is a cross-sectional view of a semiconductor device of the present invention.

In FIG. 7, each of wirings 400, 410, 420, 430, 440, and 450 is one resistor and corresponds to any one of the resistors 112 to 117 in FIG. 1.

The wirings 400, 410, 420, 430, 440, and 450 are each formed of the same material and in the same process as gate electrodes of the TFTs 104 and 105.

Figure 8:
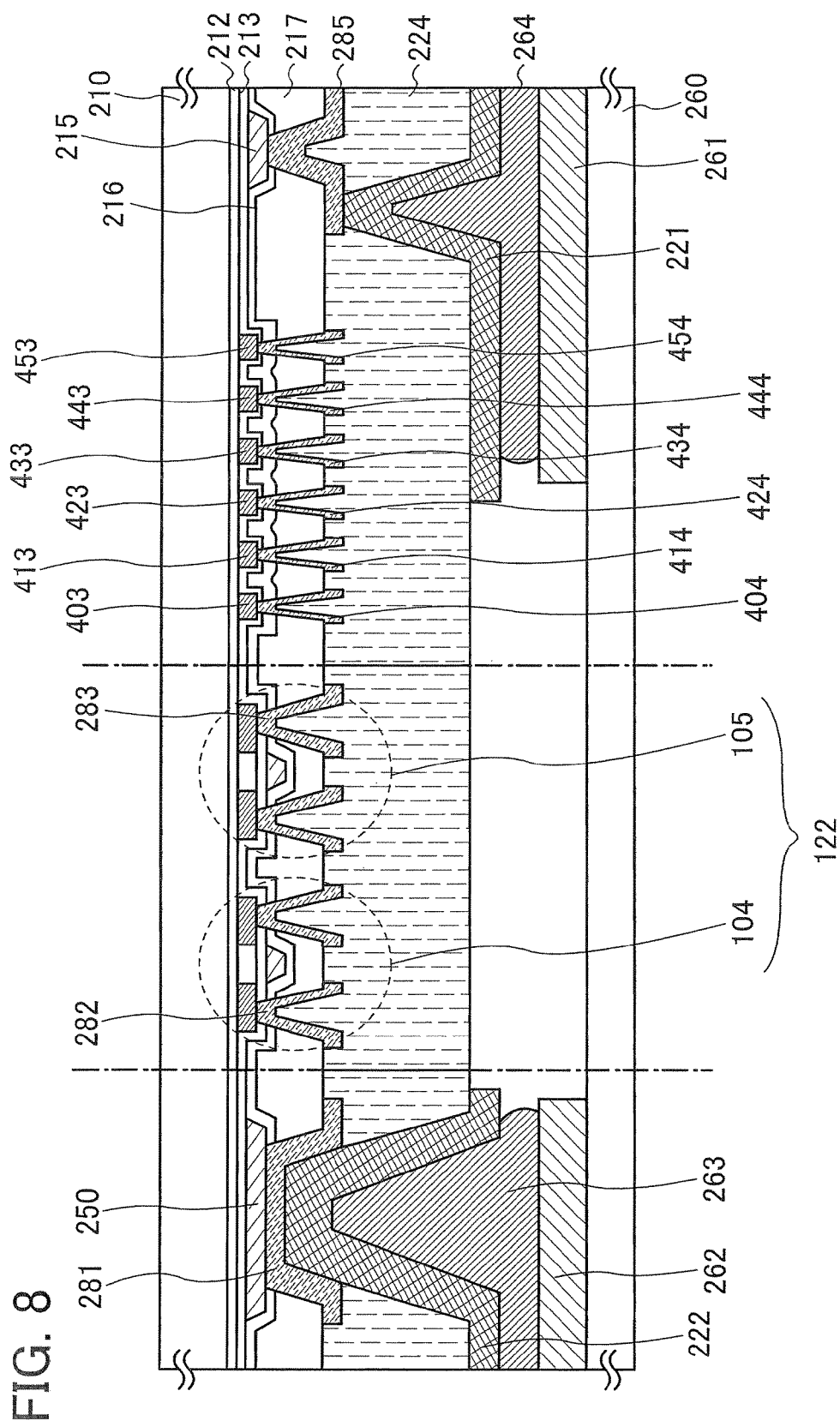
FIG. 8 is a cross-sectional view of a semiconductor device of the present invention.

In FIG. 8, each pair of wirings 403 and 404, wirings 413 and 414, wirings 423 and 424, wirings 433 and 434, wirings 443 and 444, and wirings 453 and 454 forms one resistor. This one resistor corresponds to any one of the resistors 112 to 117 in FIG. 1. In other words, any one of the combinations of the pairs of the wirings 403 and 404, the wirings 413 and 414, the wirings 423 and 424, the wirings 433 and 434, the wirings 443 and 444, and the wirings 453 and 454 corresponds to any one of the resistors 112 to 117.

The wirings 403, 413, 423, 433, 443, and 453 are each formed of the same material and in the same process as source or drain regions of the TFTs 104 and 105.

The wirings 404, 414, 424, 434, 444, and 454 are each formed of the same material and in the same process as the source or drain electrodes 282 (or 283).

Figure 9:
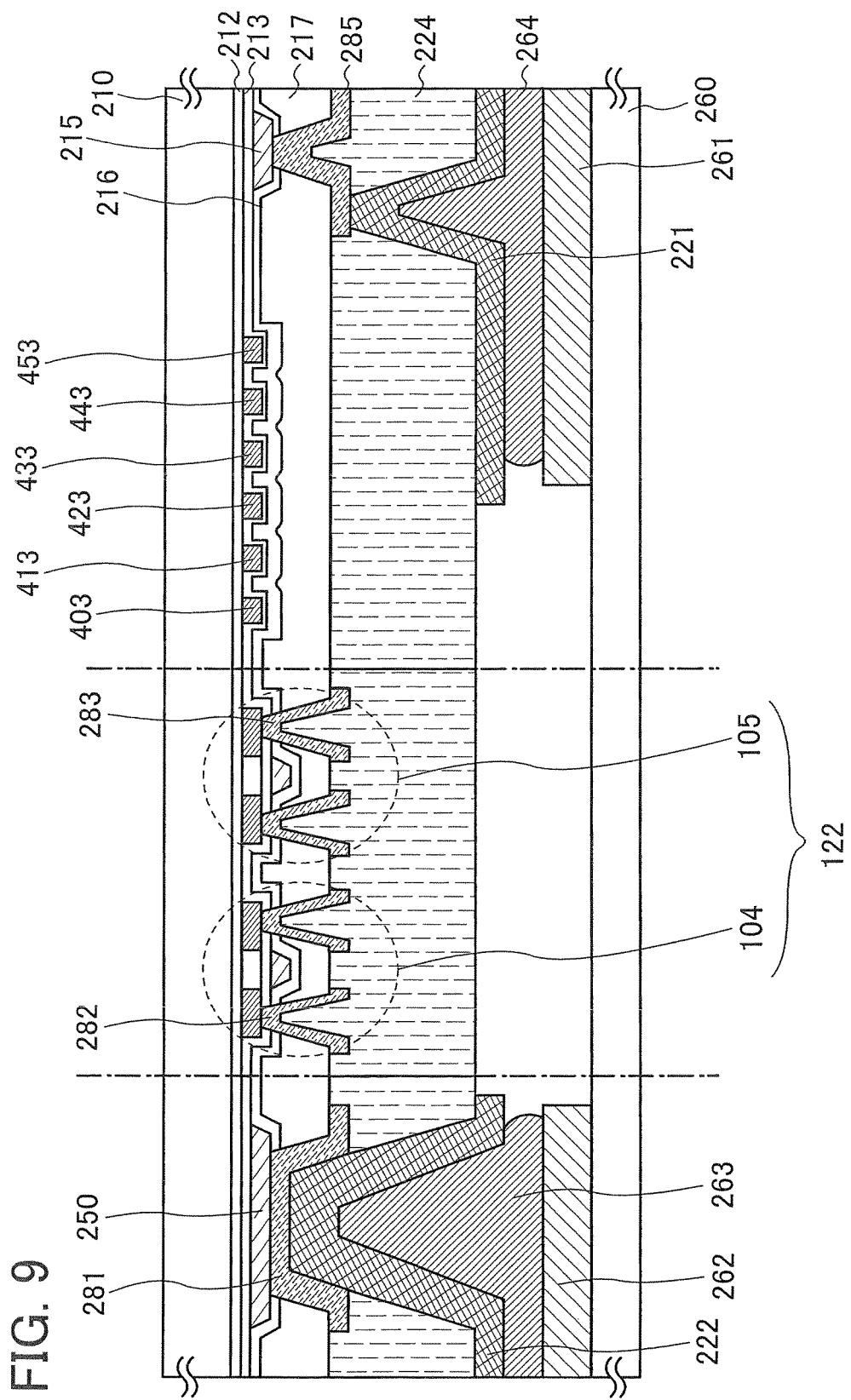
FIG. 9 is a cross-sectional view of a semiconductor device of the present invention.

In FIG. 9, each of wirings 403, 413, 423, 433, 443, and 453 is one resistor and corresponds to any one of the resistors 112 to 117 in FIG. 1.

The wirings 403, 413, 423, 433, 443, and 453 are each formed of the same material and in the same process as source or drain regions of the TFTs 104 and 105.

Figure 10:
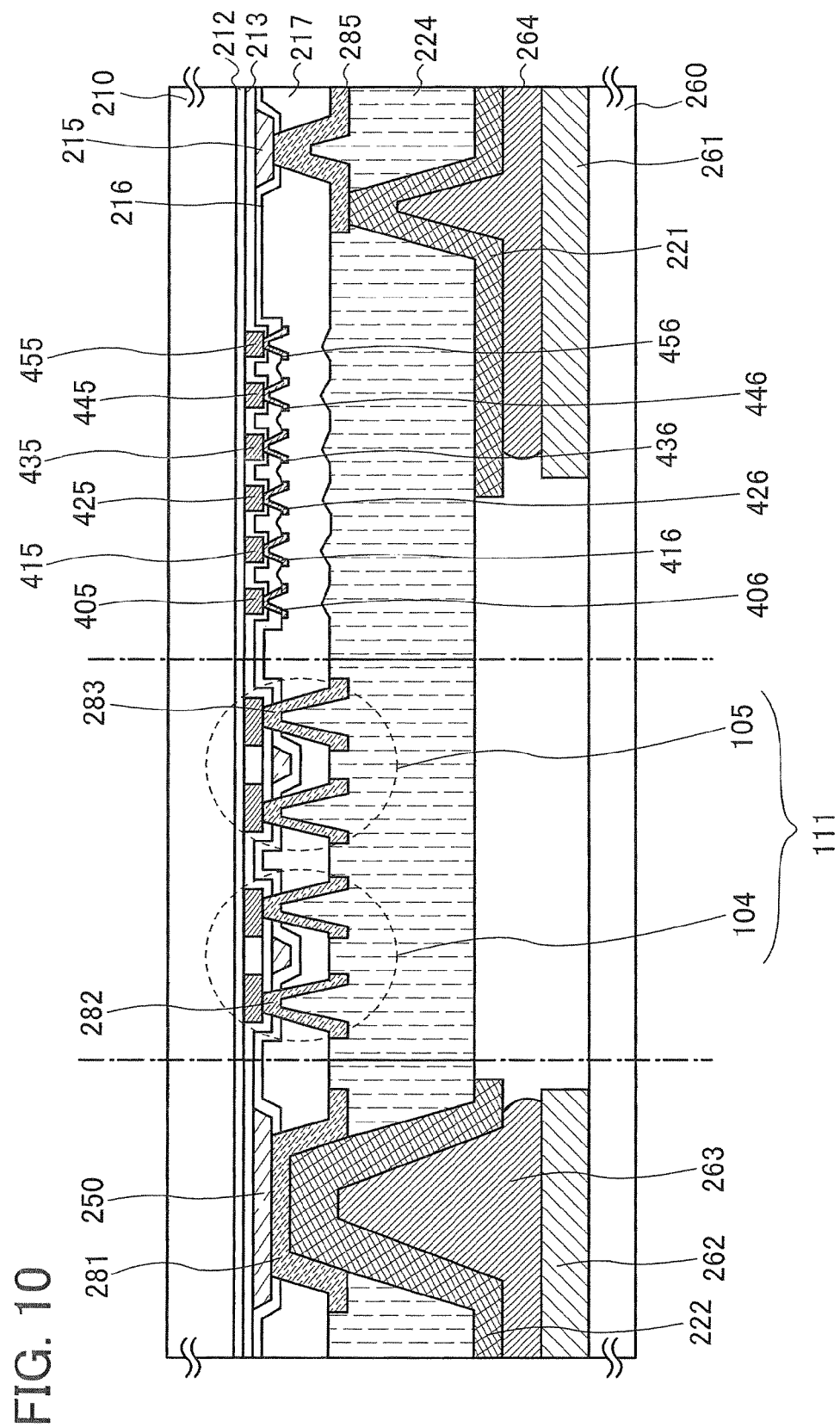
FIG. 10 is a cross-sectional view of a semiconductor device of the present invention.

In FIG. 10, each pair of wirings 405 and 406, wirings 415 and 416, wirings 425 and 426, wirings 435 and 436, wirings 445 and 446, and wirings 455 and 456 forms one resistor. This one resistor corresponds to any one of the resistors 112 to 117 in FIG. 1. In other words, any one of the combinations of the pairs of the wirings 405 and 406, the wirings 415 and 416, the wirings 425 and 426, the wirings 435 and 436, the wirings 445 and 446, and the wirings 455 and 456 corresponds to any one of the resistors 112 to 117.

In FIG. 10, the wirings 405, 415, 425, 435, 445, and 455 are each formed of the same material and in the same process as source or drain regions of the TFTs 104 and 105.

The wirings 406, 416, 426, 436, 446, and 456 are each formed of the same material and in the same process as gate electrodes of the TFTs 104 and 105.

Figure 11:
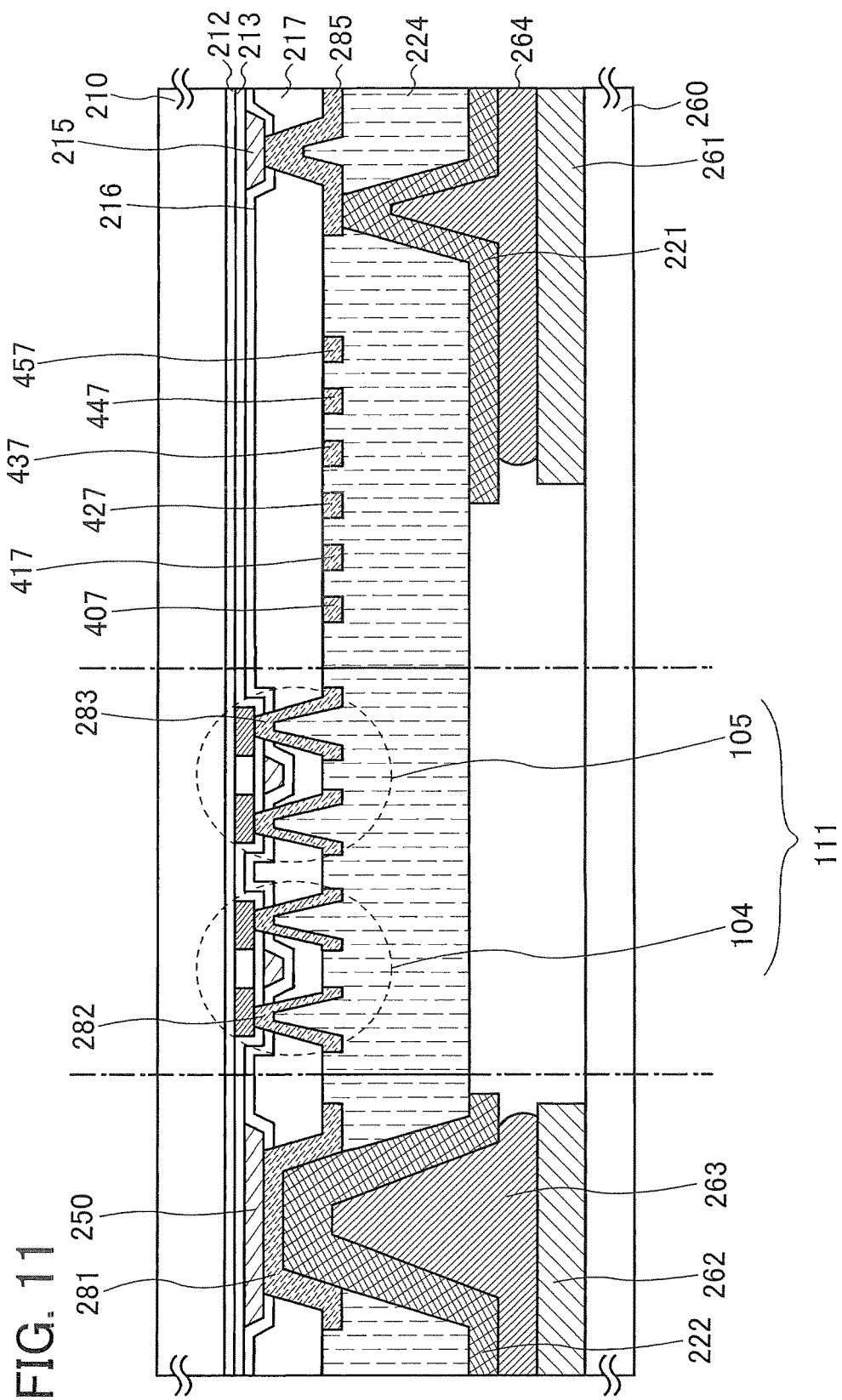
FIG. 11 is a cross-sectional view of a semiconductor device of the present invention.

In FIG. 11, each of wirings 407, 417, 427, 437, 447, and 457 is one resistor and corresponds to any one of the resistors 112 to 117 in FIG. 1.

The wirings 407, 417, 427, 437, 447, and 457 are each faulted of the same material and in the same process as the source or drain electrodes 282 (or 283).

The wirings 401, 411, 421, 431, 441, and 451 in FIG. 6 each have a stacked-layer structure of a refractory metal film and a low-resistant metal film.

The wirings 404, 414, 424, 434, 444, and 454 in FIG. 8 each have a stacked-layer structure of a refractory metal film and a low-resistant metal film.

The wirings 407, 417, 427, 437, 447, and 457 in FIG. 11 each have a stacked-layer structure of a refractory metal film and a low-resistant metal film.

In addition, the connection electrode 285, the terminal electrode 281, the source or drain electrodes 282 of the TFT 104, and the source or drain electrodes 283 of the TFT 105 in each of FIGS. 6 to 11 each have a stacked-layer structure of a refractory metal film and a low-resistant metal film.

As such a low-resistant metal film, an aluminum alloy, pure aluminum, or the like can be given. In this embodiment mode, a three-layer structure where a titanium film (Ti film), an aluminum film (Al film), and a Ti film are sequentially stacked is employed as such a stacked-layer structure of a refractory metal film and a low-resistant metal film.

Instead of the stacked-layer structure of the refractory metal film and the low-resistant metal film, the connection electrode 285, the terminal electrode 281, the source or drain electrodes 282 of the TFT 104, and the source or drain electrodes 283 of the TFT 105 can also be each formed of a single-layer conductive film. As such a single-layer conductive film, a single-layer film formed of an element of titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt) or an alloy material or a compound material containing the element as its main component; or a single-layer film formed of a nitride thereof, for example, titanium nitride, tungsten nitride, tantalum nitride, or molybdenum nitride can be used.

In such a manner, the number of deposition can be reduced in the manufacturing process by formation of the following components into a single-layer film: the wirings 401, 411, 421, 431, 441, 451, 404, 414, 424, 434, 444, 454, 407, 417, 427, 437, 447, and 457, the connection electrodes 285, the terminal electrodes 281, the source or drain electrodes 282 of the TFTs 104, and the source or drain electrodes 283 of the TFTs 105.

Figure 12A:
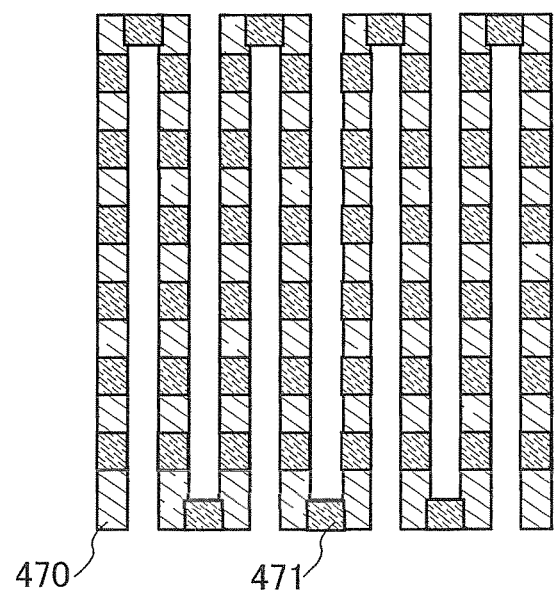
FIGS. 12A and 12B are each a top view of an element serving as a resistor of a circuit in a semiconductor device of the present invention.

FIG. 12A shows the layout example of the pairs of the wirings 400 and 401, the wirings 410 and 411, the wirings 420 and 421, the wirings 430 and 431, the wirings 440 and 441, and the wirings 450 and 451 in FIG. 6.

Figure 12B:
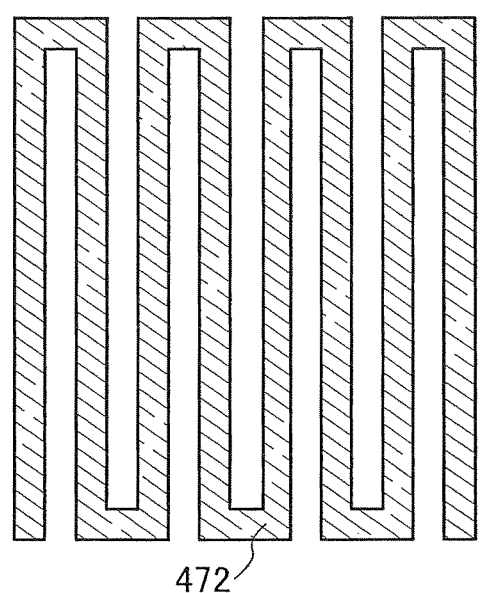

FIG. 12B shows the layout example of the wirings 400, 410, 420, 430, 440, and 450 in FIG. 7.

Figure 13A:
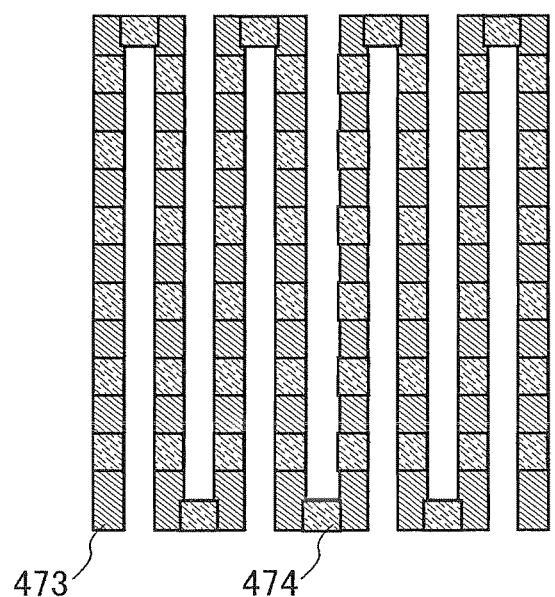
FIGS. 13A and 13B are each a top view of an element serving as a resistor of a circuit in a semiconductor device of the present invention.

FIG. 13A shows the layout example of the pairs of the wirings 403 and 404, the wirings 413 and 414, the wirings 423 and 424, the wirings 433 and 434, the wirings 443 and 444, and the wirings 453 and 454 in FIG. 8.

Figure 13B:
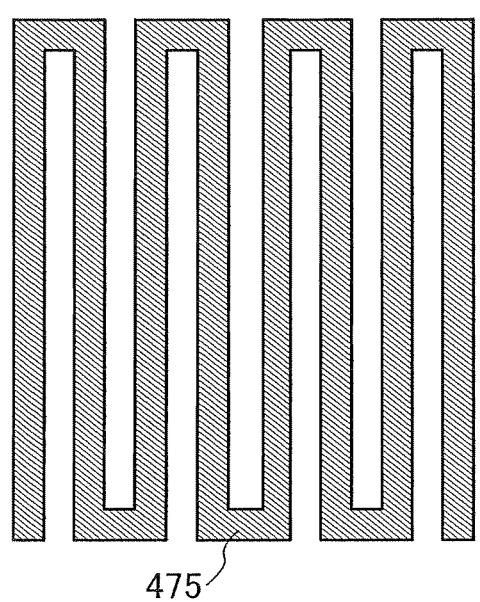

FIG. 13B shows the layout example of the wirings 403, 413, 423, 433, 443, and 453 in FIG. 9.

Figure 14A:
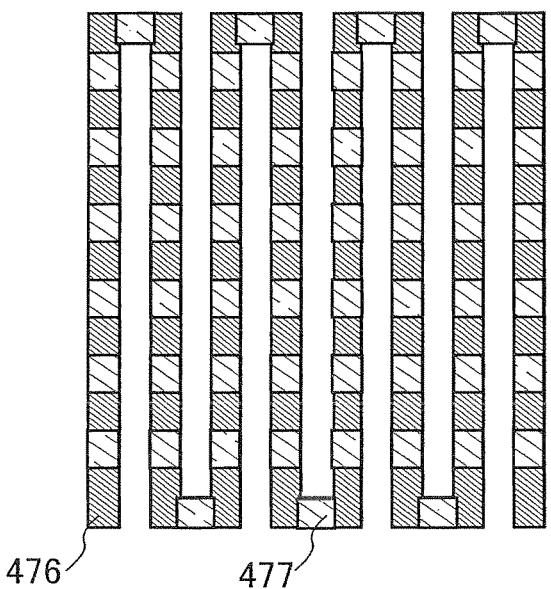
FIGS. 14A and 14B are each a top view of an element serving as a resistor of a circuit in a semiconductor device of the present invention.

FIG. 14A shows the layout example of the pairs of the wirings 405 and 406, the wirings 415 and 416, the wirings 425 and 426, the wirings 435 and 436, the wirings 445 and 446, and the wirings 455 and 456 in FIG. 10.

Figure 14B:
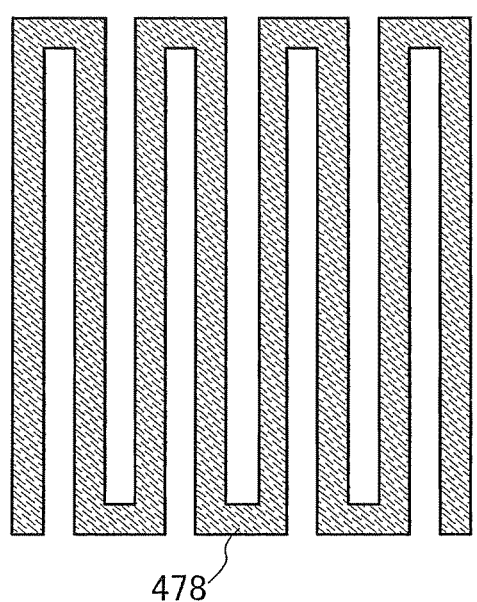

FIG. 14B shows the layout example of the wirings 407, 417, 427, 437, 447, and 457 in FIG. 11.

FIG. 12A is a top view of one resistor, and the resistor corresponds to each of the pairs of the wirings 400 and 401, the wirings 410 and 411, the wirings 420 and 421, the wirings 430 and 431, the wirings 440 and 441, and the wirings 450 and 451 in FIG. 6.

Each of the wirings 400, 410, 420, 430, 440, and 450 in FIG. 6 corresponds to a wiring 470 in FIG. 12A. In addition, each of the wirings 401, 411, 421, 431, 441, and 451 corresponds to a wiring 471 in FIG. 12A.

In addition, FIG. 12B is a top view of one resistor, and a wiring 472 corresponds to each of the wirings 400, 410, 420, 430, 440, and 450 in FIG. 7.

FIG. 13A is a top view of one resistor, and the resistor corresponds to each of the pairs of the wirings 403 and 404, the wirings 413 and 414, the wirings 423 and 424, the wirings 433 and 434, the wirings 443 and 444, and the wirings 453 and 454 in FIG. 8.

Each of the wirings 403, 413, 423, 433, 443, and 453 in FIG. 8 corresponds to a wiring 473 in FIG. 13A. In addition, each of the wirings 404, 414, 424, 434, 444, and 454 corresponds to a wiring 474 in FIG. 13A.

In addition, FIG. 13B is a top view of one resistor, and a wiring 475 corresponds to each of the wirings 403, 413, 423, 433, 443, and 453 in FIG. 9.

FIG. 14A is a top view of one resistor, and the resistor corresponds to each of the pairs of the wirings 405 and 406, the wirings 415 and 416, the wirings 425 and 426, the wirings 435 and 436, the wirings 445 and 446, and the wirings 455 and 456 in FIG. 10.

Each of the wirings 405, 415, 425, 435, 445, and 455 in FIG. 10 corresponds to a wiring 476 in FIG. 14A. In addition, each of the wirings 406, 416, 426, 436, 446, and 456 corresponds to a wiring 477 in FIG. 14A.

FIG. 14B is a top view of one resistor, and a wiring 478 corresponds to each of the wirings 407, 417, 427, 437, 447, and 457 in FIG. 11.

Note that each of the resistors 112 to 117 in FIG. 1 does not have to employ the same structure, and, among the resistors shown in FIGS. 6 to 11, resistors each having a different structure may also be formed, if necessary. For example, in order to form the circuit 123 in FIG. 1, the resistor 112 may also employ the structure of the wirings 403 and 404 shown in FIG. 8, and the resistor 113 may also employ the structure of the wiring 400 shown in FIG. 7.

In FIGS. 6 to 11, an example of a top-gate TFT of a structure in which the n-channel TFTs 104 and 105 include one channel formation region (in this specification, referred to as a "single gate structure") is shown; however, a structure having a plurality of channel formation regions may also be employed to reduce variation in the on current value.

In order to reduce the value of off current, a lightly doped drain (LDD) region may also be provided in the n-channel TFTs 104 and 105. The LDD region is a region to which an impurity element is added at low concentration between a channel formation region and a source or drain region which is formed by being added with an impurity element at high concentration. By providing of the LDD region, effect to relieve an electric field in the vicinity of the drain region and to prevent deterioration due to hot carrier injection can be obtained.

In addition, in order to prevent deterioration of the value of on current due to hot carrier, the n-channel TFTs 104 and 105 may employ a structure in which an LDD region and a gate electrode are placed so as to be overlapped with each other through a gate insulating film (referred to as a "GOLD (Gate-drain Overlapped LDD) structure" in this specification).

In a case of where a GOLD structure is employed, the effect to reduce an electric field in the vicinity of a drain region and to prevent deterioration due to hot carrier injection is more enhanced than in a case where an LDD region and a gate electrode are not overlapped with each other. By employing of such a GOLD structure, electric field intensity in the vicinity of a drain region is relieved and hot carrier injection is prevented; therefore, it is effective for prevention of deterioration phenomenon.

The TFTs 104 and 105 that form the current mirror circuit 122 may also be a bottom gate TFT, for example, an inversely staggered TFT as well as a top gate TFT.

In addition, a wiring 215 is connected to the drain wiring (also referred to as the drain electrode) or the source wiring (also referred to as the source electrode) of the TFT 104. Reference numerals 216 and 217 each denote an insulating film and 285 denotes a connection electrode. Note that, as the insulating film 217, a silicon oxide film which is formed by a CVD method is preferably used. When the insulating film 217 is formed of a silicon oxide film which is formed by a CVD method, fixing intensity is improved.

In addition, a terminal electrode 250 is formed in the same process as the wiring 215, and the terminal electrode 281 is formed in the same process as the connection electrode 285.

Moreover, a terminal electrode 221 is mounted on an electrode 261 of a substrate 260 with a solder 264. A terminal electrode 222 is formed in the same process as the terminal electrode 221, and is mounted on an electrode 262 of the substrate 260 with a solder 263.

In FIG. 6, the wiring 400 is connected to the gate electrode of the TFT 104. The wiring 401 formed in the same process as the connection electrode 285 is connected to a drain electrode of the TFT 104.

The wiring 410 is connected to the drain electrode of the TFT 104. The wiring 411 is connected to the terminal 102 of the circuit 123 including the current mirror circuit 122.

The wiring 420 is connected to a source electrode of the TFT 104. The wiring 421 is connected to the terminal 103 of the circuit 123 including the current mirror circuit 122.

The wiring 430 is connected to the gate electrode of the TFT 105. The wiring 431 is connected to the gate electrode of the TFT 104 through the wirings 400 and 401.

The wiring 440 is connected to a drain electrode of the TFT 105. The wiring 441 is connected to the terminal 102 of the circuit 123 including the current mirror circuit 122.

The wiring 450 is connected to a source electrode of the TFT 105. The wiring 451 is connected to the terminal 103 of the circuit 123 including the current mirror circuit 122.

In FIG. 7, the wiring 400 is connected to the gate electrode of the TFT 104 and a drain electrode of the TFT 104.

The wiring 410 is connected to the drain electrode of the TFT 104 and the terminal 102 of the circuit 123 including the current mirror circuit 122.

The wiring 420 is connected to a source electrode of the TFT 104 and the terminal 103 of the circuit 123 including the current mirror circuit 122.

The wiring 430 is connected to the gate electrode of the TFT 105, and the gate electrode of the TFT 104 through the wiring 400.

The wiring 440 is connected to a drain electrode of the TFT 105 and the terminal 102 of the circuit 123 including the current mirror circuit 122.

The wiring 450 is connected to a source electrode of the TFT 105 and the terminal 103 of the circuit 123 including the current mirror circuit 122.

In FIG. 8, the wiring 403 is connected to a gate electrode of the TFT 104. The wiring 404 is connected to a drain electrode of the TFT 104.

The wiring 413 is connected to the drain electrode of the TFT 104. The wiring 414 is connected to the terminal 102 of the circuit 123 including the current mirror circuit 122.

The wiring 423 is connected to a source electrode of the TFT 104. The wiring 424 is connected to the terminal 103 of the circuit 123 including the current mirror circuit 122.

The wiring 433 is connected to a gate electrode of the TFT 105. The wiring 434 is connected to the gate electrode of the TFT 104 through the wirings 403 and 404.

The wiring 443 is connected to a drain electrode of the TFT 105. The wiring 444 is connected to the terminal 102 of the circuit 123 including the current mirror circuit 122.

The wiring 453 is connected to a source electrode of the TFT 105. The wiring 454 is connected to the terminal 103 of the circuit 123 including the current mirror circuit 122.

In FIG. 9, the wiring 403 is connected to a gate electrode of the TFT 104 and a drain electrode of the TFT 104.

The wiring 413 is connected to the drain electrode of the TFT 104 and the terminal 102 of the circuit 123 including the current mirror circuit 122.

The wiring 423 is connected to a source electrode of the TFT 104 and the terminal 103 of the circuit 123 including the current mirror circuit 122.

The wiring 433 formed in the same process as the wiring 215 is connected to a gate electrode of the TFT 105 and the gate electrode of the TFT 104.

The wiring 443 is connected to a drain electrode of the TFT 105 and the terminal 102 of the circuit 123 including the current mirror circuit 122.

The wiring 453 is connected to a source electrode of the TFT 105 and the terminal 103 of the circuit 123 including the current mirror circuit 122.

In FIG. 10, the wiring 405 is connected to the gate electrode of the TFT 104, and the wiring 406 is connected to a drain electrode of the TFT 104.

The wiring 415 is connected to the drain electrode of the TFT 104 and the terminal 102 of the circuit 123 including the current mirror circuit 122.

The wiring 425 is connected to a source electrode of the TFT 104 and the terminal 103 of the circuit 123 including the current mirror circuit 122.

The wiring 435 is connected to the gate electrode of the TFT 105, and the wiring 436 is connected to the gate electrode of the TFT 104 through the wirings 405 and 406.

The wiring 445 is connected to a drain electrode of the TFT 105 and the terminal 102 of the circuit 123 including the current mirror circuit 122.

The wiring 455 is connected to a source electrode of the TFT 105 and the terminal 103 of the circuit 123 including the current mirror circuit 122.

In FIG. 11, the wiring 407 is connected to a gate electrode of the TFT 104 and a drain electrode of the TFT 104.

The wiring 417 is connected to the drain electrode of the TFT 104 and the terminal 102 of the circuit 123 including the current mirror circuit 122.

The wiring 427 is connected to a source electrode of the TFT 104 and the terminal 103 of the circuit 123 including the current mirror circuit 122.

The wiring 437 is connected to a gate electrode of the TFT 105 and the gate electrode of the TFT 104.

The wiring 447 is connected to a drain electrode of the TFT 105 and the terminal 102 of the circuit 123 including the current mirror circuit 122.

The wiring 457 is connected to a source electrode of the TFT 105 and the terminal 103 of the circuit 123 including the current mirror circuit 122.

Figure 43:
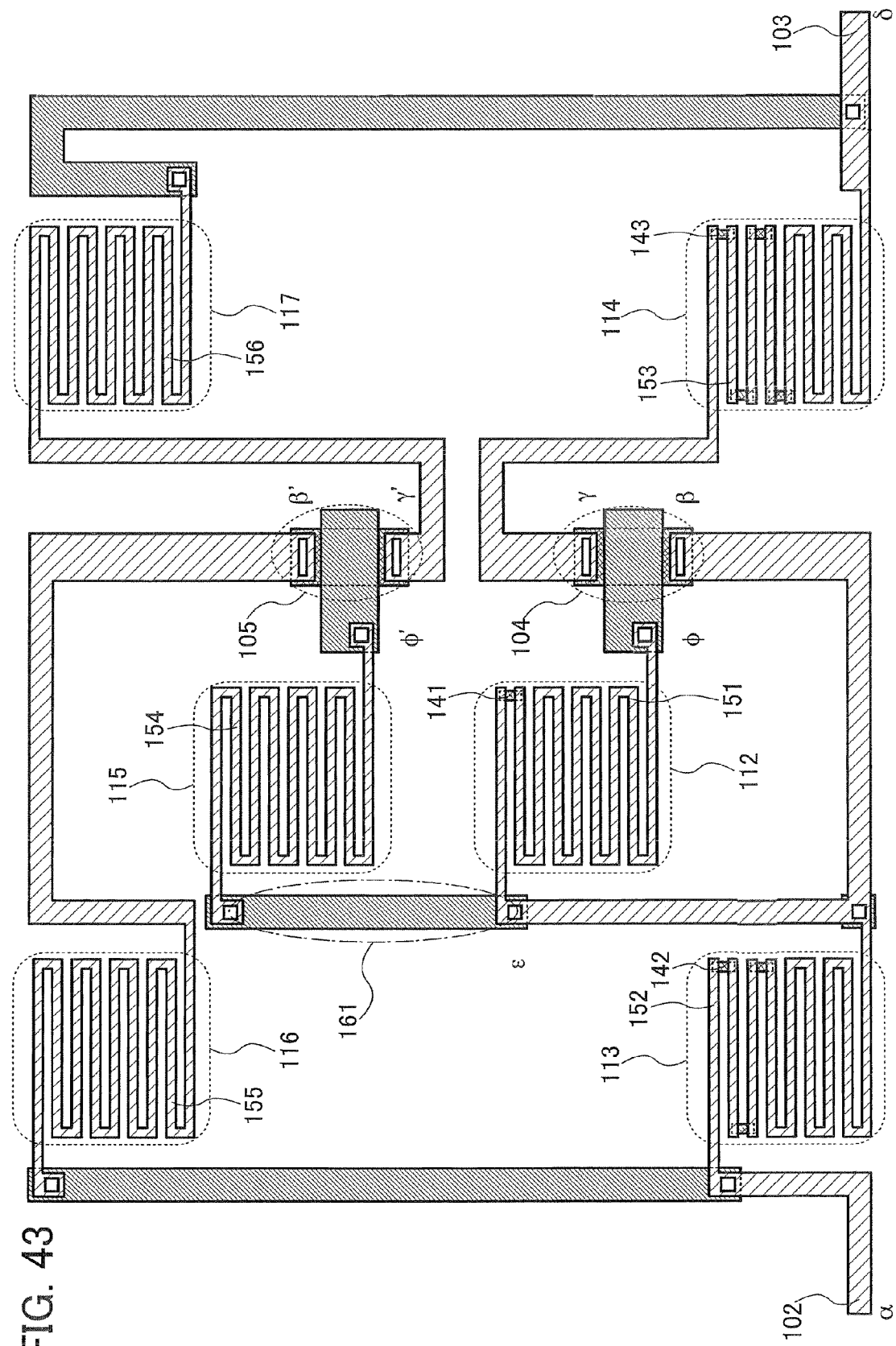
FIG. 43 is a top view of a semiconductor device of the present invention.
Figure 44:
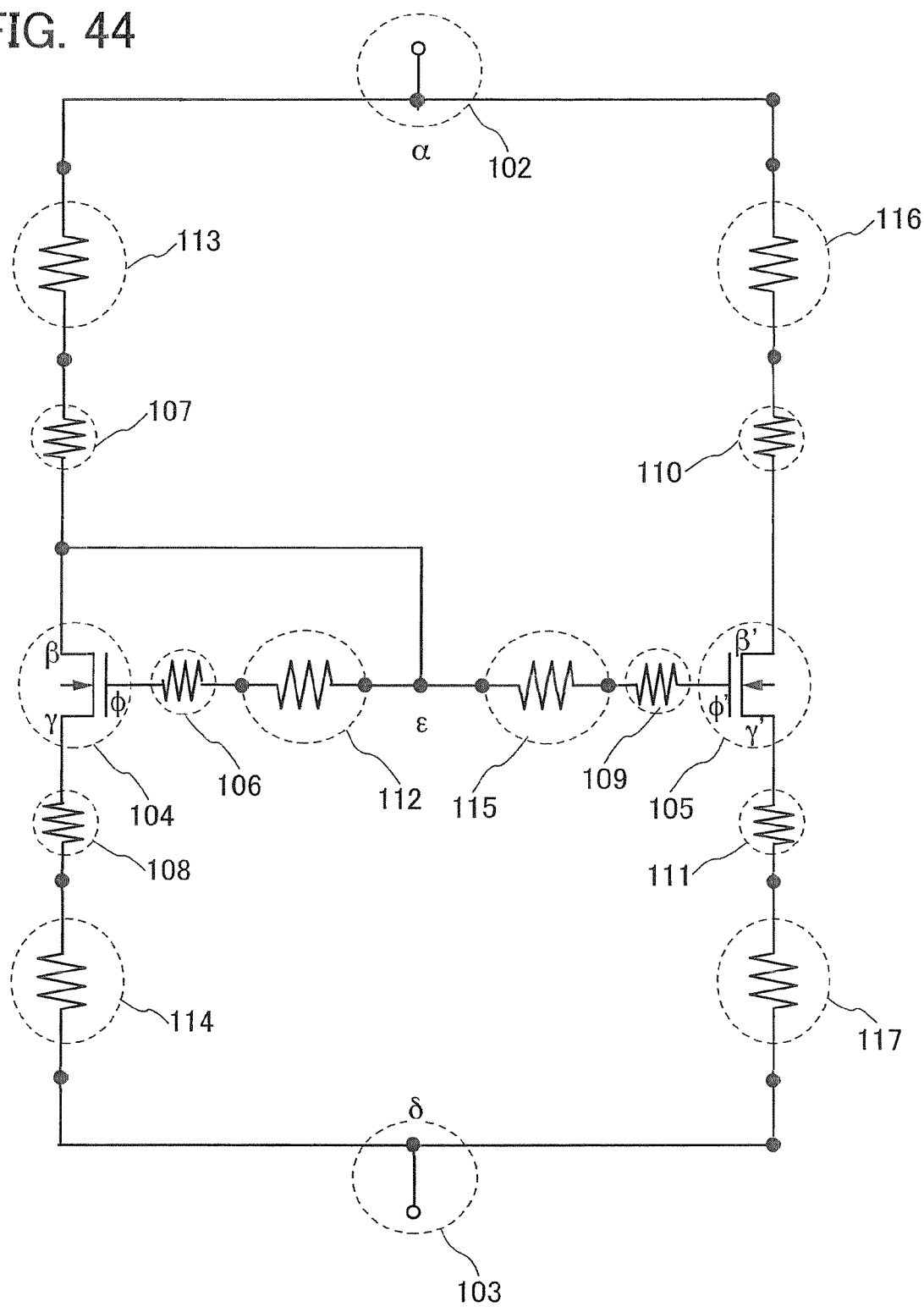
FIG. 44 is a circuit diagram of a semiconductor device of the present invention.

FIG. 44 shows the circuit diagram of the terminal 102, the terminal 103, the TFT 104, the TFT 105, and the resistors 112 to 117 in FIG. 1, and FIG. 43 shows a top view of FIG. 44. Note that the same portions as in FIG. 1 are denoted by the same reference numerals.

In FIGS. 43 and 44, the terminal 102 is denoted by α; the drain terminal of the TFT 104, β; the source terminal of the TFT 104, γ; the gate electrode of the TFT 104, φ; the drain terminal of the TFT 105, β'; the source terminal of the TFT 105, γ'; the gate electrode of the TFT 105, φ'; the terminal 103, δ; and the contact point of the resistors 112 and 115, ε.

The resistors 112 to 117 in FIG. 43 correspond to the resistors in FIG. 10 and FIG. 14A. Wirings 141, 142, and 143 are each formed of the same material and in the same process as source or drain regions of each TFT. Wirings 151 to 156 are each formed of the same material and in the same process as the source or drain electrodes.

As shown in FIG. 43, the number of wirings (the wirings 141, 142, and 143) which are formed of the same material as the source or drain regions of each TFT is different among the resistors 112 to 117. This is because each resistance of the parasitic resistors 106 to 111 is different.

Specifically, for example, the wiring 141 is formed in the resistor 112; however, the wiring formed of the same material as source or drain regions is not formed in the resistor 115. When the wiring is formed of the same material as the source or drain regions, the resistance is increased by the resistance of the wiring 141; therefore, the balance of the resistance is kept by the number of the wirings formed of the same material as the source or drain regions.

In other words, the value obtained by addition of the resistance of the parasitic resistor 106 and the resistor 112 between φ-ε has to be substantially the same as the resistance of the parasitic resistor 109 and the resistor 115 between φ'-ε. At that time, since the parasitic resistor 109 between φ'-ε has higher resistance than that of the parasitic resistor 106 between φ-ε by the resistance of the wiring 161, the wiring 141 is formed in the resistor 112 to adjust the resistance.

Accordingly, it is possible to adjust the resistance by the change of the structure in each of the resistors 112 to 117.

It is important that, in the present invention, the resistance among α-β-γ-δ be substantially the same as the resistance among α-β'-γ'-δ, and the resistance between φ-ε be substantially to the same as the resistance between φ'-ε in order to stably operate the current mirror circuit 122.

It is needless to say that, although the structures of FIG. 10 and FIG. 14A are employed in FIGS. 43 and 44, the resistors having the structures in FIG. 6, FIG. 7, FIG. 8, FIG. 9, FIG. 11, FIGS. 12A and 12B, FIGS. 13A, 13B, and FIG. 14B may also be used.

Note that this embodiment mode can also be combined with any description in embodiments, if necessary.

Embodiment 1

A case of applying this embodiment to a semiconductor device including a photoelectric conversion device will be explained with reference to FIGS. 15, 16, FIGS. 17A to 17C, FIGS. 18A to 18C, FIGS. 19A and 19B, FIGS. 20A to 20C, and FIG. 32. Note that the same portions as explained in embodiment mode are denoted by the same reference numerals.

First, an element is formed over a substrate (a first substrate 210). Here, AN 100 which is one of glass substrates is used for the substrate 210.

Next, a silicon oxide film containing nitrogen (100 nm thick) to be a base insulating film 212 is formed by a plasma CVD method, and further, without being exposed to the atmosphere, a semiconductor film, for example, an amorphous silicon film containing hydrogen (54 nm thick) is formed to be stacked. In addition, the base insulating film 212 may also be formed using the stack of a silicon oxide film, a silicon nitride film, and a silicon oxide film containing nitrogen. For example, as the base insulating film 212, a film may also be formed where a silicon nitride film containing oxygen of 50 nm thick, and further, a silicon oxide film containing nitrogen of 100 nm thick are stacked. Note that the silicon oxide film containing nitrogen or the silicon nitride film serves as a blocking layer that prevents an impurity such as an alkaline metal from diffusing from the glass substrate.

Then, the amorphous silicon film is crystallized by a solid phase growth method, a laser crystallization method, a crystallization method using catalytic metal, or the like to form a semiconductor film having a crystal structure (a crystalline semiconductor film), for example, a polycrystalline silicon film. Here, a polycrystalline silicon film is obtained by a crystallization method using a catalytic element. A solution containing 10 ppm of nickel in weight conversion is added to the surface of the amorphous silicon film using a spinner. Note that a method in which a nickel element is diffused over the entire surface by a sputtering method may also be used instead of the addition method with a spinner. Then, heat treatment is performed and crystallization is performed to form a semiconductor film having a crystal structure (here, a polycrystalline silicon film). Here, after heat treatment (at 500° C. for an hour), heat treatment for crystallization (at 550° C. for 4 hours) is performed to obtain a polycrystalline silicon film.

Subsequently, an oxide film over the surface of the polycrystalline silicon film is removed by a dilute hydrofluoric acid or the like. Thereafter, laser beam irradiation for increasing a degree of crystallization and repairing a defect left in the crystal grain is performed.

Note that the following laser irradiation method may also be employed in a case where a crystalline semiconductor film is obtained by crystallization of an amorphous silicon film by a laser crystallization method or in a case where laser irradiation is performed to repair a defect left in the crystal grain after a semiconductor film having a crystal structure is obtained.

A continuous wave laser beam (CW laser beam) or a pulsed wave laser beam (pulsed laser beam) can be used for the laser irradiation. As the laser beam that can be used here, a beam emitted from one or more of a gas laser such as an Ar laser, a Kr laser, or an excimer laser; a laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser can be used. A crystal with a large grain size can be obtained by irradiation of a laser beam having a fundamental wave of such lasers or one of second, third, and fourth harmonic of the fundamental wave. For example, the second harmonic (532 nm) or the third harmonic (355 nm) of an Nd:YVO$_4$ laser (fundamental wave of 1064 nm) can be used. In this case, the power density of approximately 0.01 to 100 MW/cm$^2$ (preferably, 0.1 to 10 MW/cm$^2$) is required for a laser. The scanning speed is set at approximately 10 to 2000 cm/sec for the irradiation.

Note that a laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; a Kr ion laser; or a Ti: sapphire laser can be continuously oscillated. Further, pulse oscillation thereof can be performed with a repetition rate of 10 MHz or more by performing of Q switch operation or mode synchronization. When a laser beam is oscillated with a repetition rate of 10 MHz or more, a semiconductor film is irradiated with a next pulse during the semiconductor film is melted by the laser beam and solidified. Therefore, unlike in a case of using a pulsed laser with a low repetition rate, a solid-liquid interface can be continuously moved in the semiconductor film so that crystal grains, which continuously grow toward a scanning direction, can be obtained.

When ceramic (polycrystal) is used as a medium, the medium can be formed to have a free shape in a short time at low cost. When a single crystal is used, a columnar medium with several mm in diameter and several tens of mm in length is usually used. In the case of using the ceramic, a medium bigger than the case of using the single crystal can be formed.

A concentration of a dopant such as Nd or Yb in a medium, which directly contributes to light emission, cannot be changed largely in both cases of the single crystal and the polycrystal; therefore, there is a limitation to some extent in improvement in output of a laser by increase in concentration. However, in the case of the ceramics, the size of the medium can be significantly increased as compared with the case of the single crystal; therefore, there is a possibility that the output is improved drastically.

Further, in the case of the ceramic, a medium with a parallel six-hedron shape or a cuboid shape can be easily formed. In a case of using a medium having such a shape, when oscillated light is made to travel in a zigzag inside the medium, a long path of the oscillated light can be obtained. Therefore, amplitude is increased and a laser beam can be oscillated at high output. Moreover, since a cross-sectional shape of a laser beam, which is emitted from a medium having such a shape, is a quadrangular shape, as compared with a laser beam with a circular shape, the laser beam with the quadrangular shape in cross section have an advantage to be shaped into a linear beam. By shaping of a laser beam emitted in the above manner using an optical system, a linear beam with 1 mm or less in length of a short side and several mm to several m in length of a long side can be easily obtained. Further, when a medium is uniformly irradiated with excited light, a linear beam is emitted with an uniform energy distribution in a long side direction.

When a semiconductor film is irradiated with such a linear beam, an entire surface of the semiconductor film can be uniformly annealed. When uniform annealing is required from one end to the other end of the linear beam, an ingenuity in which slits are disposed on the both ends of the linear beam so as to shield an attenuated portion of energy from light, or the like is required.

In a case where the laser irradiation is performed in the atmosphere or an oxygen atmosphere, an oxide film is formed over the surface by laser beam irradiation.

Next, in addition to the oxide film formed by the laser beam irradiation, a barrier layer formed of an oxide film having a thickness of 1 to 5 nm in total is formed by treatment of the surface with ozone water for 120 seconds. The barrier layer is formed in order to remove a catalyst element, which is added for crystallization, for example, nickel (Ni) from the film. Although the barrier layer is formed using ozone water here, a barrier layer may also be formed by deposition of an oxide film having a thickness of approximately 1 to 10 nm using a method for oxidizing a surface of a semiconductor film having a crystal structure by UV-ray irradiation under an oxygen atmosphere; a method for oxidizing a surface of a semiconductor film having a crystal structure by oxygen plasma treatment; a plasma CVD method; a sputtering method; an evaporation method; or the like. In addition, before the barrier layer is formed, the oxide film formed by laser beam irradiation may also be removed.

Then, over the barrier layer, an amorphous silicon film containing argon is formed to have a thickness of 10 to 400 nm, for example 100 nm here, by a sputtering method to serve as a gettering site. Here, the amorphous silicon film containing argon is formed under an atmosphere containing argon using a silicon target. When a plasma CVD method is used to form the amorphous silicon film containing argon, the deposition condition is as follows: a flow ratio of monosilane to argon ($SiH_4$:Ar) is set at 1:99; a deposition pressure, 6.665 Pa; a RF power density, 0.087 W/cm$^2$; and a deposition temperature, 350° C.

Thereafter, a furnace heated at 650° C. is used for heat treatment for three minutes to remove a catalyst element (gettering). By this treatment, the catalyst element concentration in the semiconductor film having a crystal structure is reduced. A lamp annealing apparatus may also be used instead of the furnace.

Subsequently, the amorphous silicon film containing an argon element, which is a gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering; thus, it is desirable that the barrier layer made of the oxide film be removed after gettering.

Note that, when crystallization of a semiconductor film using a catalytic element is not performed, the above steps such as the formation of the barrier layer, the formation of the gettering site, the heat treatment for gettering, the removal of the gettering site, and the removal of the barrier layer are not required.

Next, after a thin oxide film is formed with ozone water over the surface of the obtained semiconductor film having a crystal structure (for example, a crystalline silicon film), a mask made of resist is formed using a first photomask, and etching treatment is performed to obtain a desired shape, thereby forming semiconductor films 231 and 232 separated in island shapes (referred to as an "island-shaped semiconductor region" in this specification) (see FIG. 17A). After the island-shaped semiconductor regions are formed, the mask made of resist is removed.

Then, if necessary, doping of the minute amount of an impurity element (boron or phosphorus) is performed to control the threshold value of a TFT. Here, an ion doping method is used, in which diborane ($B_2H_6$) is not separated by mass but excited by plasma.

Subsequently, the oxide film is removed with an etchant containing hydrofluoric acid, and at the same time, the surfaces of the island-shaped semiconductor regions 231 and 232 are washed. Thereafter, an insulating film containing silicon as its main component, which is to serve as a gate insulating film 213, is formed. Here, a silicon oxide film containing nitrogen (composition ratio: Si=32%, O=59%, N=7%, and H=2%) is formed to have a thickness of 115 nm by a plasma CVD method.

Next, after a metal film is formed over the gate insulating film 213, a second photomask is used to form gate electrodes 234 and 235, wirings 214 and 215, and a terminal electrode 250. In this embodiment, resistors similar to those in FIG. 6 are formed; therefore, wirings 400, 410, 420, 430, 440, and 450 are formed at the same time as the gate electrode 234 and the like (see FIG. 17B).

In addition, as the gate electrodes 234 and 235, the wirings 214 and 215, the terminal electrode 250, and the wirings 400, 410, 420, 430, 440, and 450, a single-layer film formed of an element of titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), and copper (Cu) or an alloy material or a compound material containing the element as its main component; or a single-layer film formed of a nitride thereof, for example, titanium nitride, tungsten nitride, tantalum nitride, or molybdenum nitride can be used.

Moreover, a stacked-layer film may also be used instead of the above single-layer film. For example, as the gate electrodes 234 and 235, the wirings 214 and 215, the terminal electrode 250, and the wirings 400, 410, 420, 430, 440, and 450, a film may also be used where tantalum nitride (TaN) and tungsten (W) of 30 nm and 370 nm thick, respectively, are stacked.

Next, an impurity imparting one conductivity type is introduced to the island-shaped semiconductor regions 231 and 232 to form source or drain regions 237 of a TFT 105 and source or drain regions 238 of a TFT 104. An n-channel TFT is formed in this embodiment; therefore, an n-type impurity, for example, phosphorus (P) or arsenic (As) is introduced to the island-shaped semiconductor regions 231 and 232 (see FIG. 17C).

Then, after a first interlayer insulating film including a silicon oxide film (not shown) is formed in 50 nm thick by a CVD method, a step for activation treatment of an impurity element added to each island-shaped semiconductor region is performed. The activation step is performed by a rapid thermal annealing method (RTA method) using a lamp light source, an irradiation method of a YAG laser or an excimer laser from the back side, heat treatment using a furnace, or a method which is a combined with any one of the above methods.

Subsequently, a second interlayer insulating film 216 including a silicon nitride film containing hydrogen and oxygen is formed in, for example, 10 nm thick.

Next, a third interlayer insulating film 217 formed of an insulator material is formed over the second interlayer insulating film 216 (see FIG. 18A). An insulating film obtained by a CVD method can be used for the third interlayer insulating film 217. In this embodiment, in order to improve adhesiveness, a silicon oxide film containing nitrogen is formed in 900 nm thick as the third interlayer insulating film 217.

Then, heat treatment (heat treatment at temperatures of 300 to 550° C. for 1 to 12 hours, for example, at 410° C. for one hour in a nitrogen atmosphere) is performed to hydrogenate the island-shaped semiconductor films. This step is performed to terminate a dangling bond in the island-shaped semiconductor films by hydrogen contained in the second interlayer insulating film 216. The island-shaped semiconductor films can be hydrogenated regardless of whether the gate insulating film 213 is formed.

In addition, as the third interlayer insulating film 217, an insulating film using siloxane and a stacked structure thereof can also be used. Siloxane is composed by a skeleton structure of a bond of silicon (Si) and oxygen (O). As a substituent, a compound containing at least hydrogen (for example, an alkyl group or an aryl group) is used. Fluorine may also be used as the substituent. Moreover, a compound containing at least hydrogen and fluorine may also be used as the substituent.

When an insulating film using siloxane and a stacked structure thereof are used as the third interlayer insulating film 217, after the second interlayer insulating film 216 is formed, heat treatment for hydrogenating the island-shaped semiconductor films can be performed, and then, the third interlayer insulating film 217 can also be formed.

Next, a mask made of resist is formed using a third photomask, and the first interlayer insulating film, the second interlayer insulating film 216, and the third interlayer insulating film 217, or the gate insulating film 213 are selectively etched to form contact holes. Then, the mask made of resist is removed.

Note that the third interlayer insulating film 217 may be formed, if necessary. When the third interlayer insulating film 217 is not formed, after the second interlayer insulating film 216 is formed, the first interlayer insulating film, the second interlayer insulating film 216, and the gate insulating film 213 are selectively etched to form contact holes.

Then, after a metal stacked film is need by a sputtering method, a mask made of resist is faulted using a fourth photomask, and then, the metal film is selectively etched to form a wiring 284, a connection electrode 285, a terminal electrode 281, source or drain electrodes 282 of the TFT 104, and source or drain electrodes 283 of the TFT 105. In this embodiment, resistors similar to those in FIG. 6 are formed; therefore, wirings 401, 411, 421, 431, 441, and 451 are formed at the same time as the source or drain electrodes 282 and the like. Then, the mask made of resist is removed (see FIG. 18B).

In FIG. 18B, the wiring 284, the connection electrode 285, the terminal electrode 281, the source or drain electrodes 282 of the TFT 104, the source or drain electrodes 283 of the TFT 105, and the wirings 401, 411, 421, 431, 441, and 451 are each formed of a single-layer conductive film.

As such a single-layer film, a titanium film (Ti film) is preferable in terms of heat resistance, conductivity, and the like. Instead of the titanium film, a single-layer film formed of an element of tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt) or an alloy material or a compound material containing the element as its main component; or a single-layer film formed of a nitride thereof, for example, titanium nitride, tungsten nitride, tantalum nitride, or molybdenum nitride can be used. The number of deposition can be reduced in the manufacturing process by formation of the following components into a single-layer film: the wiring 284, the connection electrode 285, the terminal electrode 281, the source or drain electrodes 282 of the TFT 104, the source or drain electrodes 283 of the TFT 105, and the wirings 401, 411, 421, 431, 441, and 451.

In addition, FIG. 18C shows a case where a wiring 219, a connection electrode 220, a terminal electrode 251, source or drain electrodes 241 of the TFT 104, and source or drain electrodes 242 of the TFT 105 are each provided with a protective electrode. In FIG. 18C, wirings 401, 411, 421, 431, 441, and 451 are each formed of a stacked-layer film of the material which is formed at the same time as the source or drain electrodes 241 and the like and the material which is formed at the same time as the protective electrode.

First, lower conductive films of the wiring 219, the connection electrode 220, the terminal electrode 251, the source or drain electrodes 241 of the TFT 104, the source or drain electrodes 242 of the TFT 105, and the wirings 401, 411, 421, 431, 441, and 451 each have a stacked-layer structure of a refractory metal film and a low-resistant metal film (an aluminum alloy, pure aluminum, or the like). Here, the low conductive film of the wiring 219, the source or drain electrodes 241 and 242, and the wirings 401, 411, 421, 431, 441, and 451 each have a three-layer structure where a titanium film (Ti film), an aluminum film (Al film), and a Ti film are sequentially stacked.

Further, protective electrodes 218, 245, 248, 246, and 247 are formed so as to cover the wiring 219, the connection electrode 220, the terminal electrode 251, the source or drain electrodes 241 of the TFT 104, and the source or drain electrodes 242 of the TFT 105, respectively. In addition, upper conductive films of the wirings 401, 411, 421, 431, 441, and 451 are formed at the same time as the protective electrodes 218 and the like.

In etching a photoelectric conversion layer 100, the wiring 219 is protected by the protective electrode 218 covering the wiring 219. A material for the protective electrode 218 is preferably a conductive material of which etching rate is lower than that of the photoelectric conversion layer 100 with respect to an etching gas (or an etchant) used for etching the photoelectric conversion layer 100. Additionally, a material for the protective electrode 218 is preferably a conductive material which does not react with the photoelectric conversion layer 100 to be an alloy. The upper conductive films of the other protective electrodes 245, 248, 246, and 247, and the wirings 401, 411, 421, 431, 441, and 451 are each also formed of a material and in a manufacturing process similar to the protective electrode 218.

For example, a conductive metal film (such as titanium (Ti) or molybdenum (Mo)) is formed, which is unlikely to be an alloy by being reacted with a photoelectric conversion layer (typically, amorphous silicon) which will be subsequently formed. Thereafter, a mask made of resist is formed using a fifth photomask and the conductive metal film is selectively etched so that the protective electrode 218 covering the wiring 284 is formed. Here, a Ti film of 200 nm thick that can be obtained by a sputtering method is used. Note that lower conductive films of the connection electrode 285, the terminal electrode 281, the source or drain electrodes 282 of the TFT 104, the source or drain electrodes 283 of the TFT 105, and the wirings 401, 411, 421, 431, 441, and 451 are covered with the conductive metal film as well, and the upper conductive films of the protective electrodes 245, 248, 246, and 247, and the wirings 401, 411, 421, 431, 441, and 451 are formed. Thus, the conductive metal film covers also the side faces where the second-layer Al films of these electrodes are exposed; therefore, the conductive metal film can prevent an aluminum atom from dispersing into the photoelectric conversion layer.

Next, a photoelectric conversion layer 100 including a p-type semiconductor layer 100p, an i-type semiconductor layer 100i, and an n-type semiconductor layer 100n is formed over the third interlayer insulating film 217.

As for the p-type semiconductor layer 100p, an amorphous silicon film containing an impurity element belonging to Group 13, for example, boron (B) may be formed by a plasma CVD method.

In FIG. 19A, the wiring 284 is electrically connected to the lowest layer of the photoelectric conversion layer 100, in this embodiment, the p-type semiconductor layer 100p.

In the case of forming the protective electrodes, the wiring 284 and the protective electrode 218 are electrically connected to the lowest layer of the photoelectric conversion layer 100, in this embodiment, the p-type semiconductor layer 100p.

After the p-type semiconductor layer 100p is formed, further, the i-type semiconductor layer 100i and the n-type semiconductor layer 100n are sequentially formed. Accordingly, the photoelectric conversion layer 100 including the p-type semiconductor layer 100p, the i-type semiconductor layer 100i, and the n-type semiconductor layer 100n is formed.

As for the i-type semiconductor layer 100i, an amorphous silicon film may be formed by a plasma CVD method, for example. As for the n-type semiconductor layer 100n, an amorphous silicon film containing an impurity element belonging to Group 15, for example, phosphorus (P) may also be formed, or after an amorphous silicon film is formed, an impurity element belonging to Group 15 may also be introduced.

In addition, as for the p-type semiconductor layer 100p, the i-type semiconductor layer 100i, and the n-type semiconductor layer 100n, a semi-amorphous semiconductor film may also be used as well as the amorphous semiconductor film.

Next, a sealing layer 224 formed of an insulator material (for example, an inorganic insulating film containing silicon) is formed to have a thickness of 1 to 30 μm over the entire surface, and a state of FIG. 19A is obtained. Here, a silicon oxide film containing nitrogen of 1 μm thick is formed by a CVD method as the insulator material film. The adhesiveness can be improved with the use of the insulating film formed by a CVD method.

Then, after the sealing layer 224 is etched to provide an opening, terminal electrodes 221 and 222 are formed by a sputtering method. The terminal electrodes 221 and 222 are formed of a stacked-layer film of a titanium film (Ti film, 100 nm), a nickel film (Ni film, 300 nm), and a gold film (Au film, 50 nm). The fixing intensity of the terminal electrodes 221 and 222 obtained as described above is more than 5N, which is sufficient fixing intensity for a terminal electrode.

In the above steps, the terminal electrodes 221 and 222 that can be connected with solder are formed, and a structure shown in FIG. 19B is obtained.

Subsequently, a plurality of light sensor chips is cut out by cutting of the substrate into individual pieces. A large number of light sensor chips (2 mm×1.5 mm) can be manufactured from one large-sized substrate (for example, 600 cm×720 cm).

Figure 20A:
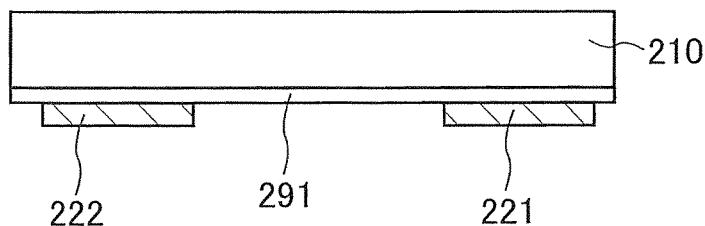
FIGS. 20A to 20C are views each showing a manufacturing process of a semiconductor device of the present invention.
Figure 20B:
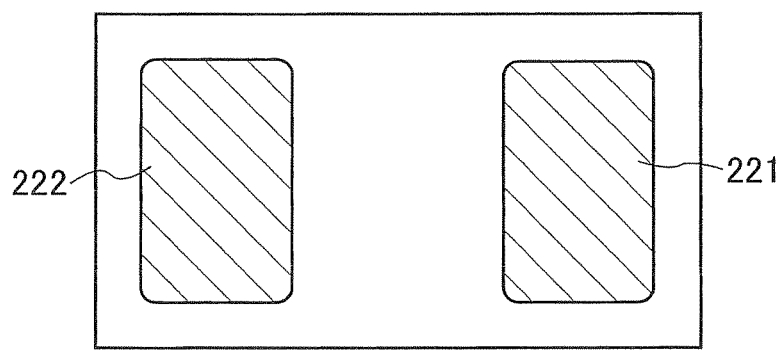
Figure 20C:
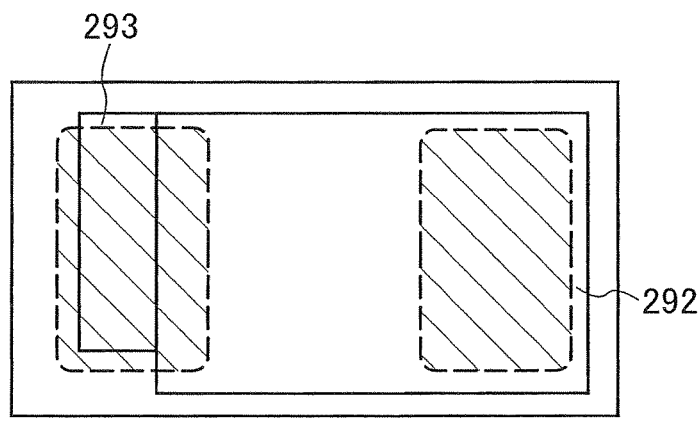
Figure 21:
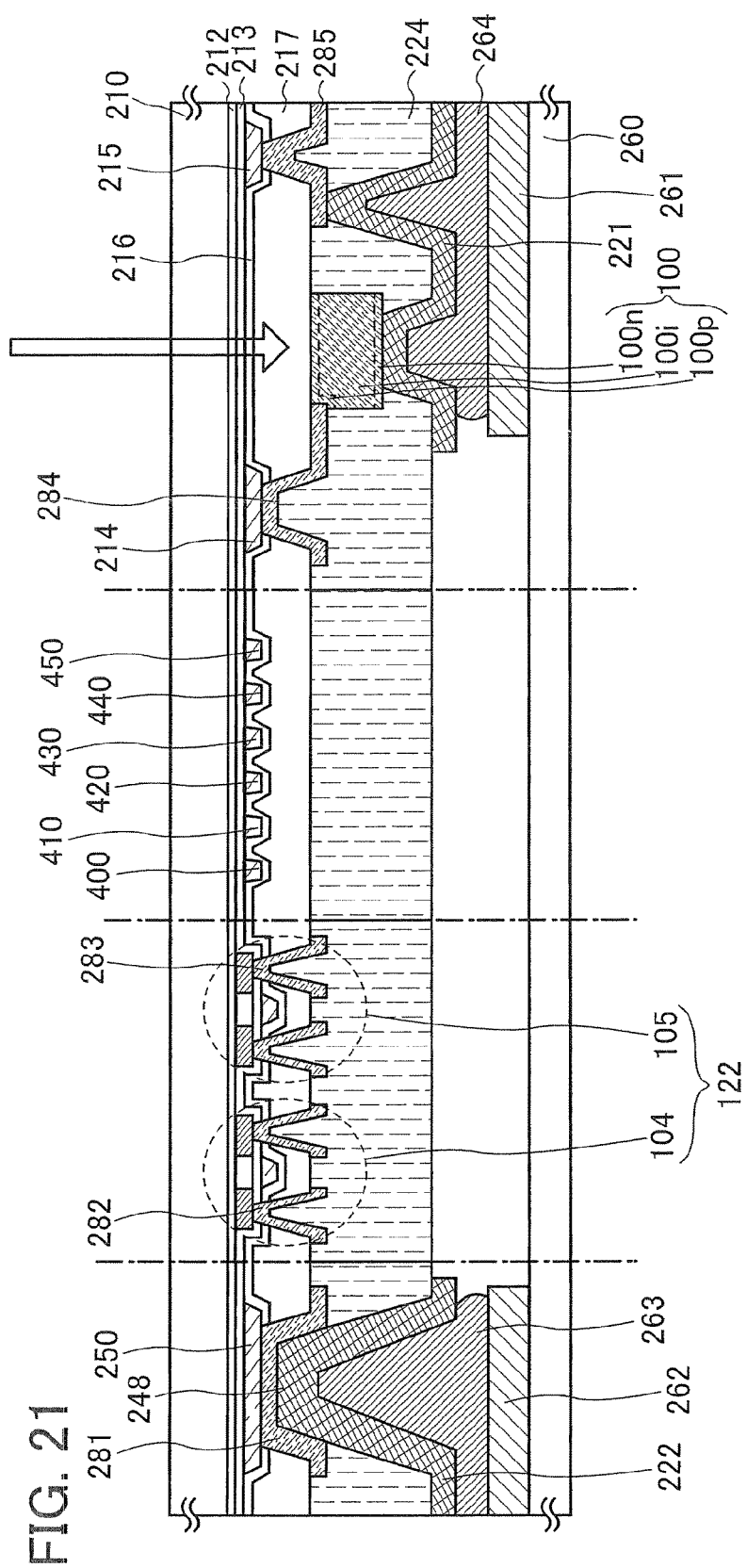
FIG. 21 is a cross-sectional view of a semiconductor device of the present invention.
Figure 22:
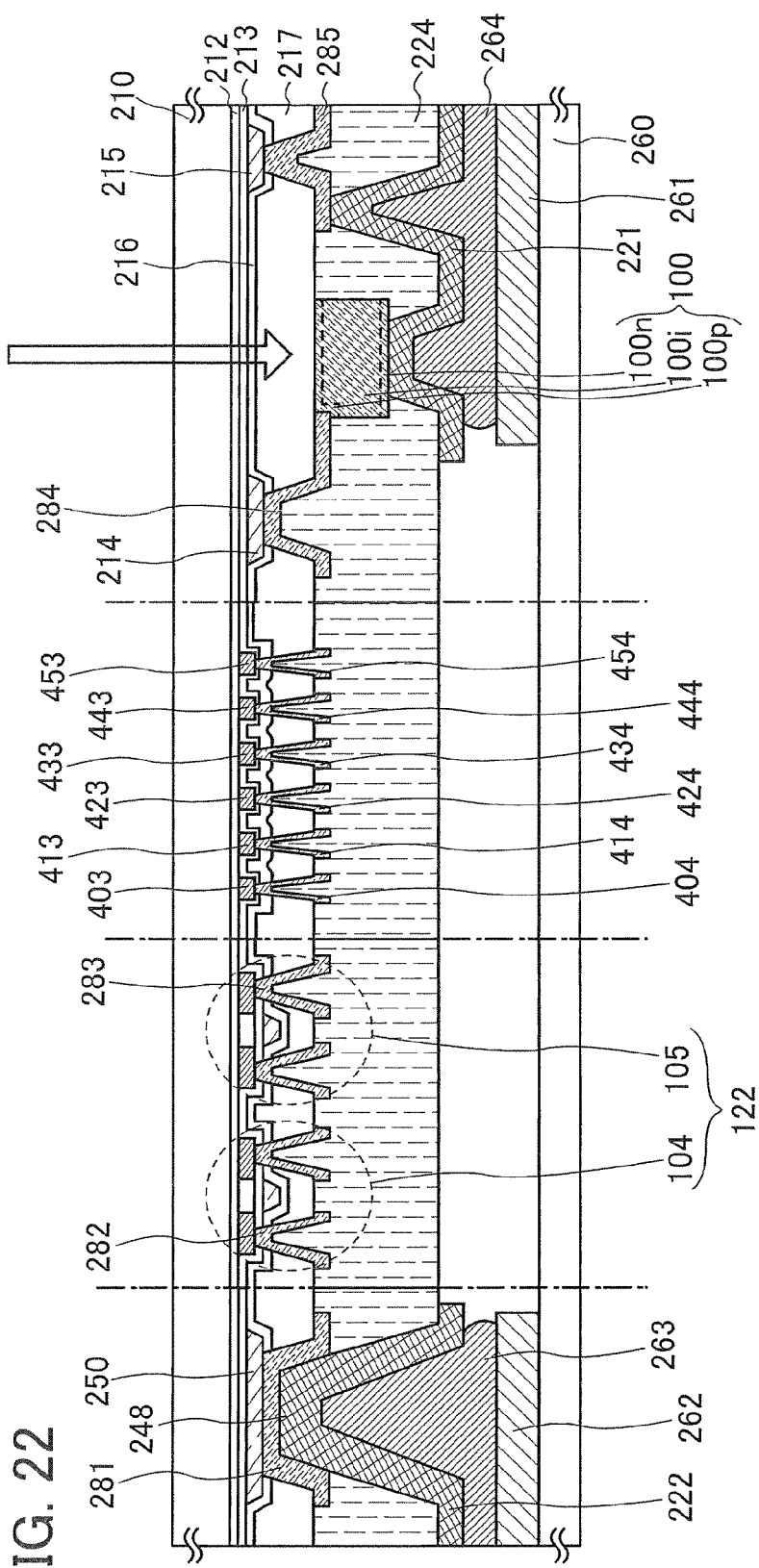
FIG. 22 is a cross-sectional view of a semiconductor device of the present invention.
Figure 23:
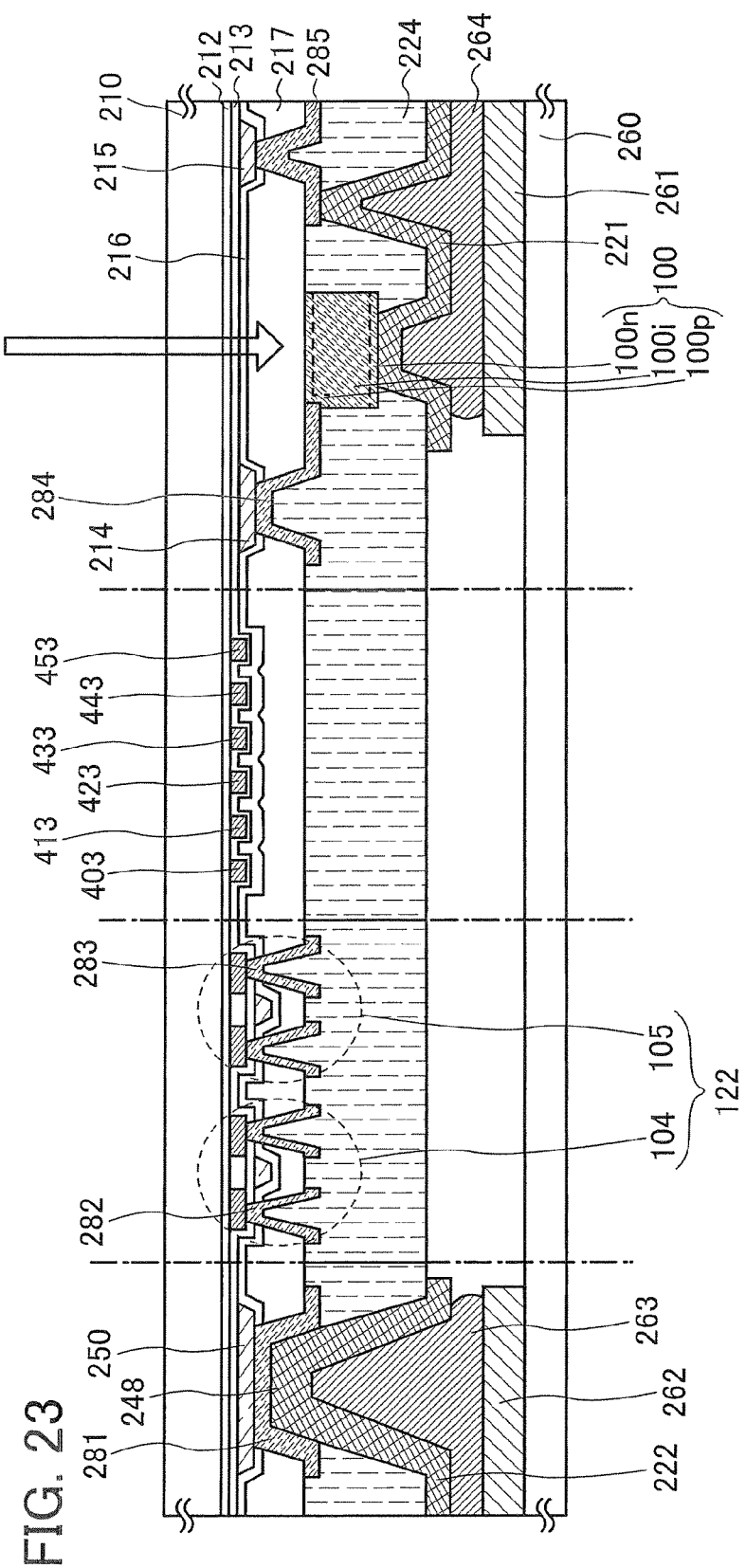
FIG. 23 is a cross-sectional view of a semiconductor device of the present invention.

FIG. 20A shows a cross-sectional view of one light sensor chip (2 mm×1.5 mm) that is cut out, FIG. 20B shows a bottom view thereof, and FIG. 20C shows a top view thereof. In FIGS. 20A to 20C, the same portions as in FIG. 15, FIG. 16, FIGS. 17A to 17C, FIGS. 18A to 18C, and FIGS. 19A and 19B are denoted by the same reference numerals. In FIG. 20A, a total thickness of the substrate 210, an element formation region 291, the terminal electrodes 221 and 222 is 0.8±0.05 mm.

In addition, in order to make the total thickness of the light sensor chip thinner, a plurality of light sensor chips may also be cut out by cutting of the substrate into individual pieces using a dicer after the substrate 210 is ground and thinned by CMP treatment or the like.

In FIG. 20B, the size of one electrode of the terminal electrodes 221 and 222 is 0.6 mm×1.1 mm, and the interval between the electrodes is 0.4 mm. In FIG. 20C, the area of a light receiving portion 292 is 1.57 mm². Moreover, an amplifier circuit portion 293 is provided with approximately 100 TFTs.

Finally, the obtained light sensor chip is mounted on the mounting side of the substrate 260. Solder 264 and 263 are used for connecting the terminal electrode 221 to the electrode 261, and the terminal electrode 222 to the electrode 262, respectively. The solder is formed in advance by a screen printing method or the like over the electrodes 261 and 262 of the substrate 260, and the solder and the terminal electrode are made in an abutted state to perform mounting by reflow soldering treatment. The reflow soldering treatment is performed, for example, at temperatures approximately 255 to 265° C. for about 10 seconds in an inert gas atmosphere. Moreover, as well as the solder, a bump formed of metal (such as gold or silver), a bump formed of a conductive resin, or the like can be used. Further, lead-free solder may also be used for mounting in consideration of an environmental problem.

As described above, it is possible to obtain a semiconductor device having a photoelectric conversion device including the photoelectric conversion layer 100, the current mirror circuit 122, and the resistors for compensating the parasitic resistors of the current mirror circuit 122.

Figure 15:
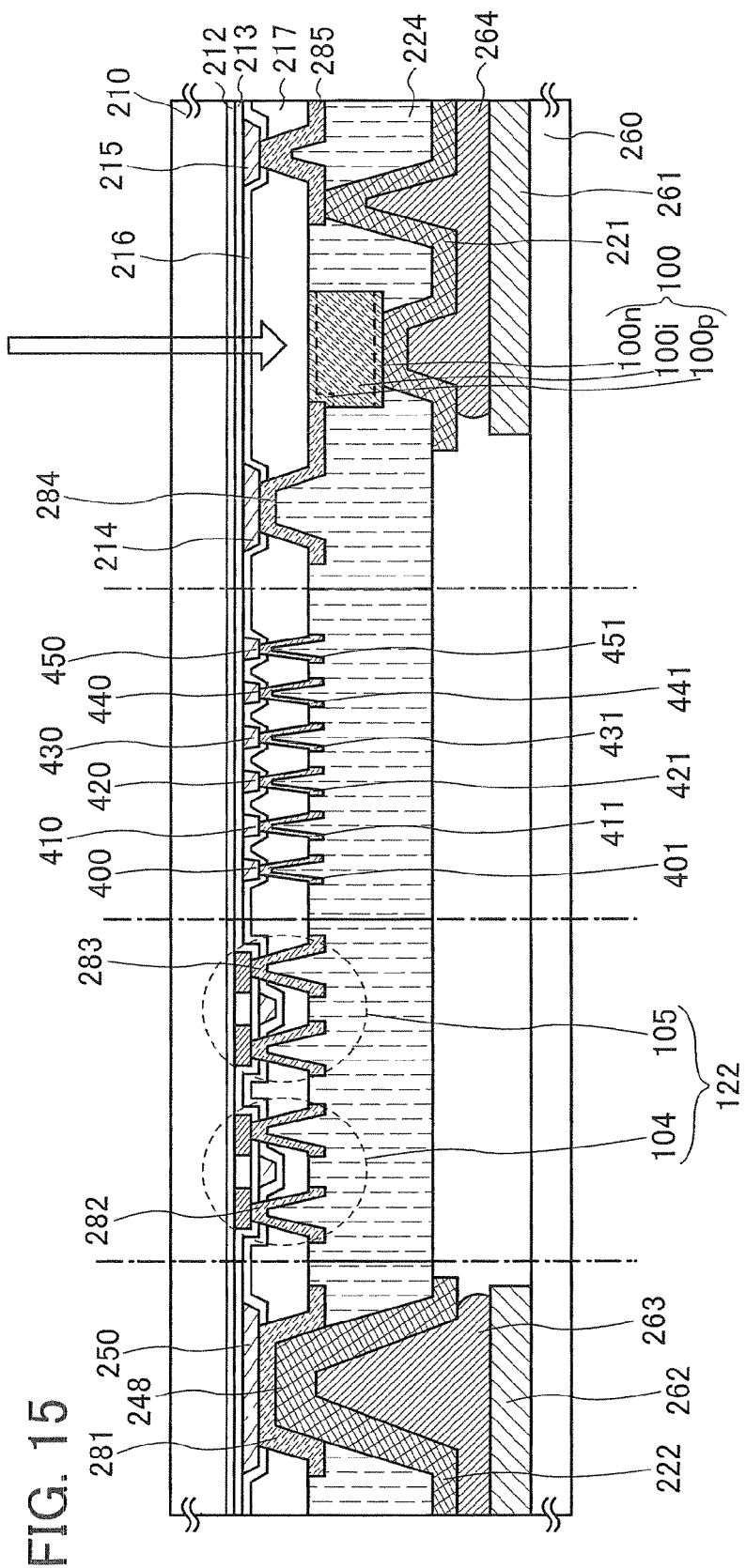
FIG. 15 is a cross-sectional view of a semiconductor device of the present invention.
Figure 32:
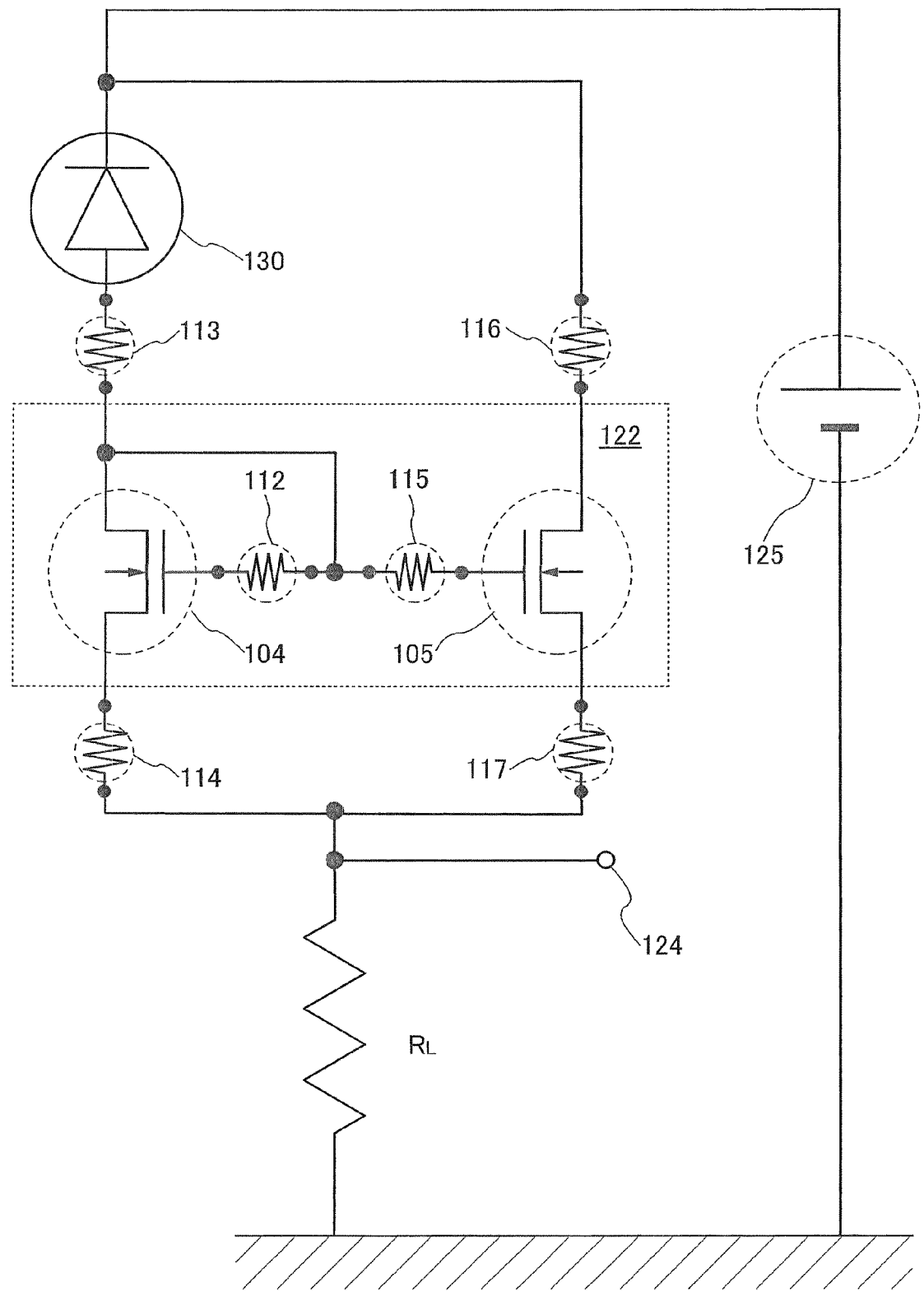
FIG. 32 is a circuit diagram of a semiconductor device of the present invention.

FIG. 32 shows a circuit diagram of this embodiment. The same portions as in FIG. 1 and FIG. 15 are denoted by the same reference numerals.

A photoelectric conversion device 130 has the photoelectric conversion layer 100. In addition, the compensation resistors 112 to 117 for compensating the parasitic resistors of the current mirror circuit 122 each correspond to any one of the combinations of pairs of wirings 400 and 401, wirings 410 and 411, wirings 420 and 421, wirings 430 and 431, wirings 440 and 441, and wirings 450 and 451.

In the semiconductor device of this embodiment, the resistors similar to those in FIG. 6 are used; however, the resistors shown in FIGS. 7 to 11 may also be used. FIGS. 21 to 25 each show an example of applying the resistors shown in FIGS. 7 to 11 to this embodiment. In FIGS. 21 to 25, the same portions as in FIGS. 6 to 11 are denoted by the same reference numerals.

Figure 24:
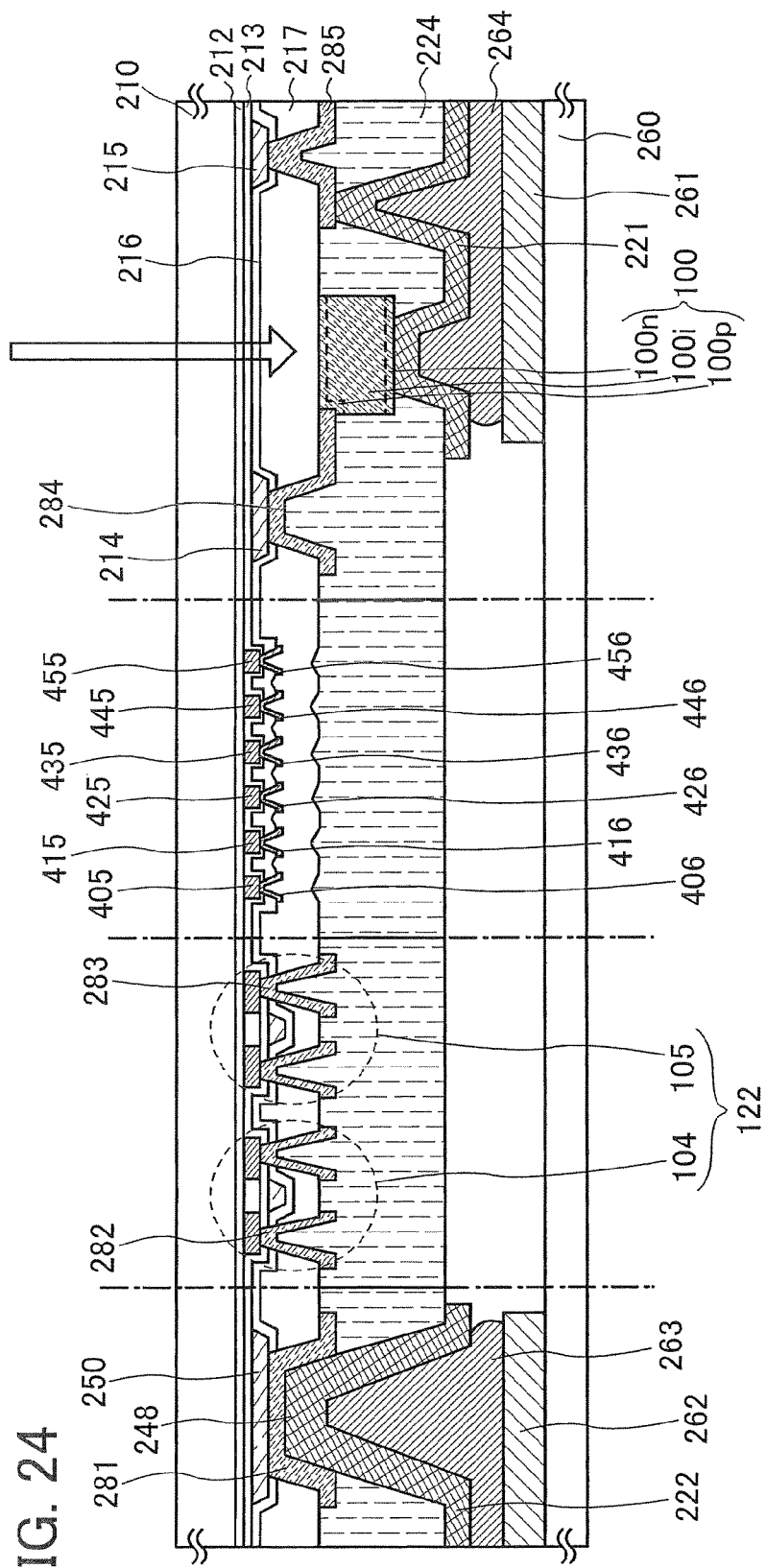
FIG. 24 is a cross-sectional view of a semiconductor device of the present invention.
Figure 25:
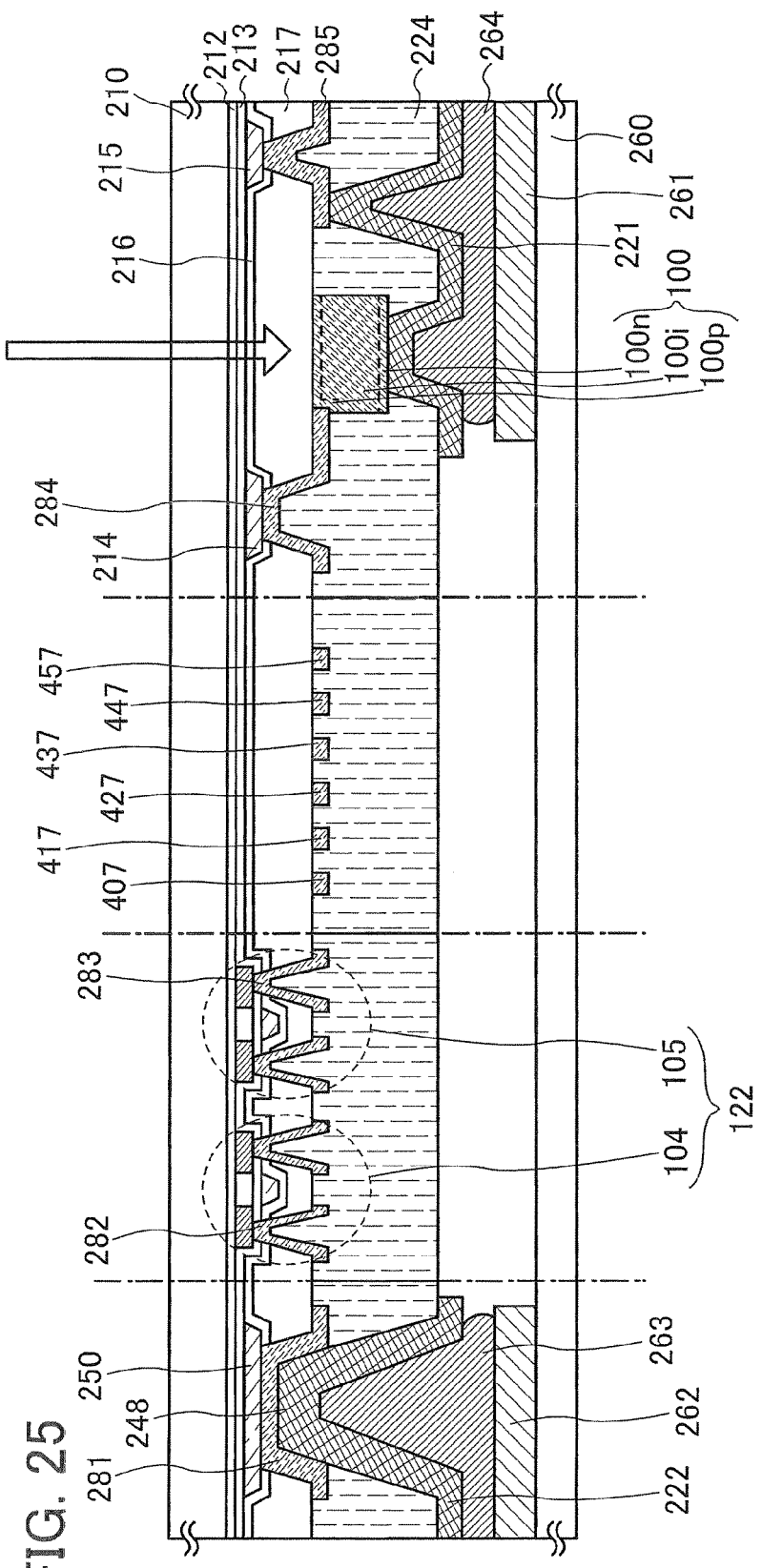
FIG. 25 is a cross-sectional view of a semiconductor device of the present invention.

For example, as shown in FIG. 24, in a case of employing the resistors shown in FIG. 10 (the pairs of the wirings 405 and 406, the wirings 415 and 416, the wirings 425 and 426, the wirings 435 and 436, the wirings 445 and 446, and the wirings 455 and 456) to this embodiment, at the time of forming the island-shaped semiconductor region 231 and the like shown in FIG. 17A, the wirings 405, 415, 425, 435, 445, and 455 are formed by formation of an island-shaped semiconductor region in a similar manner and introduction of an impurity imparting one conductivity type shown in FIG. 17C. Further, the wirings 406, 416, 426, 436, 446, and 456 may be formed at the same time as the gate electrode 234 and the like shown in FIG. 17B.

If necessary, the resistors shown in FIGS. 6 to 11, which have the different structures, may also be combined to form the resistors of this embodiment. In such a case, the material and the manufacturing process which are necessary for forming the resistors may be based on the above description.

Note that this embodiment can also be combined with any description in Embodiment Mode and other embodiments.

Embodiment 2

Figure 26:
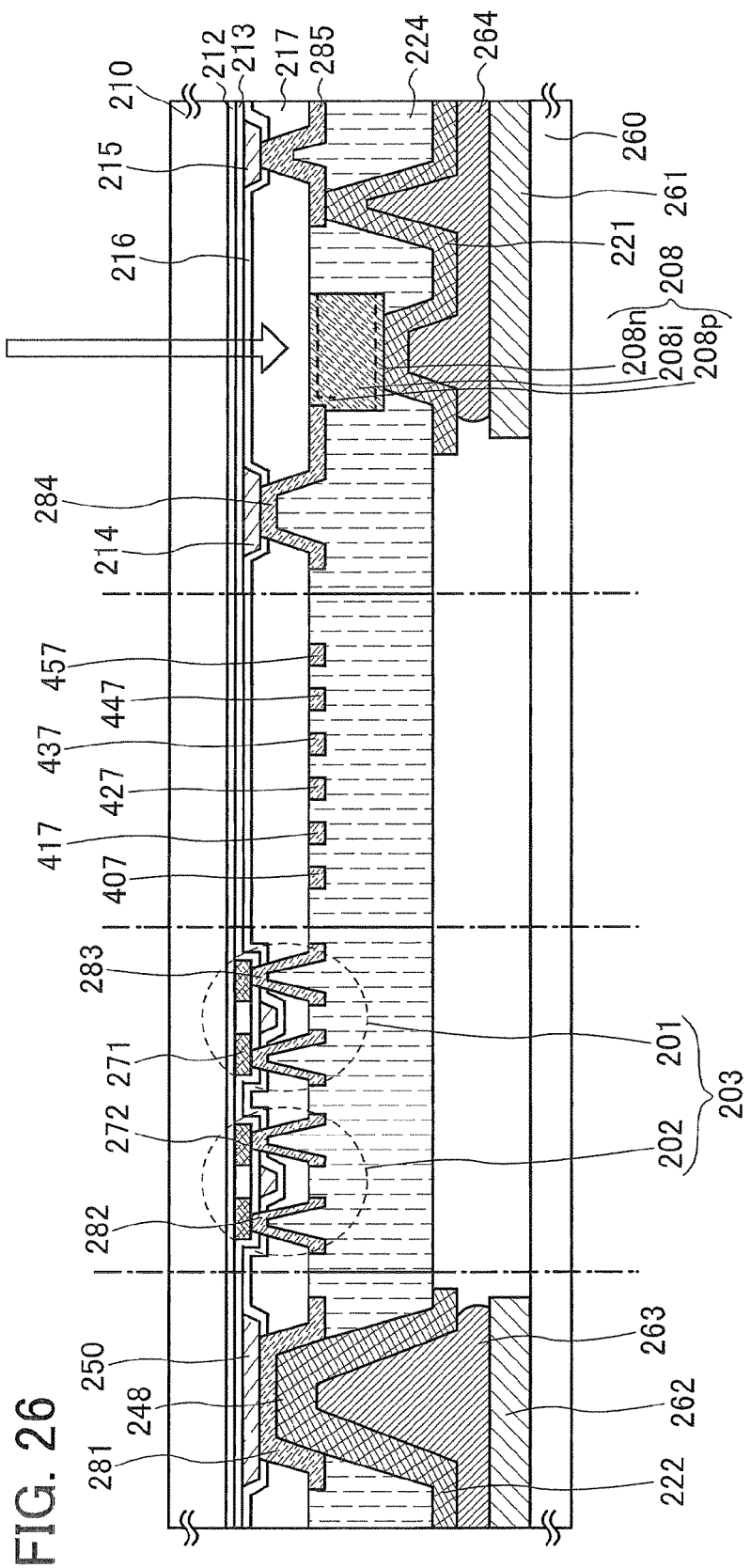
FIG. 26 is a cross-sectional view of a semiconductor device of the present invention.

This embodiment will explain an example of forming an amplifier circuit with a p-channel TFT with reference to FIG. 5 and FIG. 26. Note that the same portions as in Embodiment Mode and Embodiment 1 are denoted by the same reference numerals, and the same portions may be formed based on the manufacturing process described in Embodiment Mode and Embodiment 1.

This embodiment will show an example of applying the resistors shown in FIG. 11 to resistors for compensating parasitic resistors. However, this embodiment is not limited thereto and the resistors shown in FIGS. 6 to 10 may also be applied.

In a case where an amplifier circuit, for example, a current mirror circuit 203 is formed of p-channel TFTs 201 and 202, a p-type impurity, for example, boron (B) may be substituted for the impurity imparting one conductivity type to the island-shaped semiconductor region in Embodiment Mode and Embodiment 1.

FIG. 5 shows an equivalent circuit diagram of a light sensor of this embodiment in which the current mirror circuit 203 is formed of the p-channel TFTs 201 and 202, and FIG. 26 shows a cross-sectional view thereof.

In FIG. 5 and FIG. 26, terminal electrodes 221 and 222 are connected to a photoelectric conversion layer 208 and the p-channel TFTs 201 and 202, respectively. The p-channel TFT 201 is electrically connected to an electrode on an anode side of the photoelectric conversion layer 208. After an n-type semiconductor layer 208n, an i-type semiconductor layer 208i, and a p-type semiconductor layer 208p are sequentially stacked over a second electrode (electrode on an anode side) which is connected to the p-channel TFT 201, a first electrode (electrode on a cathode side) may be formed; accordingly, the photoelectric conversion layer 208 is formed.

In addition, a photoelectric conversion layer in which the stacking order is reversed may also be employed. After the p-type semiconductor layer, the i-type semiconductor layer, and the n-type semiconductor layer are sequentially stacked over the first electrode (electrode on the cathode side), the second electrode (electrode on the anode side) which is connected to the p-channel TFT 201 may be formed and the terminal electrode on the cathode side which is connected to the first electrode may also be formed.

As shown in FIG. 26 a p-type impurity, for example, boron (B) is introduced to island-shaped semiconductor regions of the p-channel TFTs 201 and 202. Source or drain regions 271 are formed in the p-channel TFT 201, and source or drain regions 272 are formed in the p-channel TFT 202.

A wiring 284, a connection electrode 285, a terminal electrode 281, source or drain electrodes 283 of the TFT 201, and source or drain electrodes 282 of the TFT 202 are formed using a single-layer conductive film in accordance with the description in Embodiment 1.

Figure 16:
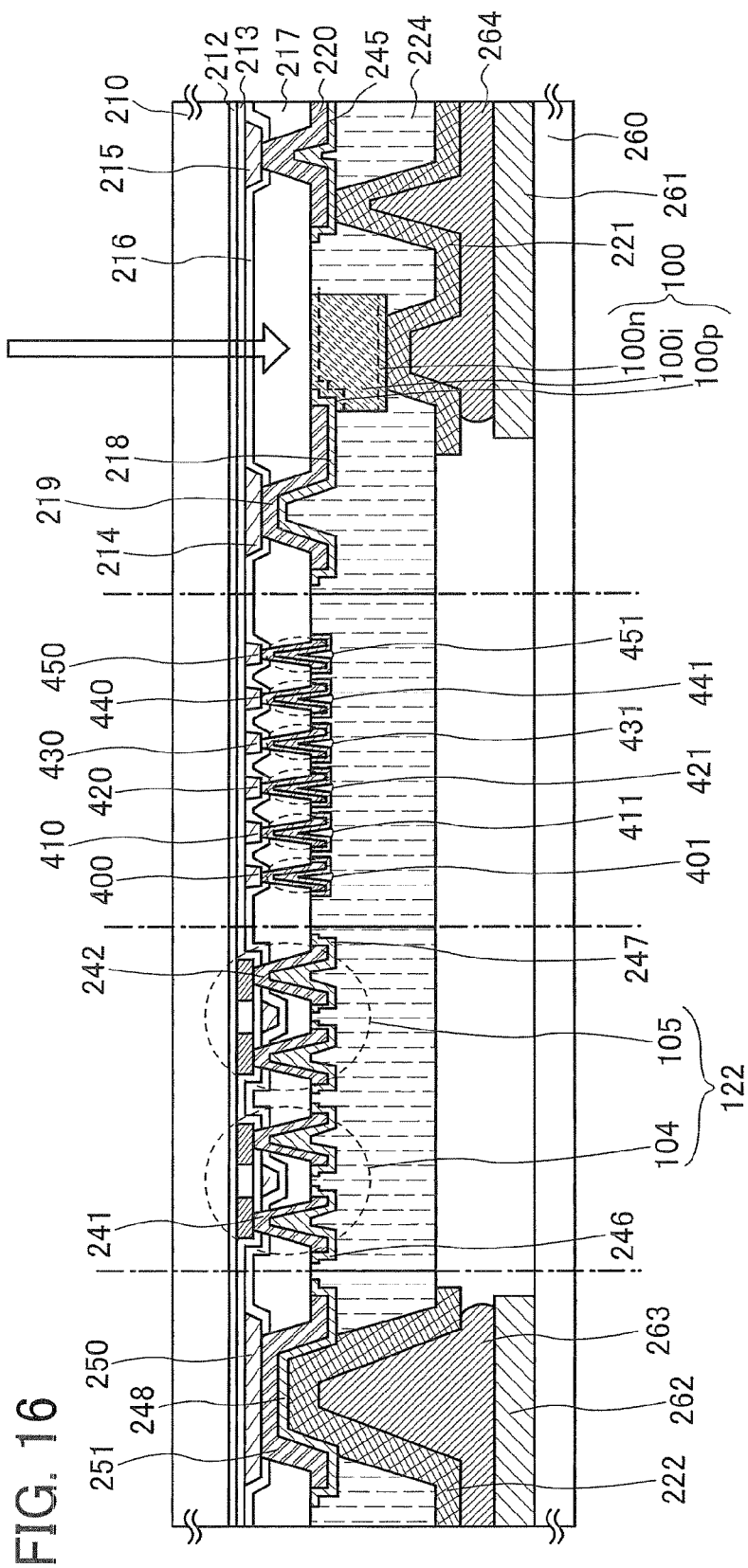
FIG. 16 is a cross-sectional view of a semiconductor device of the present invention.

Similarly to FIG. 16, instead of the wiring 284, the connection electrode 285, the terminal electrode 281, the source or drain electrodes 283 of the TFT 201, and the source or drain electrodes 282 of the TFT 202, the wiring 284 and a protective electrode 218 thereof, the connection electrode 285 and a protective electrode 245 thereof, the terminal electrode 281 and a protective electrode 248 thereof, the source or drain electrodes 283 of the TFT 201 and a protective electrode 247 thereof, and the source or drain electrodes 282 of the TFT 202 and a protective electrode 246 thereof may also be formed. Each manufacturing method is based on that in Embodiment Mode or Embodiment 1.

In this embodiment, wirings 407, 417, 427, 437, 447, and 457 are each formed of a material and in a process similar to the source or drain electrodes 282 and the like.

Note that this embodiment can also be combined with any description in Embodiment Mode and other embodiments.

Embodiment 3

This embodiment will explain an example of a light sensor in which an amplifier circuit is formed using a bottom gate TFT and a manufacturing method thereof with reference to FIGS. 27A to 27D, FIGS. 28A to 28C, FIGS. 29A and 29B, FIG. 30, FIG. 31, FIG. 38, FIG. 39, FIG. 40, FIG. 41, and FIG. 42. Note that the same portions as in Embodiment Mode and Embodiments 1 and 2 are denoted by the same reference numerals.

Figure 27A:
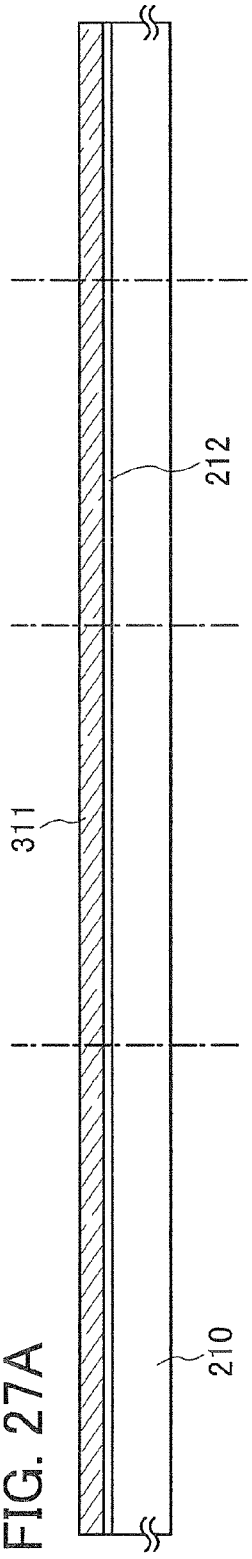
FIGS. 27A to 27D are views each showing a manufacturing process of a semiconductor device of the present invention.

First, a base insulating film 212 and a metal film 311 are formed over a substrate 210 (see FIG. 27A). As the metal film 311, in this embodiment, a film in which tantalum nitride (TaN) of 30 nm thick and tungsten (W) of 370 nm thick are stacked is used, for example.

In addition, as the metal film 311, as well as the above film, a single-layer film formed of an element of tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ti), platinum (Pt), aluminum (Al), gold (Au), silver (Ag), and copper (Cu) or an alloy material or a compound material containing the element as its main component; or a single-layer film formed of a nitride thereof, for example, titanium nitride, tungsten nitride, tantalum nitride, or molybdenum nitride can be used.

Note that the metal film 311 may also be formed directly on the substrate 210 without the base insulating film 212 formed over the substrate 210.

Next, the metal film 311 is used to form gate electrodes 312 and 313, wirings 214 and 215, and a terminal electrode 250.

Figure 27B:
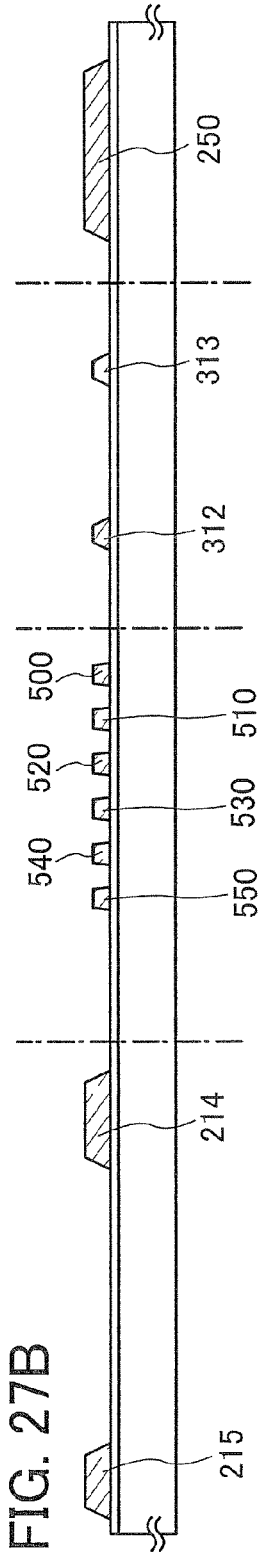
Figure 27C:
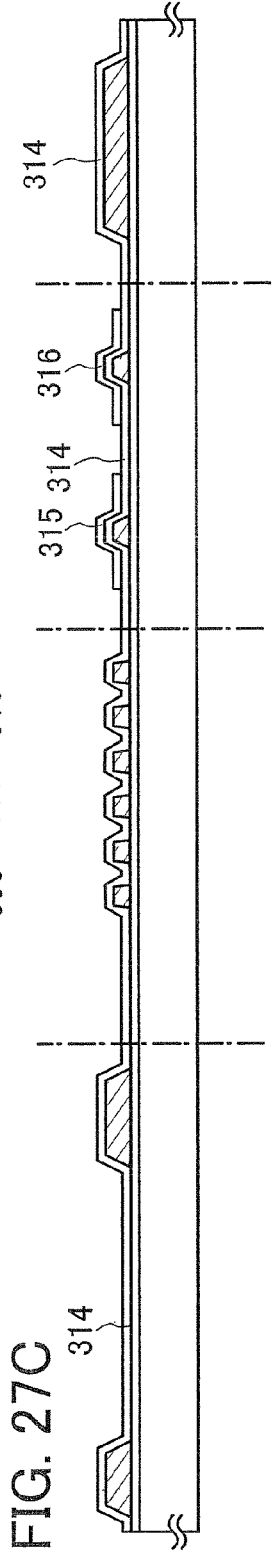

In addition, in the same process as the gate electrode 312 and the like, the metal film 311 is used to form wirings 500, 510, 520, 530, 540, and 550 (see FIG. 27B).

Then, a gate insulating film 314, which covers the gate electrodes 312 and 313, the wirings 214 and 215, the terminal electrode 250, and the wirings 500, 510, 520, 530, 540, and 550, is formed. In this embodiment, the gate insulating film 314 is formed using an insulating film containing silicon as its main component, for example, a silicon oxide film containing nitrogen (composition ratio: Si=32%, O=59%, N=7%, and H=2%) of 115 nm thick by a plasma CVD method.

Subsequently, island-shaped semiconductor regions 315 and 316 are formed over the gate insulating film 314. The island-shaped semiconductor regions 315 and 316 may be each formed of a material and in a process similar to the island-shaped semiconductor regions 231 and 232 which are described in Embodiment 1 (see FIG. 27C).

Figure 27D:
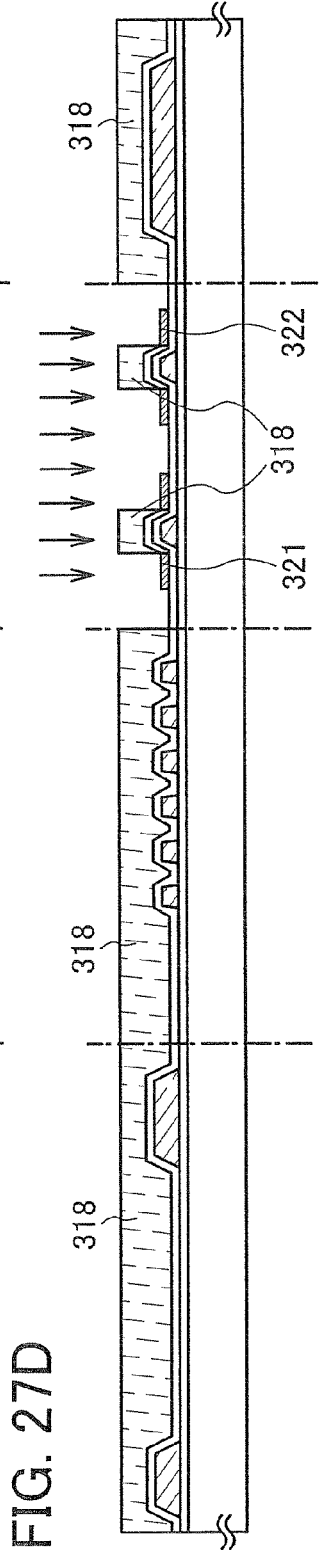
Figure 30:
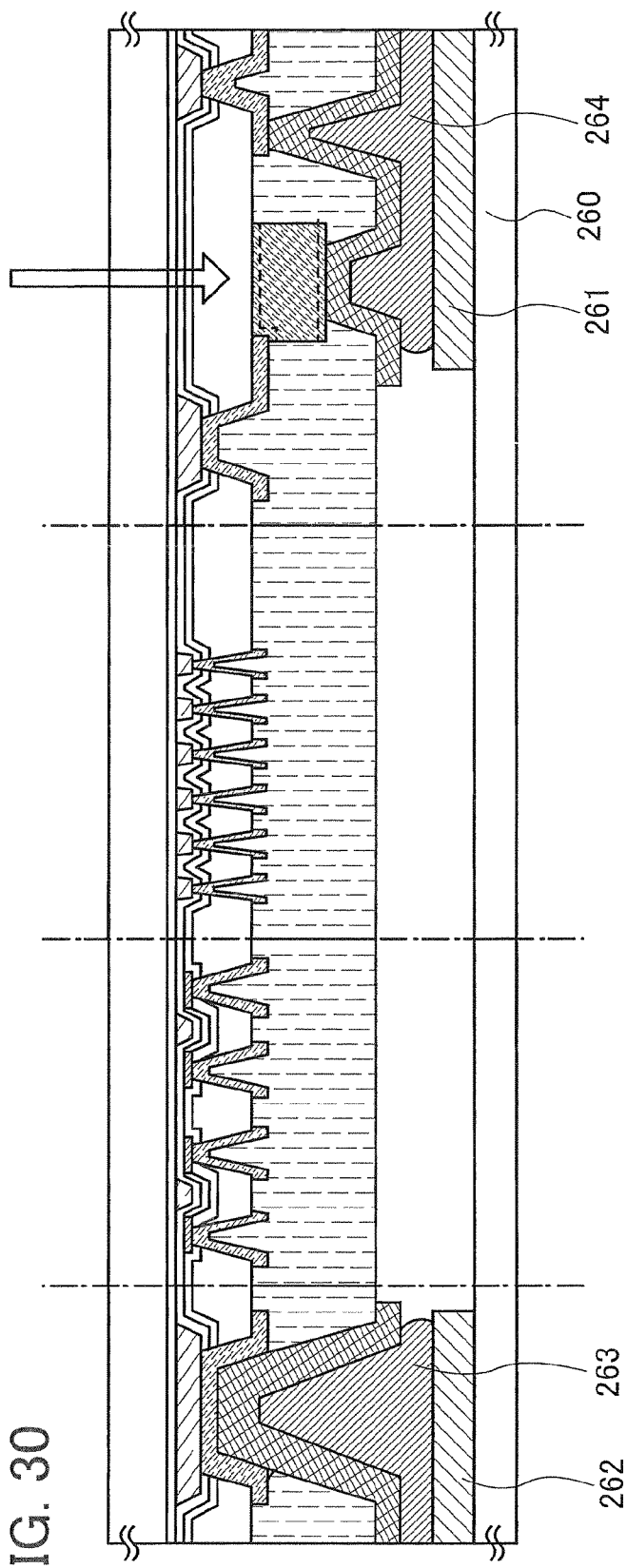
FIG. 30 is a cross-sectional view of a semiconductor device of the present invention.

After the island-shaped semiconductor regions 315 and 316 are formed, a mask 318 is formed covering portions except for regions which subsequently become source or drain regions 321 of a TFT 301 and source or drain regions 322 of a TFT 302 to introduce an impurity imparting one conductivity type (see FIG. 27D). As the one conductivity type impurity, in a case of forming an n-channel TFT, phosphorus (P) or arsenic (As) may be used as an n-type impurity, whereas in a case of forming a p-channel TFT, boron (B) may be used as a p-type impurity. In this embodiment, phosphorus (P) which is an n-type impurity is introduced to the island-shaped semiconductor regions 315 and 316 to form the source or drain regions 321 of the TFT 301 and a channel formation region between the source region and the drain region, and the source or drain regions 322 of the TFT 302 and a channel formation region between the source region and the drain region.

Next, the mask 318 is removed, and a first interlayer insulating film which is not shown, a second interlayer insulating film 216, and a third interlayer insulating film 217 are formed (see FIG. 28A). A material and a manufacturing process of the first interlayer insulating film, the second interlayer insulating film 216, and the third interlayer insulating film 217 may be based on the description in Embodiment 1.

Then, contact holes are formed in the first interlayer insulating film, the second interlayer insulating film 216, and the third interlayer insulating film 217, and a single-layer metal film is formed, and further, the metal film is selectively etched to form a wiring 284, a connection electrode 285, a terminal electrode 281, source or drain electrodes 341 of the TFT 301, source or drain electrodes 342 of the TFT 302, and wirings 501, 511, 521, 531, 541, and 551.

The wiring 284, the connection electrode 285, the terminal electrode 281, the source or drain electrodes 341 of the TFT 301, the source or drain electrodes 342 of the TFT 302, and the wirings 501, 511, 521, 531, 541, and 551 may also be each formed of a stacked-layer film instead of the single-layer conductive film FIG. 28C shows an example where they are each formed of a stacked-layer film.

In FIG. 28C, instead of the wiring 284, the connection electrode 285, the terminal electrode 281, the source or drain electrodes 341 of the TFT 301, and the source or drain electrodes 342 of the TFT 302, a wiring 219 and a protective electrode 218 thereof, a connection electrode 220 and a protective electrode 245 thereof, a terminal electrode 251 and a protective electrode 248 thereof, source or drain electrodes 331 of the TFT 301 and a protective electrode 336 thereof, and source or drain electrodes 332 of the TFT 302 and a protective electrode 337 thereof are formed.

In FIG. 28C, wirings 501, 511, 521, 531, 541, and 551 are each formed by a stack of different conductive films.

In the above steps, bottom-gate TFTs 301 and 302 can be manufactured. A current mirror circuit 303 can be formed using the bottom-gate TFTs 301 and 302.

Resistors for compensating parasitic resistors of the current mirror circuit are formed of the pairs of the wirings 500 and 501, the wirings 510 and 511, the wirings 520 and 521, the wirings 530 and 531, the wirings 540 and 541, and the wirings 550 and 551. The resistors shown in FIGS. 27C and 27D have a structure where the wirings formed in the same process as the gate electrodes are combined with the wirings formed in the same process as the source or drain electrodes. However, the resistors for compensating parasitic resistors of the current mirror circuit are not limited to the structures shown in FIGS. 27C and 27D and the following structures may also be employed: a structure formed only of the wirings formed in the same process as the gate electrodes; a structure where the wirings formed in the same process as the source or drain regions of the TFTs are combined with the wirings formed in the same process as the source or drain electrodes; a structure formed only of the wirings formed though the source or drain regions of the TFTs; a structure where the wirings formed in the same process as the gate electrodes are combined with the wirings formed in the same process as the source or drain regions of the TFTs; or a structure formed only of the wirings formed in the same process as the source or drain electrodes.

Next, a photoelectric conversion layer 100 including a p-type semiconductor layer 100p, an i-type semiconductor layer 100i, and an n-type semiconductor layer 100n is formed over the third interlayer insulating film 217 (see FIG. 29A). Embodiment Mode and other embodiments may be referred for a material, a manufacturing process, or the like of the photoelectric conversion layer 100.

Then, a sealing layer 224 and terminal electrodes 221 and 222 are formed (see FIG. 29B). The terminal electrode 221 is connected to the n-type semiconductor layer 100n, and the terminal electrode 222 is formed in the same process as the terminal electrode 221.

Further, a substrate 260 having electrodes 261 and 262 is mounted by solders 263 and 264. Note that the electrode 261 over the substrate 260 is mounted on the terminal electrode 221 by the solder 264. In addition, the electrode 262 over the substrate 260 is mounted on the terminal electrode 222 by the solder 263 (see FIG. 30).

Figure 31:
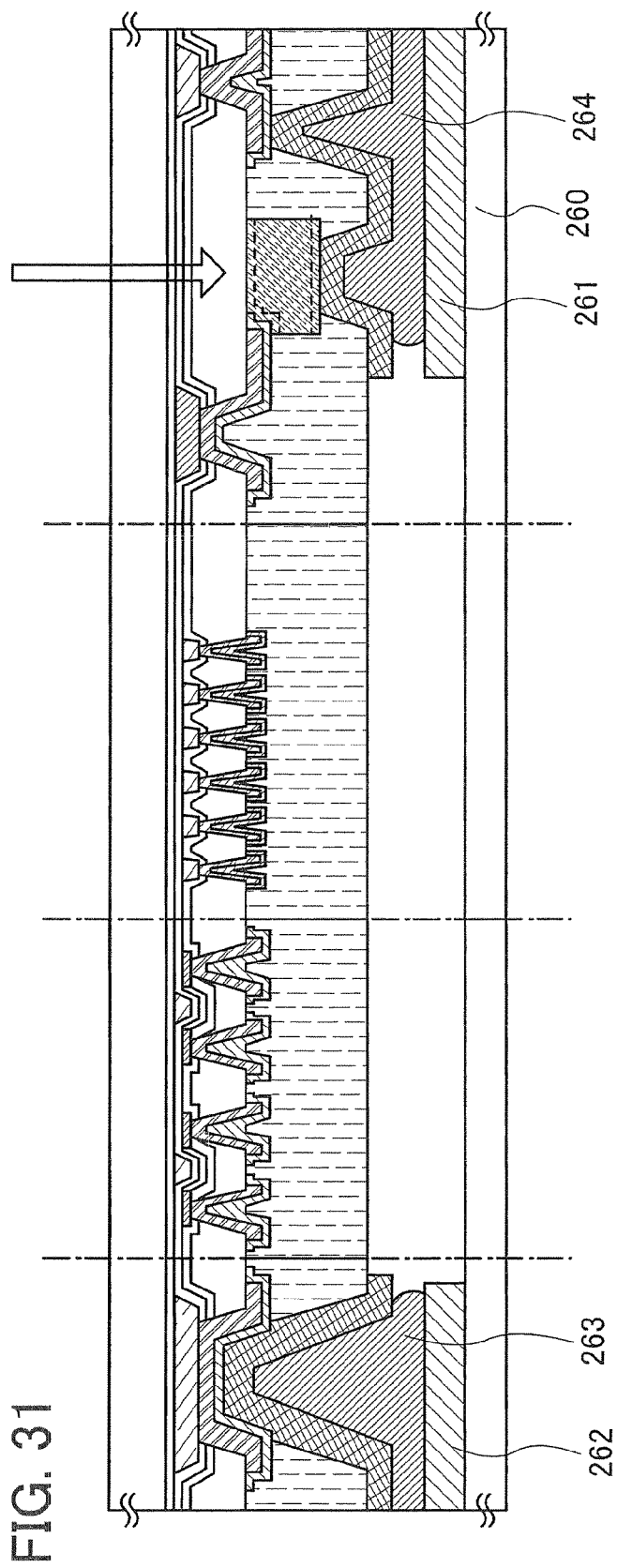
FIG. 31 is a cross-sectional view of a semiconductor device of the present invention.

Note that FIG. 31 shows an example in which the substrate 260 having the electrodes 261 and 262 is mounted on the structure shown in FIG. 28C.

Figure 38:
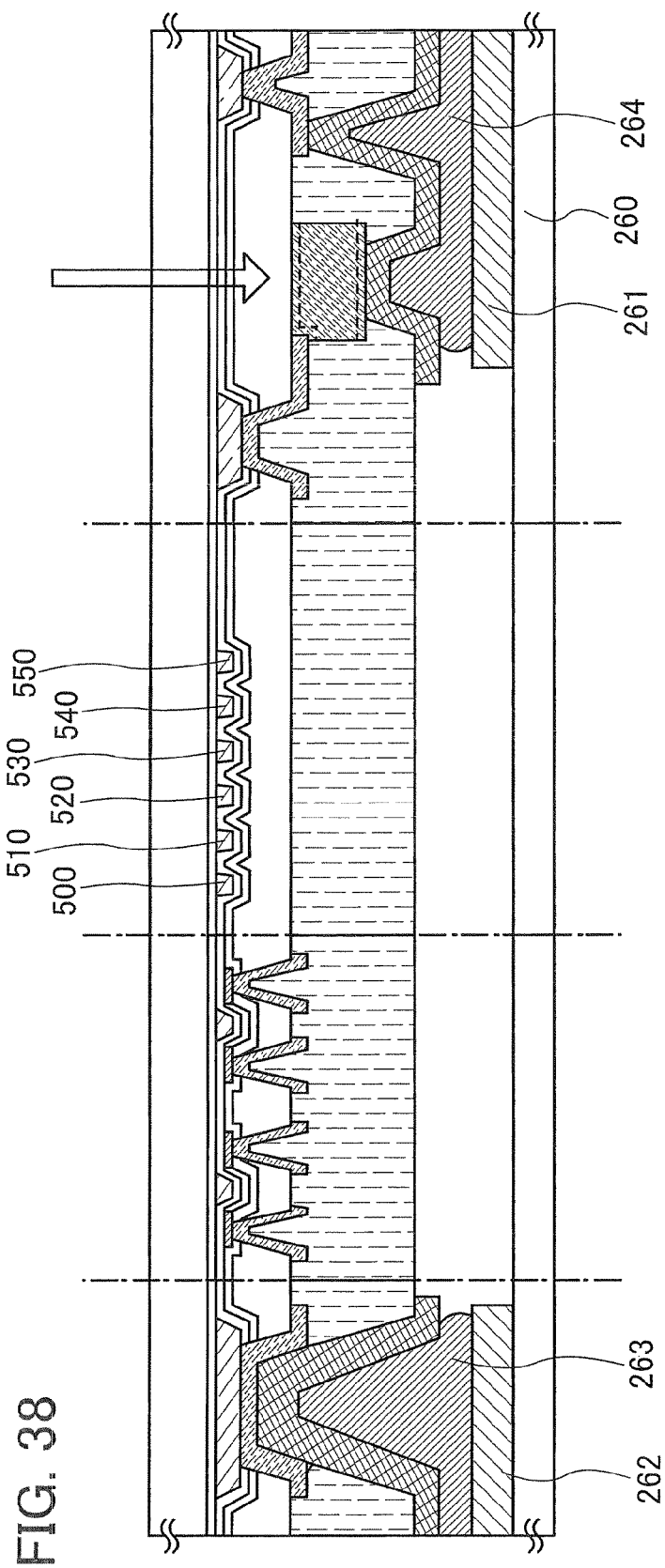
FIG. 38 is a cross-sectional view of a semiconductor device of the present invention.

FIG. 38 shows the case employing the structure where the resistors for compensating parasitic resistors of the current mirror circuit are formed only of the wirings formed in the same process as the gate electrode 312 and the like. Wirings 500, 510, 520, 530, 540, and 550 each serve as one resistor.

Figure 39:
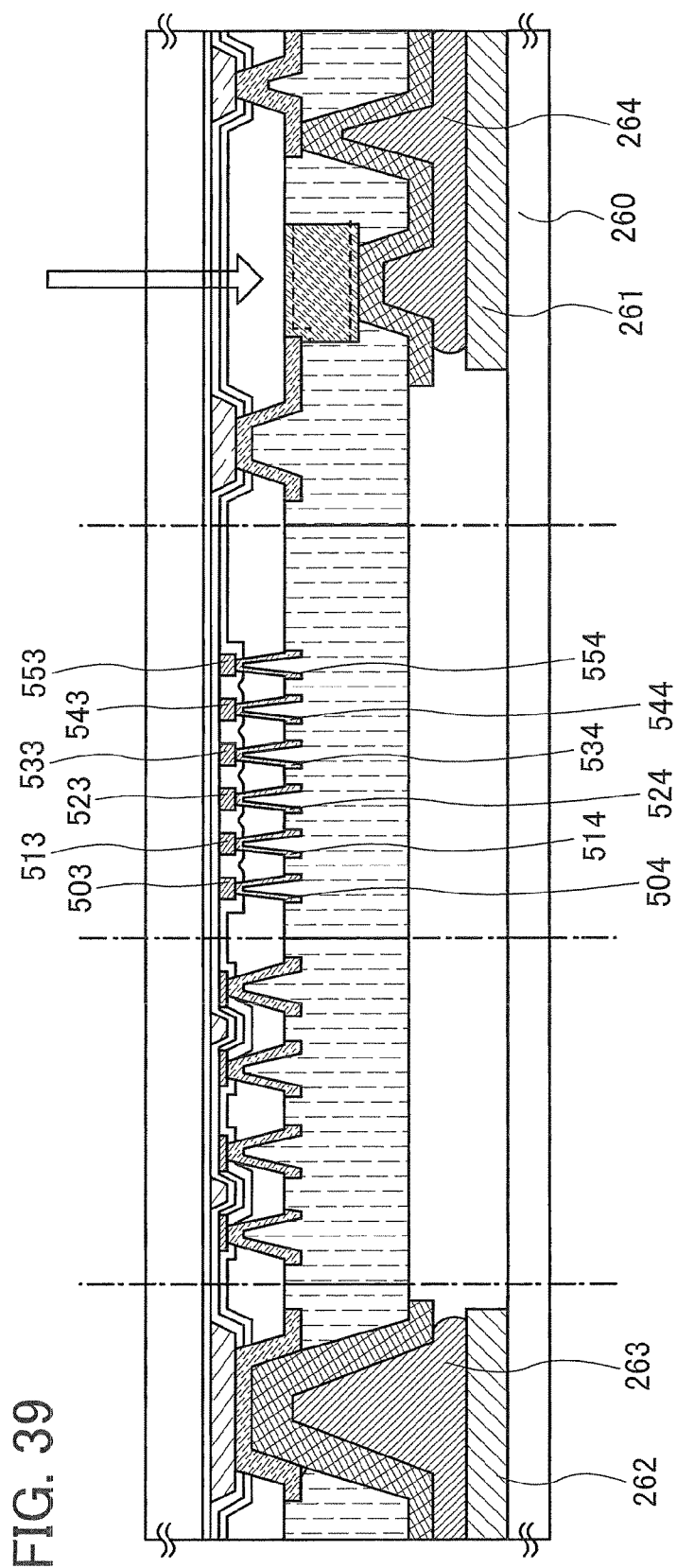
FIG. 39 is a cross-sectional view of a semiconductor device of the present invention.

FIG. 39 shows the structure where the wirings formed in the same process as the source or drain regions 321 and the like are combined with the wirings formed through the source or drain electrodes 341 and the like as the resistors for compensating parasitic resistors of the current mirror circuit. Wirings 503, 513, 523, 533, 543, and 553 are formed in the same process as the source or drain regions 321 and the like. Moreover, wirings 504, 514, 524, 534, 544, and 554 are formed in the same process as the source or drain electrodes 341 and the like. The combinations of the pairs of the wirings 503 and 504, the wirings 513 and 514, the wirings 523 and 524, the wirings 533 and 534, the wirings 543 and 544, and the wirings 553 and 554 each serve as one resistor.

Figure 40:
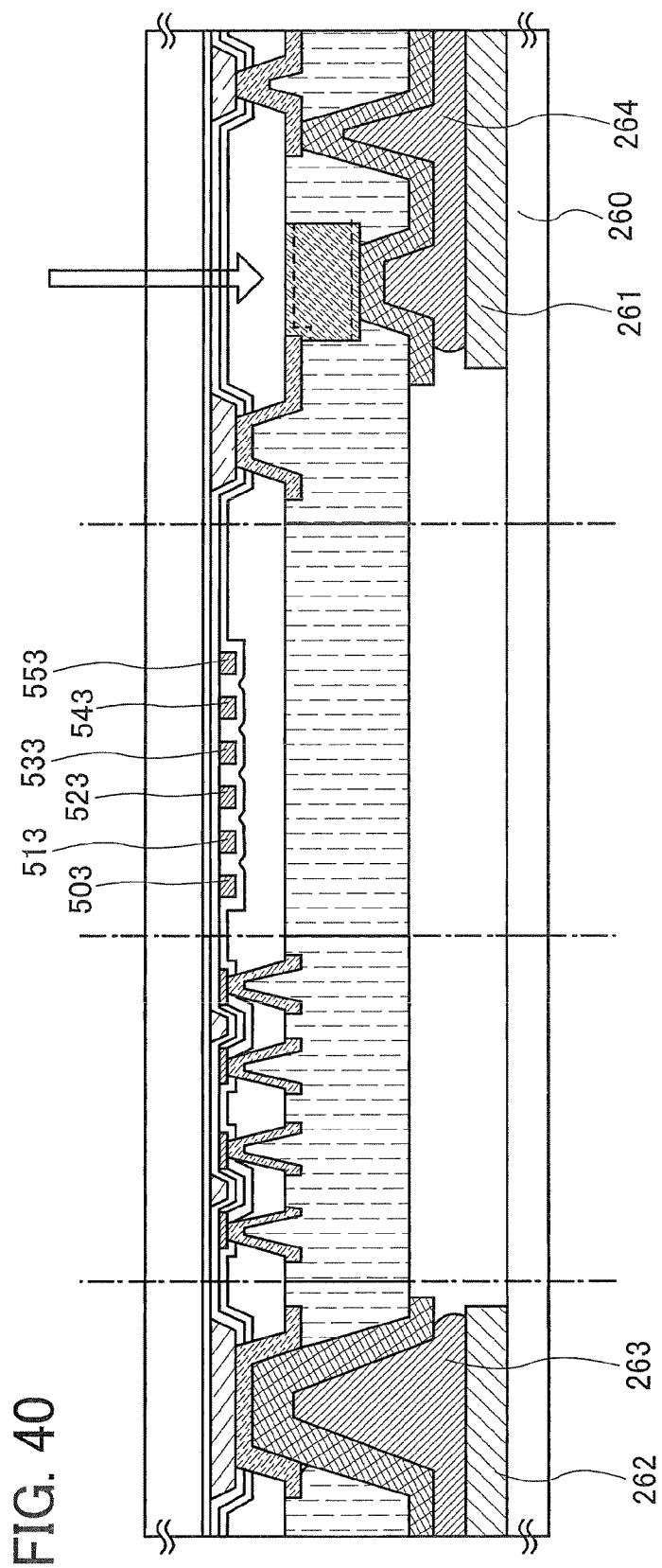
FIG. 40 is a cross-sectional view of a semiconductor device of the present invention.

FIG. 40 shows the structure where the resistors for compensating parasitic resistors of the current mirror circuit are formed only of the wirings formed in the same process as the source or drain regions 321 and the like. Wirings 503, 513, 523, 533, 543, and 553 are formed in the same process as the source or drain regions 321 and the like, and each serve as one resistor.

Figure 41:
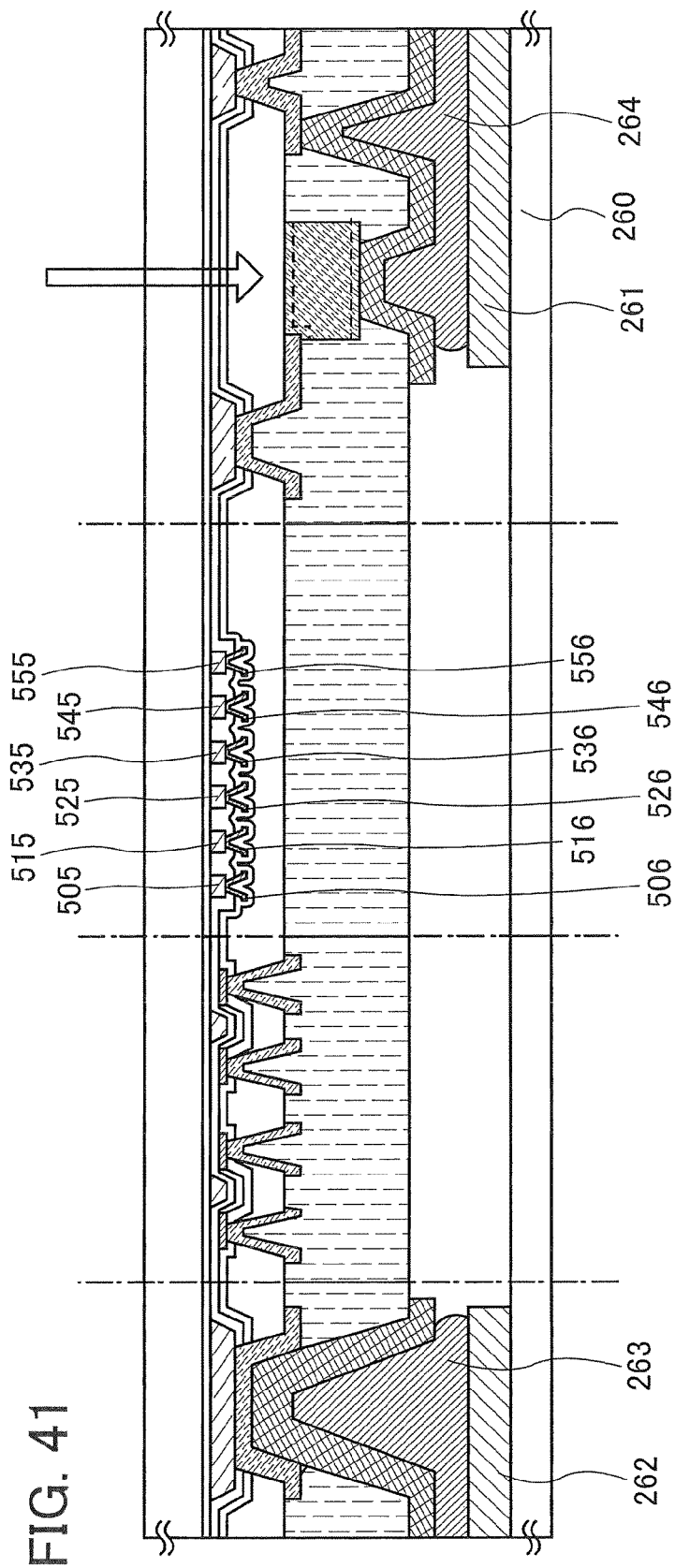
FIG. 41 is a cross-sectional view of a semiconductor device of the present invention.

FIG. 41 shows the structure where the resistors for compensating parasitic resistors of the current mirror circuit are formed of the wirings formed in the same process as the gate electrode 312 and the like to be combined with the wirings formed in the source or drain regions 321 and the like. Wirings 505, 515, 525, 535, 545, and 555 are formed in the same process as the gate electrode 312 and the like. Moreover, wirings 506, 516, 526, 536, 546, and 556 are formed in the same process as the source or drain regions 321 and the like.

The combinations of the pairs of the wirings 505 and 506, the wirings 515 and 516, the wirings 525 and 526, the wirings 535 and 536, the wirings 545 and 546, and the wirings 555 and 556 each serve as one resistor.

Figure 42:
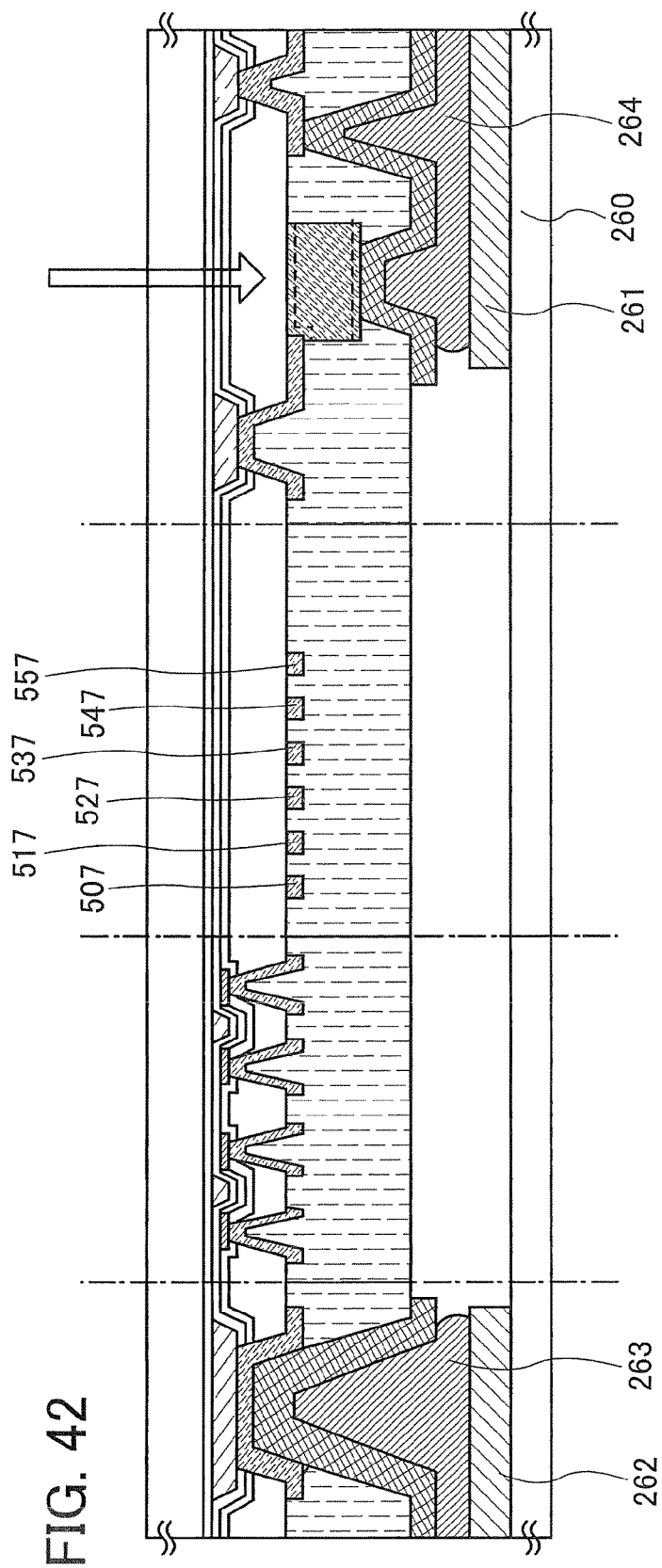
FIG. 42 is a cross-sectional view of a semiconductor device of the present invention.

FIG. 42 shows the structure where the resistors for compensating parasitic resistors of the current mirror circuit are formed only of the wirings formed in the same process as the source or drain electrodes 341 and the like. Wirings 507, 517, 527, 537, 547, and 557 are formed in the same process as the source or drain electrodes 341 and the like, and each serve as one resistor.

Note that this embodiment can also be combined with any description in Embodiment Mode and other embodiments.

Embodiment 4

This embodiment will explain examples of various electronic devices in which a photoelectric conversion device obtained by the present invention is incorporated. As electronic devices to which the present invention is applied, computers, displays, cellular phones, televisions, and the like are given. Specific examples of such electronic devices are shown in FIG. 33, FIGS. 34A and 34B, FIGS. 35A and 35B, FIG. 36, and FIGS. 37A and 37B.

Figure 33:
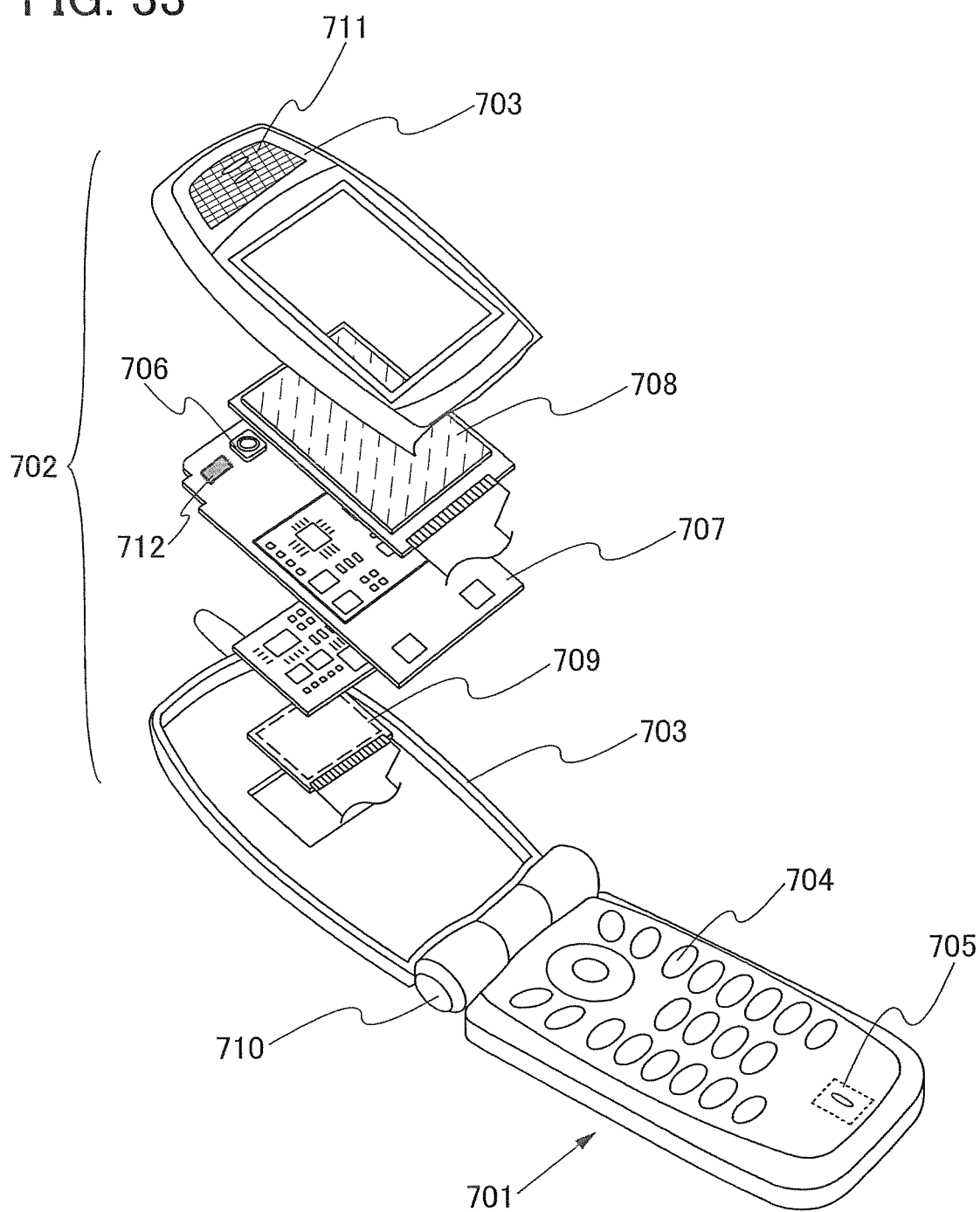
FIG. 33 is a view showing a device on which a semiconductor device of the present invention is mounted.

FIG. 33 shows a cellular phone, which includes a main body (A) 701, a main body (B) 702, a chassis 703, operation keys 704, an audio input portion 705, an audio output portion 706, a circuit board 707, a display panel (A) 708, a display panel (B) 709, a hinge 710, a light-transmitting material portion 711, and a photoelectric conversion element 712. The present invention can be applied to the photoelectric conversion element 712.

The photoelectric conversion element 712 detects light which have passed through the light-transmitting material portion 711 and controls luminance of the display panel (A) 708 and the display panel (B) 709 depending on the illuminance of the detected extraneous light, or controls illumination of the operation keys 704 based on the illuminance obtained by the photoelectric conversion element 712. In such a manner, current consumption of the cellular phone can be suppressed.

Figure 34A:
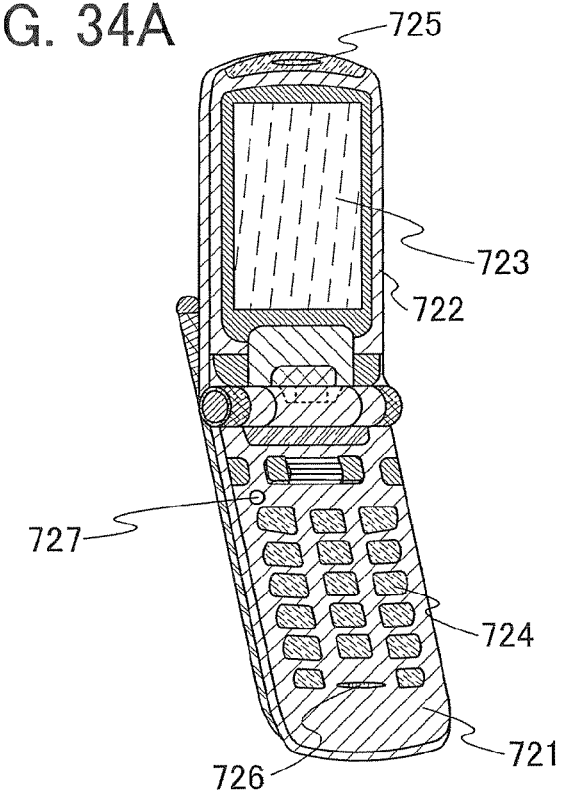
FIGS. 34A and 34B are views each showing a device on which a semiconductor device of the present invention is mounted.
Figure 34B:
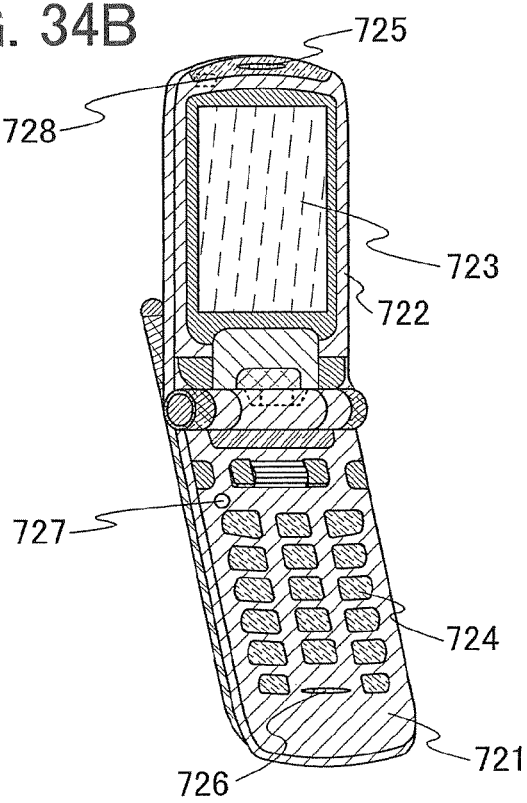

FIGS. 34A and 34B show other examples of a cellular phone. In FIGS. 34A and 34B, reference numeral 721 denotes a main body; 722, a chassis; 723, a display panel; 724, operation keys; 725, an audio output portion; 726, an audio input portion; and 727 and 728, photoelectric conversion elements.

In the cellular phone shown in FIG. 34A, luminance of the display panel 723 and the operation keys 724 can be controlled by detection of extraneous light by the photoelectric conversion element 727 provided in the main body 721.

Moreover, in the cellular phone shown in FIG. 34B, the photoelectric conversion element 728 is provided inside the main body 721 in addition to the structure of FIG. 34A. By the photoelectric conversion element 728, luminance of a backlight provided in the display panel 723 can also be detected.

Figure 35A:
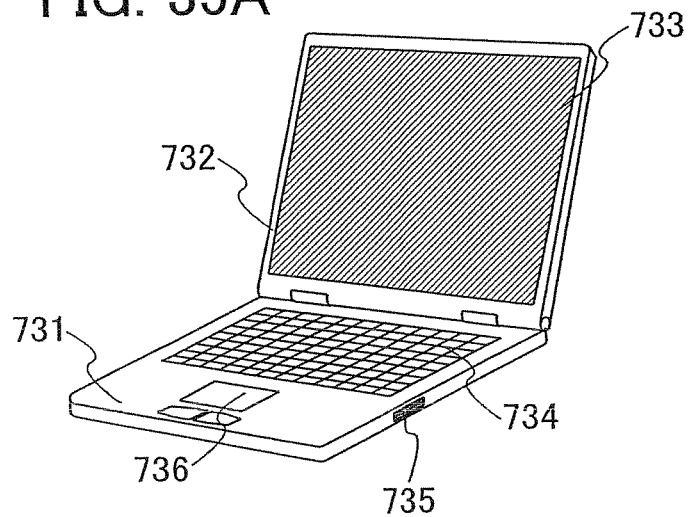
FIGS. 35A and 35B are views each showing a device on which a semiconductor device of the present invention is mounted.

FIG. 35A shows a computer, which includes a main body 731, a chassis 732, a display portion 733, a keyboard 734, an external connection port 735, a pointing mouse 736, and the like.

Figure 35B:
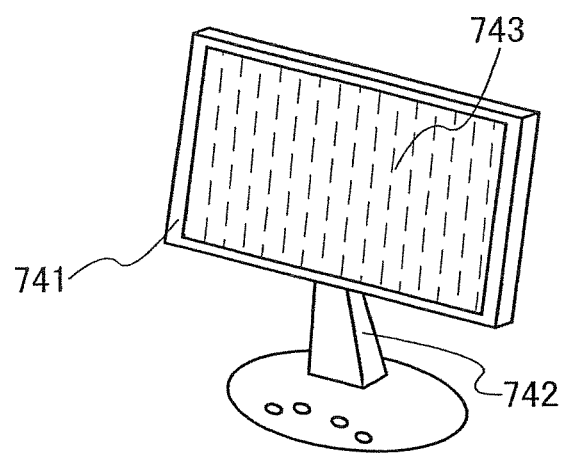

In addition, FIG. 35B shows a display device such as a television receiver. The display device includes a chassis 741, a supporting base 742, a display portion 743, and the like.

FIG. 36 shows a detailed structure of a case where a liquid crystal panel is used for the display portion 733 of the computer shown in FIG. 35A and the display portion 743 of the display device shown in FIG. 35B.

A liquid crystal panel 762 shown in FIG. 36 is incorporated in a chassis 761 and includes substrates 751a and 751b, a liquid crystal layer 752 interposed between the substrates 751a and 751b, polarizing filters 755a and 755b, a backlight 753, and the like. In addition, a photoelectric conversion element formation region 754 having a photoelectric conversion element is formed in the chassis 761.

The photoelectric conversion element formation region 754 manufactured using the present invention detects the amount of light from the backlight 753, and the information is fed back to adjust luminance of the liquid crystal panel 762.

Figure 37A:
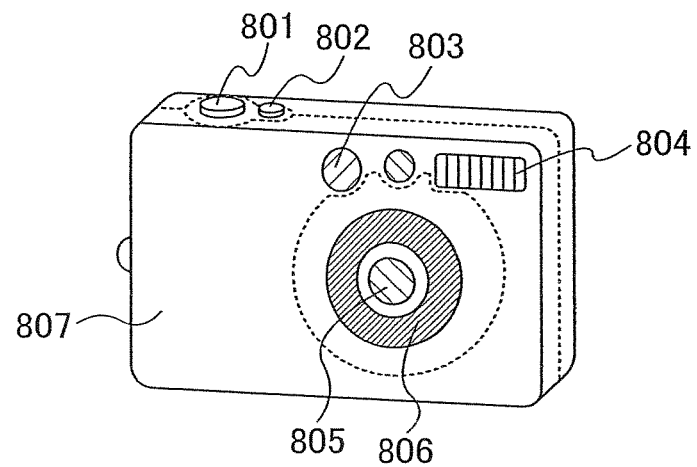
FIGS. 37A and 37B are views each showing a device on which a semiconductor device of the present invention is mounted.
Figure 37B:
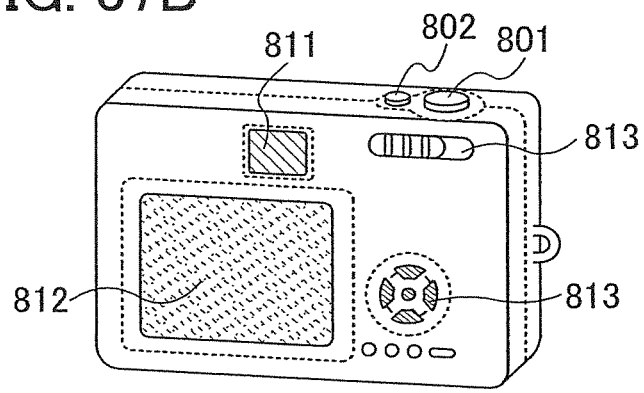

FIGS. 37A and 37B are views showing an example in which a light sensor of the present invention is incorporated in a camera, for example, a digital camera. FIG. 37A is a perspective view seen from the front side of the digital camera, and FIG. 37B is a perspective view seen from the backside thereof. In FIG. 37A, the digital camera is provided with a release button 801, a main switch 802, a viewfinder 803, a flash portion 804, a lens 805, a barrel 806, and a chassis 807.

In addition, in FIG. 37B, the digital camera is provided with an eyepiece finder 811, a monitor 812, and an operation button 813.

When the release button 801 is pushed down to the half point, a focus adjustment mechanism and an exposure adjustment mechanism are operated, and when the release button is pushed down to the lowest point, a shutter is opened.

By pushing down or rotating of the main switch 802, a power supply of the digital camera is switched on or off.

The viewfinder 803 is located above the lens 805, which is on the front side of the digital camera, for checking a shooting range and the focus point from the eyepiece finder 811 shown in FIG. 37B.

The flash portion 804 is located in the upper position on the front side of the digital camera. When the subject brightness is not enough, auxiliary light is emitted from the flash portion 804, at the same time as the release button is pushed down and a shutter is opened.

The lens 805 is located at the front side of the digital camera and includes a focusing lens, a zoom lens, and the like. The lens forms a photographic optical system with a shutter and a diaphragm which are not shown. In addition, behind the lens, an imaging device such as a CCD (Charge Coupled Device) is provided.

The barrel 806 moves a lens position to adjust the focus of the focusing lens, the zoom lens, and the like. In shooting, the barrel is slid out to move the lens 805 forward. In addition, when carrying the digital camera, the lens 805 is moved backward to be compact. Note that a structure is employed in this embodiment, in which the subject can be photographed by zoom by sliding out of the barrel; however, the present invention is not limited to this structure, and a structure may also be employed for the digital camera, in which shooting can be performed by zoom without sliding out the barrel with the use of a structure of a photographic optical system inside the chassis 807.

The eyepiece finder 811 is located in the upper position on the backside of the digital camera for looking therethrough in checking a shooting range and the focus point.

The operation button 813 is a button for various functions provided on the back side of the digital camera, which includes a set up button, a menu button, a display button, a functional button, a selecting button, and the like.

When a light sensor of the present invention is incorporated in the camera shown in FIGS. 37A and 37B, the light sensor can detect whether light exists or not, and light intensity; thus, exposure adjustment of a camera or the like can be performed.

In addition, a light sensor of the present invention can also be applied to other electronic devices such as a projection TV and a navigation system. In other words, the light sensor of the present invention can be applied to any object as long as it needs to detect light.

Note that this embodiment can also be combined with any description in Embodiment Mode and other embodiments.

According to the present invention, it is possible to manufacture a semiconductor device and photoelectric conversion device capable of suppressing variations in product as well as increasing the stability of the circuit operation. In addition, the semiconductor device and photoelectric conversion device of the present invention are incorporated in an electronic device so that an electronic device having high stability and reliability in circuit operation can be obtained.

The present application is based on Japanese Patent Application serial No. 2006-126017 filed on Apr. 28, 2006 in Japan Patent Office, the entire contents of which are hereby incorporated by reference.

What is claimed is:

1. A semiconductor device comprising:
   a current mirror circuit comprising a first transistor and a second transistor; and
   a photoelectric conversion device electrically connected to the current mirror circuit,
   wherein the first transistor comprises a semiconductor film comprising a channel formation region,
   wherein a gate electrode of the first transistor is electrically connected to a gate electrode of the second transistor via a first resistor comprising a first wiring, a second resistor comprising a second wiring, and a third wiring,
   wherein the first resistor further comprises a fourth wiring and has higher resistance than the second resistor,
   wherein a source electrode of the first transistor is electrically connected to a source electrode of the second transistor,
   wherein the gate electrode of the first transistor is electrically connected to a drain electrode of the first transistor not via the third wiring,
   wherein the gate electrode of the second transistor is electrically connected to the drain electrode of the first transistor via the third wiring,
   wherein each of the first wiring and the second wiring is formed using a same material as the source electrode of the first transistor, and
   wherein the fourth wiring is formed using a same material as the semiconductor film of the first transistor.

2. A semiconductor device according to claim 1, wherein the semiconductor film comprises silicon.

3. A semiconductor device according to claim 1, wherein the first transistor is a top-gate thin film transistor.

4. A semiconductor device comprising:
   a current mirror circuit comprising a first transistor and a second transistor; and
   a photoelectric conversion device electrically connected to the current mirror circuit,
   wherein the first transistor comprises a semiconductor film comprising a channel formation region,
   wherein a gate electrode of the first transistor is electrically connected to a gate electrode of the second transistor via a first resistor comprising a first wiring, a second resistor comprising a second wiring, and a third wiring,
   wherein the first resistor further comprises a fourth wiring and has higher resistance than the second resistor,
   wherein a source electrode of the first transistor is electrically connected to a source electrode of the second transistor via a third resistor comprising a fifth wiring,
   wherein the gate electrode of the first transistor is electrically connected to a drain electrode of the first transistor not via the third wiring,
   wherein the gate electrode of the second transistor is electrically connected to the drain electrode of the first transistor via the third wiring,
   wherein each of the first wiring and the second wiring is formed using a same material as the source electrode of the first transistor, and
   wherein each of the fourth wiring and the fifth wiring is formed using a same material as the semiconductor film of the first transistor.

5. A semiconductor device according to claim 4, wherein the semiconductor film comprises silicon.

6. A semiconductor device according to claim 4, wherein the first transistor is a top-gate thin film transistor.

7. A semiconductor device comprising:
   a current mirror circuit comprising a first transistor and a second transistor; and
   a photoelectric conversion device comprising a photoelectric conversion layer,
   wherein the first transistor comprises a semiconductor film comprising a channel formation region,
   wherein a gate electrode of the first transistor is electrically connected to a gate electrode of the second transistor via a first resistor comprising a first wiring, a second resistor comprising a second wiring, and a third wiring,
   wherein the first resistor further comprises a fourth wiring and has higher resistance than the second resistor,
   wherein a source electrode of the first transistor is electrically connected to a source electrode of the second transistor,
   wherein the gate electrode of the first transistor is electrically connected to a drain electrode of the first transistor not via the third wiring,
   wherein the gate electrode of the second transistor is electrically connected to the drain electrode of the first transistor via the third wiring,
   wherein each of the first wiring and the second wiring is formed using a same material as the source electrode of the first transistor,
   wherein the fourth wiring is formed using a same material as the semiconductor film of the first transistor, and
   wherein the first transistor, the second transistor and the photoelectric conversion layer are formed over a same substrate.

8. A semiconductor device according to claim 7, wherein the semiconductor film comprises silicon.

9. A semiconductor device according to claim 7, wherein the first transistor is a top-gate thin film transistor.

10. A semiconductor device comprising:
    a current mirror circuit comprising a first transistor and a second transistor; and
    a photoelectric conversion device comprising a photoelectric conversion layer,
    wherein the first transistor comprises a semiconductor film comprising a channel formation region,
    wherein a gate electrode of the first transistor is electrically connected to a gate electrode of the second transistor via a first resistor comprising a first wiring, a second resistor comprising a second wiring, and a third wiring,
    wherein the first resistor further comprises a fourth wiring and has higher resistance than the second resistor,
    wherein a source electrode of the first transistor is electrically connected to a source electrode of the second transistor via a third resistor comprising a fifth wiring, wherein the gate electrode of the first transistor is electrically connected to a drain electrode of the first transistor not via the third wiring, wherein the gate electrode of the second transistor is electrically connected to the drain electrode of the first transistor via the third wiring, wherein each of the first wiring and the second wiring is formed using a same material as the source electrode of the first transistor, wherein each of the fourth wiring and the fifth wiring is formed using a same material as the semiconductor film of the first transistor, and wherein the first transistor, the second transistor and the photoelectric conversion layer are formed over a same substrate.

11. A semiconductor device according to claim 10, wherein the semiconductor film comprises silicon.

12. A semiconductor device according to claim 10, wherein the first transistor is a top-gate thin film transistor.

\* \* \* \* \*